(12) United States Patent
Liu et al.

(10) Patent No.: US 10,364,316 B2
(45) Date of Patent: Jul. 30, 2019

(54) CONJUGATED POLYMER CONTAINING ETHYNYL CROSSLINKING GROUP, MIXTURE, FORMULATION, ORGANIC ELECTRONIC DEVICE CONTAINING THE SAME AND APPLICATION THEROF

(71) Applicant: GUANGZHOU CHINARAY OPTOELECTRONIC MATERIALS LTD., Guangdong (CN)

(72) Inventors: Shengjian Liu, Guangdong (CN); Junyou Pan, Guangdong (CN)

(73) Assignee: GUANGZHOU CHINARAY OPTOELECTRONICS MATERIALS LTD., Guangdong (CN)

(*) Notice: Subject to any disclaimer, the term of this patent is extended or adjusted under 35 U.S.C. 154(b) by 0 days.

(21) Appl. No.: 15/543,221

(22) PCT Filed: Dec. 11, 2015

(86) PCT No.: PCT/CN2015/097192
§ 371 (c)(1),
(2) Date: Jul. 12, 2017

(87) PCT Pub. No.: WO2016/112761
PCT Pub. Date: Jul. 21, 2016

(65) Prior Publication Data
US 2018/0022865 A1    Jan. 25, 2018

(30) Foreign Application Priority Data

Jan. 13, 2015    (CN) .......................... 2015 1 0015154

(51) Int. Cl.
C08G 61/12    (2006.01)
C08L 65/00    (2006.01)
(Continued)

(52) U.S. Cl.
CPC .......... *C08G 61/121* (2013.01); *C08G 61/12* (2013.01); *C08L 65/00* (2013.01);
(Continued)

(58) Field of Classification Search
CPC ..................................................... C08G 61/12
(Continued)

(56) References Cited

U.S. PATENT DOCUMENTS 3,567,450 A    3/1971    Brantly et al.
3,615,404 A    10/1971    Price et al.
(Continued)

FOREIGN PATENT DOCUMENTS

CN    1583691 A    2/2005
CN    10885834    11/2010
(Continued)

OTHER PUBLICATIONS

Extended European Search Report of Parallel European Patent Application No. 15877672.4 dated Jul. 24, 2018.
(Continued)

*Primary Examiner* — Khanh T Nguyen
(74) *Attorney, Agent, or Firm* — Dorsey & Whitney LLP

(57) ABSTRACT

Provided are a conjugated polymer containing ethynyl crosslinking group, mixture, formulation, organic electronic device containing the same and application thereof. The conjugated polymer material has a conjugated main chain structure and an ethynyl crosslinking group as a functional side chain. The conjugated polymer material produces an insoluble and unmeltable crosslinked interpenetrating network polymer film under heating, has excellent solvent-resistance, and is suitable for manufacturing a complex multi-layer organic electronic device. The conjugated polymer can be applied in optoelectronic devices such as an organic field effect transistor, an organic light emitting diode
(Continued)

Wavelength (nm)

(OLED), a polymer solar cell, a perovskite solar cell, etc, and improves device performance.

13 Claims, 2 Drawing Sheets

(51) Int. Cl.
*H01L 51/00* (2006.01)
*H01L 51/42* (2006.01)
*H01L 51/50* (2006.01)

(52) U.S. Cl.
CPC .... *H01L 51/0043* (2013.01); *C08G 2261/124* (2013.01); *C08G 2261/135* (2013.01); *C08G 2261/1412* (2013.01); *C08G 2261/1414* (2013.01); *C08G 2261/18* (2013.01); *C08G 2261/312* (2013.01); *C08G 2261/3142* (2013.01); *C08G 2261/3162* (2013.01); *C08G 2261/411* (2013.01); *C08G 2261/514* (2013.01); *C08G 2261/76* (2013.01); *C08G 2261/95* (2013.01); *H01L 51/0003* (2013.01); *H01L 51/0039* (2013.01); *H01L 51/42* (2013.01); *H01L 51/4253* (2013.01); *H01L 51/5056* (2013.01); *Y02E 10/549* (2013.01)

(58) Field of Classification Search
USPC .................................................... 359/500
See application file for complete search history.

(56) References Cited

U.S. PATENT DOCUMENTS

| | | | |
|---|---|---|---|
| 4,720,432 A | 1/1988 | Vanslyke et al. |
| 4,769,292 A | 9/1988 | Tang et al. |
| 5,061,569 A | 10/1991 | Vanslyke et al. |
| 5,121,029 A | 6/1992 | Hosokawa et al. |
| 5,130,603 A | 7/1992 | Tokailin et al. |
| 6,020,078 A | 2/2000 | Chen et al. |
| 6,251,531 B1 | 6/2001 | Enokida et al. |
| 6,824,895 B1 | 11/2004 | Sowinski et al. |
| 6,830,828 B2 | 12/2004 | Thompson et al. |
| 6,835,469 B2 | 12/2004 | Kwong et al. |
| 7,029,766 B2 | 4/2006 | Huo et al. |
| 7,250,226 B2 | 7/2007 | Tokito et al. |
| 7,250,532 B2 | 7/2007 | Iwakuma et al. |
| 7,592,414 B2 | 9/2009 | Meerholz et al. |
| 2001/0053462 A1 | 12/2001 | Mishima |
| 2003/0091862 A1 | 5/2003 | Tokito et al. |
| 2004/0002576 A1 | 1/2004 | Oguma et al. |
| 2004/0076853 A1 | 4/2004 | Jarikov |
| 2005/0258742 A1 | 11/2005 | Tsai et al. |
| 2006/0210830 A1 | 9/2006 | Funahashi et al. |
| 2006/0222886 A1 | 10/2006 | Kwong et al. |
| 2007/0087219 A1 | 4/2007 | Ren et al. |
| 2007/0092753 A1 | 4/2007 | Begley et al. |
| 2007/0205714 A1 | 9/2007 | Busing et al. |
| 2007/0208567 A1 | 9/2007 | Amento et al. |
| 2007/0252517 A1 | 11/2007 | Owczarczyk et al. |
| 2008/0027220 A1 | 1/2008 | Stossel et al. |
| 2008/0113101 A1 | 5/2008 | Inoue et al. |
| 2009/0061681 A1 | 3/2009 | McMunigal et al. |
| 2009/0134784 A1 | 5/2009 | Lin et al. |
| 2011/0284799 A1 | 11/2011 | Stoessel et al. |
| 2012/0056170 A1 | 3/2012 | Pan et al. |
| 2012/0061617 A1 | 3/2012 | Heun |
| 2015/0069303 A1 | 3/2015 | Eckes et al. |

FOREIGN PATENT DOCUMENTS

| | | | | |
|---|---|---|---|---|
| CN | 101885834 A | 11/2010 | | |
| CN | 102282150 A | 12/2011 | | |
| CN | 102399359 | 4/2012 | | |
| CN | 102399359 A | 4/2012 | | |
| CN | 102796260 A | 11/2012 | | |
| CN | 103232592 A | 8/2013 | | |
| CN | 103408732 | 11/2013 | | |
| CN | 103408732 A | 11/2013 | | |
| DE | 102004020298 A1 | 11/2005 | | |
| DE | 102005058557 A1 | 6/2007 | | |
| DE | 102009023156 A1 | 12/2010 | | |
| DE | 102009023154 A1 | 6/2011 | | |
| EP | 1284276 | 2/2003 | | |
| EP | 1284276 A1 | 2/2003 | | |
| EP | 1191613 B1 | 3/2006 | | |
| EP | 1957606 A1 | 8/2008 | | |
| EP | 1191614 B1 | 5/2009 | | |
| EP | 1191612 B1 | 9/2009 | | |
| EP | 2525628 A1 | 11/2012 | | |
| EP | 2706584 A1 | 3/2014 | | |
| JP | 2003338375 A | 11/2003 | | |
| JP | 2005108556 A | 4/2005 | | |
| JP | 2005285661 A | 10/2005 | | |
| JP | 2007059939 A | 3/2007 | | |
| JP | 2007197574 A | 8/2007 | | |
| JP | 2007211243 A | 8/2007 | | |
| JP | 2008053397 A | 3/2008 | | |
| JP | 2010010246 A | 1/2010 | | |
| KR | 10-2013-0120258 | * | 3/2014 | ............ C08G 61/12 |
| TW | 201406810 A | 2/2014 | | |
| WO | 0070655 A2 | 11/2000 | | |
| WO | 0141512 A1 | 6/2001 | | |
| WO | 0202714 A1 | 1/2002 | | |
| WO | 0215645 A1 | 2/2002 | | |
| WO | 03020790 A2 | 3/2003 | | |
| WO | 03051092 A1 | 6/2003 | | |
| WO | 03099901 A1 | 12/2003 | | |
| WO | 2004041901 A1 | 5/2004 | | |
| WO | 2004113412 A2 | 12/2004 | | |
| WO | 2005019373 A2 | 3/2005 | | |
| WO | 2005033174 A1 | 4/2005 | | |
| WO | 2005033244 A1 | 4/2005 | | |
| WO | 2005049689 A2 | 6/2005 | | |
| WO | 2005052027 A1 | 6/2005 | | |
| WO | 2005056633 A1 | 6/2005 | | |
| WO | 2005104264 A1 | 11/2005 | | |
| WO | 2006000388 A1 | 1/2006 | | |
| WO | 2006000389 A1 | 1/2006 | | |
| WO | 2006052457 A2 | 5/2006 | | |
| WO | 2006058737 A1 | 6/2006 | | |
| WO | 2006062226 A1 | 6/2006 | | |
| WO | 2006114364 A1 | 11/2006 | | |
| WO | 2006118345 A1 | 11/2006 | | |
| WO | 2007043495 A1 | 4/2007 | | |
| WO | 2007065549 A1 | 6/2007 | | |
| WO | 2007065678 A1 | 6/2007 | | |
| WO | 2007095118 A2 | 8/2007 | | |
| WO | 2007115610 A1 | 10/2007 | | |
| WO | 2009118087 A1 | 10/2009 | | |
| WO | 2009146770 A2 | 12/2009 | | |
| WO | 2010015307 A1 | 2/2010 | | |
| WO | 2010031485 A1 | 3/2010 | | |
| WO | 2010054728 A1 | 5/2010 | | |
| WO | 2010054731 A1 | 5/2010 | | |
| WO | 2010086089 A1 | 8/2010 | | |
| WO | 2010099852 A1 | 9/2010 | | |
| WO | 2010102709 A1 | 9/2010 | | |
| WO | 2010135519 A1 | 11/2010 | | |
| WO | 2011110277 A1 | 9/2011 | | |
| WO | 2011157339 A1 | 12/2011 | | |
| WO | 2012004407 A2 | 1/2012 | | |
| WO | 2012007086 A1 | 1/2012 | | |
| WO | 2012007087 A1 | 1/2012 | | |
| WO | 2012007088 A1 | 1/2012 | | |
| WO | 2016026806 A1 | 2/2016 | | |

OTHER PUBLICATIONS

First Office Action & Search Report for Priority Chinese Patent Application No. 201580069863.7, dated Sep. 29, 2018.

(56) References Cited

OTHER PUBLICATIONS

International Search Report and Written Opinion for Application No. PCT/CN2015/097192 dated Mar. 11, 2016.
Adachi, et al., "High-efficiency red electrophosphorescence devices", Appl. Phys. Lett. 78, 2001, pp. 1622-1624.
Baldo, et al., "High-efficiency fluorescent organic light-emitting devices using aphosphorescent sensitizer", Nature 403, 2000, pp. 750-753.
Bulovic, et al., "Transparent light-emitting devices", Nature, vol. 380, Mar. 7, 1996, p. 29.
Domercq, et al., "hoto-Patternable Hole-Transport Polymers for Organic Light-Emitting Diodes", Chem.Mater., 15, 2003, pp. 1491-1496.
Gu, et al., "Transparent organic light emitting devices", Appl. Phys. Lett, vol. 68, No. 19, May 6, 1996, pp. 2606-2608.
Huang, et al., "Crosslinable hole-transproting materialsfor solution processed polymer light-emitting diodes", Journal of Material Chemistry, vol. 18, No. 38, Oct. 14, 2008, pp. 4485-4592.
Huang, et al., "Water/alcohol soluble conjugated polymers as highly efficient electron transporting/injection layer in optoelectronic devices", Chem Soc Rev,, 39, 2010, pp. 2500-2521.
Jiang, et al., "Perfluorocyclobutane-Based ArylamineHole-Transporting Materials for Organic and Polymer Light-Emitting Diodes", Adv. Funct. Mater., No. 11-12, Dec. 2002, pp. 745-751.
Johnson, et al., "Luminescent Iridium( I), Rhodium( I), and Platinum( 11) Dithiolate Complexes", J . Am. Chem. SO, 105, 1983, pp. 1795-1802.
Kido, et al., "Bright red light-emitting organic electroluminescent devices having a europiumcomplex as an emitter", Appl. Phys. Lett., vol. No. 17, Oct. 24, 1994, pp. 2124-2126.
Kido, et al., "Electroluminescence in a Terbium Complex", Chemistry Letters, The Chemical Society of Japan, 1990, pp. 657-660.
Kipphan, "Handbook of Print Media: Technologies and Production Methods", ISBN 3-540-67326-1 Springer-Verlag Berlin Heidelberg New York, 2001, pp. 1-13.
Lei, et al., "Carbazole-based conjugated polymer with tethered acetylene groups: Synthesis and characterization", Dyes and Pigments, vol. 96, No. 1, Jul. 25, 2012, pp. 138-147.
Ma, et al., "Electroluminescence from triplet metal-ligand charge-transfer excited state of transition metal complexes", Synthetic Metals 94, 1998, pp. 245-248.
Ma, et al., "New Thermally Cross-Linkable Polymer and Its Application as a Hole-Transporting Layer for Solution Processed Multilayer Organic Light Emitting Diodes", Chem. Mater., 19, 2007, pp. 4827-4832.
Ma, et al., "Triphenylamine-based conjugated polmer/I-complex as turn on optical probe for mercury(II)", Sensors and Actuators B: Chemical: International Journal Devoted to Research and Development of Physical and Chemical Transducers, Elsevier BV, NL, vol. 182, Apr. 1, 2013, pp. 782-788.
Muller, et al., "Multi-colour organic light-emitting displays by solution processing", Nature, vol. 421, Feb. 20, 2003, pp. 829-833.
Niu, et al., "Crosslinkable Hole-Transport Layer on Conducting Polymer for High-Efficiency White Polymer Light-Emitting Diodes", Adv. Mater., 19, 2007, pp. 300-304.
Shi, et al., "TCNE—decorated triphenylamine-based conjugated polymer: Click synthesis and efficient trun-on fluorescent probing for Hg2+", Dyes and Pigments, vol. 104, Dec. 25, 2013, pp. 1-7.
Veinot, et al., "Toward the Ideal Organic Light-Emitting Diode. The Versatility and Utility of Interfacial Tailroing by Cross-Linked Siloxane Interlayers", Acc. Chem. Res., 38, 2005, pp. 632-643.
Wrighton, et al., "The Nature of the Lowest Excited State in Tricarbonylchloro-1 , 1 0-phenanthrolinerhenium( I) and Related Complexes", Journal of the American Chemical Society, 96:4, Feb. 20, 1974, pp. 998-1003.
Zeng, et al., "Polymer Light-Emitting Diodes with Cathodes Printed from Conducting AG Paste", Adv Mater, 19, 2007, pp. 810-814.

\* cited by examiner

CONJUGATED POLYMER CONTAINING ETHYNYL CROSSLINKING GROUP, MIXTURE, FORMULATION, ORGANIC ELECTRONIC DEVICE CONTAINING THE SAME AND APPLICATION THEROF

TECHNICAL FIELD

The present disclosure relates to the field of optoelectronic polymeric materials. Specifically, it relates to a conjugated polymer containing an ethynyl-crosslinking group, a mixture, a formulation, and an organic electronic device containing the same and an application thereof.

BACKGROUND

Since the disclosure of organic light-emitting diodes (OLEDs), OLEDs have showed great potential in applications of optoelectronic devices (such as flat-panel displays and general lighting) because of the diversity in organic synthesis, relative low manufacturing costs, and excellent optical and electronic properties of organic/polymeric semiconductive materials.

To develop high-efficiency OLED devices, it is critical to inject electrons and holes from cathode and anode, repectively. Therefore, efficient OLED devices usually adopt a multi-layer device structure which comprises one or more hole-transport/injection layers, or electron-transport/injection layers, in addition to the light-emitting layer. Accordingly, in addition to developement of excellent light-emitting materials, the development of excellent electron-transport/injection materials and hole-transport/injection materials is also critical for obtaining high-efficiency OLEDs (J Mater Chem, 2008, 18: 4495-4509; Acc Chem Res, 2005, 38: 632-643; Adv Mater, 2007, 19: 810-814).

It is easy to obtain multi-layer and complex high-efficiency OLEDs by vacuum evaporation, but it is difficult to realize large-scale application due to the expensive, time-consuming and wasteful materials. In contrast, solution processing OLEDs may be advantageously widely used in the preparation of large-area flexible devices with low-cost ink jet printing, printing, and other solution processss, and therefore are promising in a wide range of applications and great commercial value. As typical organic photoelectric materials have similar solubility, that is, organic/polymer light-emitting materials, hole-injection/transport materials, electronic injection/transport materials have good solubility in solvents such as toluene, chloroform, chlorobenzene, o-dichlorobenzene, o-xylene and tetrahydrofuran, therefore, there are problems of miscibility and erosion of interfaces when using the solution process to prepare multi-layer, complex OLEDs. For example, when preparing polymers or small-molecule light-emitting layers using solution process, the solvent used may dissolve the underlying hole-transport layer, causing problems such as miscibility and erosion of interfaces (J Mater Chem, 2008, 18: 4495-4509; Chem Soc Rev, 2010, 39: 2500-2521).

When conventional crosslinking groups, such as perfluorocyclobutane, styrene, oxetane, siloxane, acrylate and benzocyclobutene, are used in modification of conjugated polymers, cross linking reaction of the crosslinking groups perfluorocyclobutane (Adv. Funct. Mater., 2002, 12, 745), styrene (Adv. Mater., 2007, 19, 300), oxetane (Nature, 2003, 421, 829.), siloxane (Acc. Chem. Res., 2005, 38, 632), acrylate (Chem. Mater., 2003, 15, 1491), and benzocyclobutene (Chem. Mater., 2007, 19, 4827.) can induced under conditions such as illumination, heating, etc, to form an insoluble and infusible film of interpenetrating polymer network with excellent solvent resistance so that the problems such as miscibility and erosion of interfaces are prevented (TW201406810A, U.S. Pat. No. 7,592,414B2).

However, the performance of solution-process OLEDs based on the cross-linked polymer of these crosslinking groups has yet to be improved.

Therefore, there is an urgent need for development of new high-performance cross-linkable polymeric electron-transport material.

SUMMARY OF THE INVENTION

In one aspect of the present disclosure, there is provided a conjugated polymer containing an ethynyl crosslinking group; a mixture, a formulation, and an organic electronic device containing the same; and uses thereof. The conjugated polymer material may have a conjugated backbone structure and a functionalized ethynyl crosslinking group as side chain. Since the polymer has a conjugated backbone structure, the polymer is endowed with various optical and electrical properties. The conjugated polymer material may be cross-linked under heating to form an insoluble and infusible film of interpenetrating polymer network with excellent solvent resistance and is suitable for making complex multilayer organic electronic devices. The conjugated polymer may be used in optoelectronic devices such as organic light emitting diodes, polymer solar cells, organic field effect transistors, perovskite solar cells, improving device performance.

The conjugated polymer containing an ethynyl crosslinking group according to one aspect of the present disclosure may have the following structure (Chemical Formula 1):

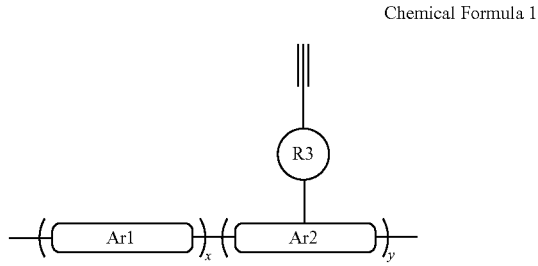

Chemical Formula 1 wherein, x and y are mole percentages and x+y=1; Ar1 and Ar2 in multiple occurences are the same or different and independently selected from an aryl or a heteroaryl group; and, R3 is a linking group.

In a preferred embodiment, the conjugated polymer according to one aspect of the disclosure is provided, wherein Ar1 may be selected from a polymer backbone structural unit that may be any one selected from the group consisting of benzene, biphenyl, triphenyl, benzo, fluorene, indenofluorene, carbazole, indolocarbazole, dibenzosilole, dithienocyclopentadiene, dithienosilole, thiophene, anthracene, naphthalene, benzodithiophene, benzofuran, benzothiophene, and benzoselenophen compounds, or a combination thereof.

In another preferred embodiment, the conjugated polymer according to one aspect of the disclosure is provided, wherein Ar2 may be a hole-transport unit that may be any one selected from the group consisting of aryl amines, triphenylamine, naphthylamine, thiophene, carbazole, dibenzothiophene, dithienocyclopentadiene, dithienosilole, dibenzoselenophen, furan, thiophene, benzofuran, benzothiophene, benzoselenophene, carbazole, and indolocarbazole, or a combination thereof.

In another preferred embodiment, the conjugated polymer according to one aspect of the disclosure is provided, wherein Ar2 may be an electron-transport unit that is may be any one selected from the group consisting of pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, or a combination thereof.

In another preferred embodiment, the conjugated polymer according to one aspect of the disclosure is provided, wherein R3 may be any one selected from the group consisting of: alkyl having 1 to 30 carbon atoms, alkoxy having 1 to 30 carbon atoms, amino, alkenyl, alkynyl, aralkyl, heteroalkyl, aryl, and heteroaryl, or a combination thereof.

The present disclosure also provides a mixture which may comprise the above-described conjugated organic polymer and at least another organic functional material that is any one selected from the group consisting of a hole-injection material (HIM), a hole-transport material (HTM), an electron-transport material (ETM), an electron-injection material (EIM), an electron-blocking material (EBM), a hole-blocking material (HBM), a light-emitting material (Emitter), and a host material (Host), and the like.

The present disclosure also provides a formulation useful as a printing ink, which may comprise a conjugated polymer according to one aspect of the present disclosure or a mixture thereof, and at least one organic solvent.

The present disclosure further provides an organic electronic device which may comprise the conjugated organic polymer or a combination thereof, and the use thereof.

Compared with the prior art, the polymer material of the present disclosure has the following advantages:

(1) The conjugated polymer having an ethynyl crosslinking group as described in one aspect of the present disclosure is endowed with various optical properties (photoluminescence, electroluminescence, photovoltaic effect, etc.), electrical properties (semiconductor properties, carrier transport characteristics, etc.), and the like. The ethynyl crosslinking group is also cross-linkable, which may form a three-dimensional insoluble and infusible film of interpenetrating polymer network under heating to provide excellent solvent resistance. The conjugated polymer with solution process characteristics may be used in preparation of complex multi-layer optoelectronic devices by inkjet printing, screen printing, spin coating and other solution processing technology to prepare the polymeric optoelectronic devices. The formation of insoluble and infusible film of interpenetrating polymer network is also possible by way of cross linking, which can provide excellent solvent resistance, facilitating solution processing of multi-layer polymeric optoelectronic device.

2) Compared with conventional cross-linkable photovoltaic materials, the conjugated polymer containing an ethynyl crosslinking group as described in one aspect of the present disclosure can initiate chemical reaction among the ethynyl crosslinking groups under heating conditions to produce a $SP^2$ hybrid conjugated double bond. That is, the conjugated polymer chains are bound together by one or more conjugated double bonds, which may increase the transport among the chains of carrier (hole or electron) conjugated polymer chains and thus has the potential to improve the carrier transport properties of the conjugated polymer film.

DETAILED DESCRIPTION OF THE EMBODIMENTS

Figure 1:
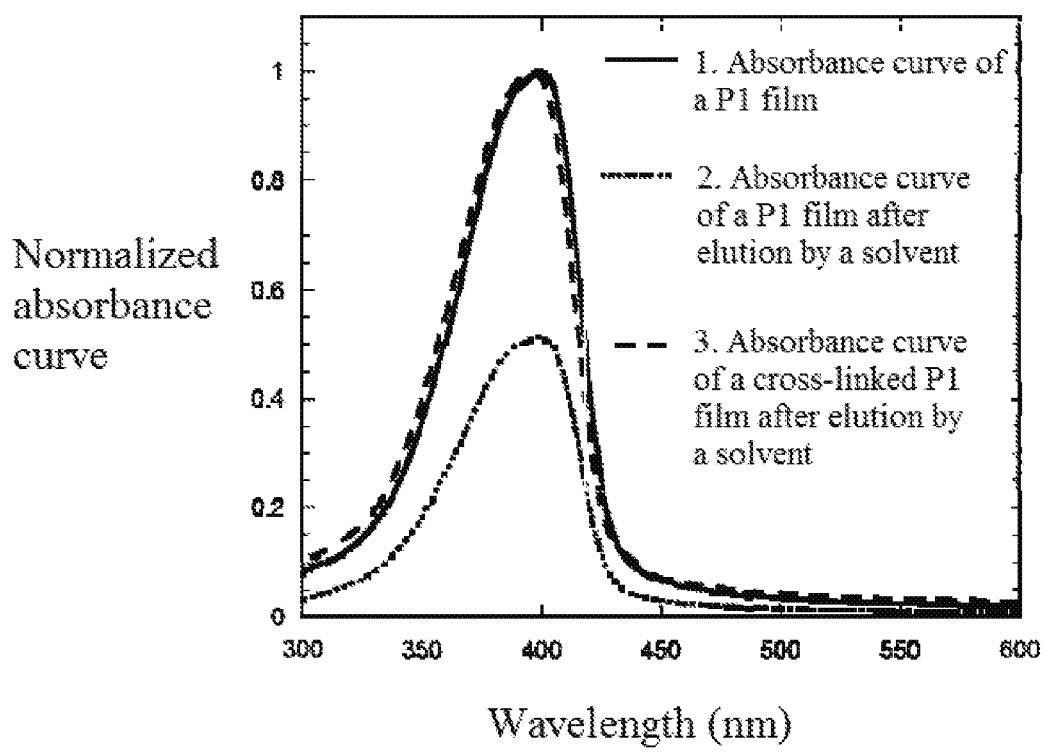
FIG. 1 is a graph showing the absorbance of a P1 film prepared in Example 1, with or without crosslinking treatment, and after elution by a tetrahydrofuran solution.
Figure 2:
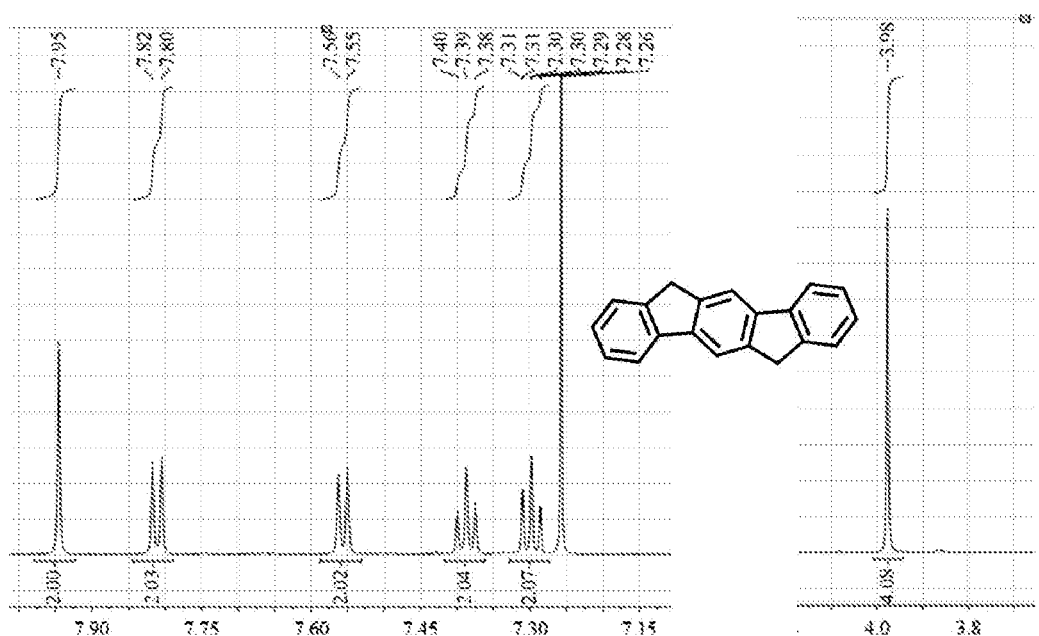
FIG. 2 is the $^1$H NMR of the key intermediate, indenofluorene.
Figure 3:
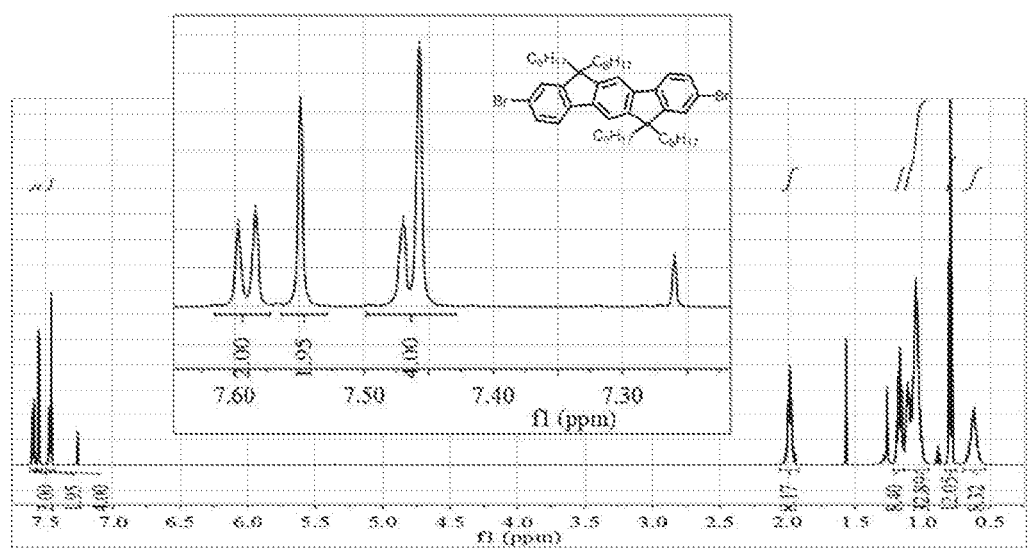
FIG. 3 is the $^1$H NMR of 2,7-dibromo-6,6,12,12-tetraoctylindenofluorene.

In one aspect of the present disclosure, there is provided a conjugated polymer containing an ethynyl crosslinking group and its use. The conjugated polymer material has a conjugated backbone structure and a functionalized ethynyl crosslinking group as side chain. The present disclosure will now be described in greater detail with reference to the accompanying drawings so that the purpose, technical solutions, and technical effects thereof are more clear and comprehensible. It is to be understood that the specific embodiments described herein are merely illustrative of, and are not intended to limit, the disclosure.

The present disclosure provides a conjugated polymer containing an ethynyl crosslinking group, having the following structure:

Chemical Formula 1

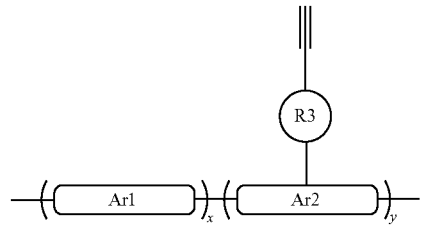

wherein, x and y are mole percentages and x+y=1; Ar1 and Ar2 in multiple occurrences are the same or different and independently selected from an aryl or a heteroaryl group; and, R3 is a linking group.

As used herein, the term "small molecule" refers to a molecule that is not a polymer, oligomer, dendrimer, or blend. In particular, there is no repetitive structure in small molecules. The molecular weight of the small molecule is no greater than 3000 g/mole, more preferably no greater than 2000 g/mole, and most preferably no greater than 1500 g/mole.

As used herein, the term "polymer" includes homopolymer, copolymer, and block copolymer. In addition, in the present disclosure, the polymer also includes dendrimer. The synthesis and application of dendrimers are described in Dendrimers and Dendrons, Wiley-VCH Verlag GmbH & Co. KGaA, 2002, Ed. George R. Newkome, Charles N. Moorefield, Fritz Vogtle.

The term "conjugated polymer" as defined herein is a polymer whose backbone is predominantly composed of the sp2 hybrid orbital of carbon (C) atom. Some known non-limiting examples are: polyacetylene and poly (phenylene vinylene), on the backbone of which the C atom can also be optionally substituted by other non-C atoms, and which is still considered to be a conjugated polymer when the sp2 hybridization on the backbone is interrupted by some natural defects. In addition, the conjugated polymer in the present disclosure may also comprise aryl amine, aryl phosphine and other heteroarmotics, organometallic complexes, and the like.

In the present disclosure, the terms such as polymerid, polymeride, and polymer have the same meaning and are interchangeable in use.

In some embodiments, the polymers described in one aspect of the disclosure have a molecular weight (Mw) of no smaller than 10000 g/mole, more preferably no smaller than 50000 g/mole, more preferably no smaller than 100000 g/mole, and most preferably no smaller than 200000 g/mol.

In some preferred embodiments, the polymers described in one aspect of the disclosure are provided, wherein Ar1 and Ar2 are the same or different in multiple occurences and independently selected from any one of the following structural groups: an cyclic aromatic group, including any one of benzene, biphenyl, triphenyl, benzo, fluorene, indenofluorene, and derivatives thereof; and, a heterocyclic aromatic group, including triphenylamine, dibenzothiophene, dibenzofuran, dibenzoselenophen, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, selenophenodipyridine, and the like, or a combination thereof, or a combination thereof.

In some embodiments, the Ar1, Ar2 cyclic aryl groups and heterocyclic aryl groups may be further optionally substituted, wherein the substituents may be hydrogen, deuterium, alkyl, alkoxy, amino, alkenyl, alkynyl, aralkyl, heteroalkyl, aryl and heteroaryl, or a combination thereof.

Typically, the conjugated polymer comprises at least one backbone structural unit. The backbone structural unit is typically a π-conjugated structural unit with relatively large energy gap, also referred to as backbone unit, which may be selected from monocyclic or polycyclic aryl or heteroaryl. In the present disclosure, the conjugated polymer may comprise two or more backbone structural units. Typically, the content of the backbone structural unit may be no smaller than 40 mol %, more preferably no smaller than 50 mol %, more preferably no smaller than 55 mol %, and most preferably no smaller than 60 mol %.

In a preferred embodiment, the polymer according to one aspect of the disclosure is provided, wherein Ar1 may be a polymer backbone structural unit that is any one selected from the group consisting of benzene, biphenyl, triphenyl, benzo, fluorene, indenofluorene, carbazole, indolocarbazole, dibenzosilole, dithienocyclopentadiene, dithienosilole, thiophene, anthracene, naphthalene, benzodithiophene, benzofuran, benzothiophene, benzene And selenophene and its derivatives, or a combination thereof.

"Polymer backbone" refers to a chain having the largest number of chain units or repeating units in a polymer chain with a branched (side chain) structure.

In some embodiments, the polymers of the present disclosure have hole-transport properties.

In a preferred embodiment, the polymer according to one aspect of the disclosure is provided, wherein Ar2 may be selected from units having hole-transport properties, and a hole-transport unit may be preferably any one selected from the group consisting of aromatic amines, triphenylamine, naphthylamine, thiophene, carbazole, dibenzothiophene, dithienocyclopentadiene, dithienosilole, dibenzoselenophen, furan, thiophene, benzofuran, benzothiophene, benzoselenophene, carbazole, indolecarbazole, and their derivatives, or a combination thereof.

In another preferred embodiment, Ar2 may have the structure represented by Chemical Formula 2:

Chemical Formula 2

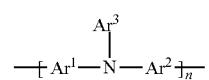

wherein $Ar^1$, $Ar^2$, $Ar^3$ in multiple occurences are independently the same or different:

$Ar^1$ is selected from a single-bond or mononuclear or polynuclear aryl or heteroaryl, wherein the aryl or heteroaryl may be optionally substituted with other side chains.

$Ar^2$ is selected from mononuclear or polynuclear aryl or heteroaryl, wherein the aryl or heteroaryl may be optionally substituted with other side chains.

$Ar^3$ is selected from mononuclear or polynuclear aryl or heteroaryl, wherein the aryl or heteroaryl may be optionally substituted with other side chains. $Ar^3$ may also be linked to other parts of Chemical Formula 2 by a bridging group.

N is selected from 1, 2, 3, 4, or 5.

The preferred structural unit represented by Chemical Formula 2 is Chemical Formula 3

Chemical Formula 3

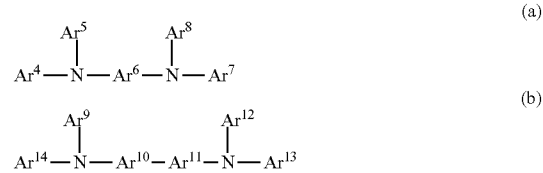

wherein $Ar^4$, $Ar^{6'}$, $Ar^7$, $Ar^{10}$, $Ar^{11}$, $Ar^{13}$, and $Ar^{14}$ are defined in the same way as $Ar^2$ in Chemical Formula 2, $Ar^v$, $Ar^8$, $Ar^9$, and $Ar^{12}$ are as defined in the same way as $Ar^a$ in Chemical Formula 2.

$Ar^1$-$Ar^{14}$ in Chemical Formula 2 and Chemical Formula 3 may be preferably selected from the group consisting of phenylene, naphthalene, anthracene, fluorene, spirobifluorene, indenofluorene, phenanthrene, thiophene, pyrrole, carbazole, binaphthalene, dehydrophenanthrene, and the like, or a combination thereof.

Particularly preferred alternatives of the structural units represented by Chemical Formula 2 and Chemical Formula 3 are listed in Table 1. Each of these compounds may be optionally substituted with one or more substituents, and R is a substituent.
TABLE 1
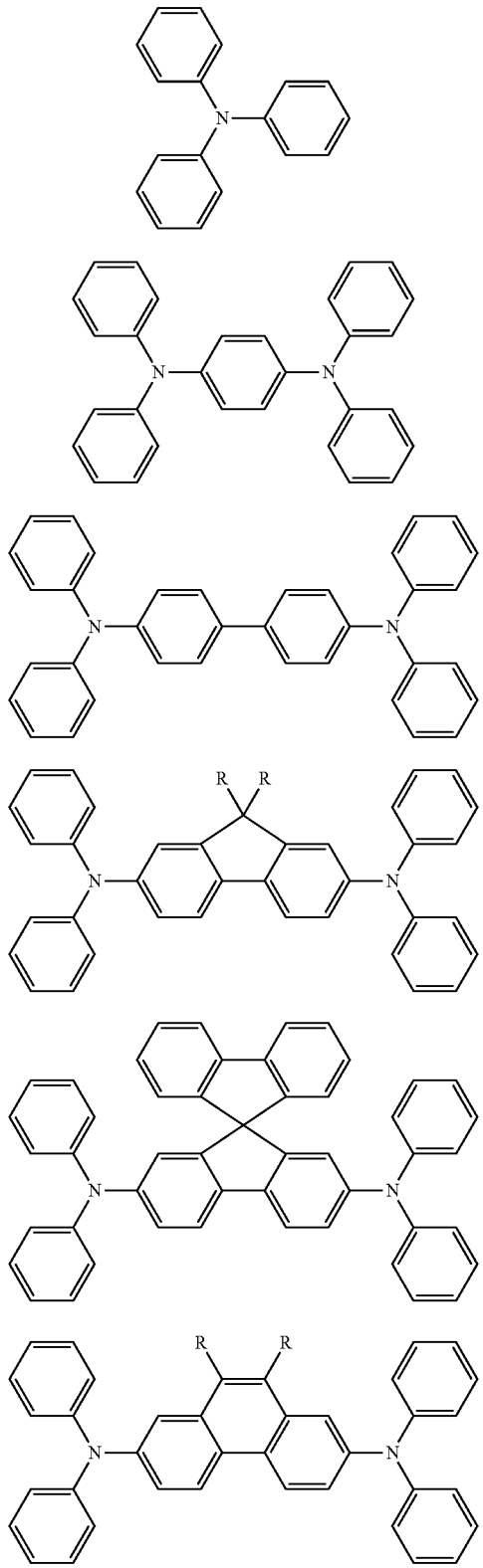
TABLE 1-continued
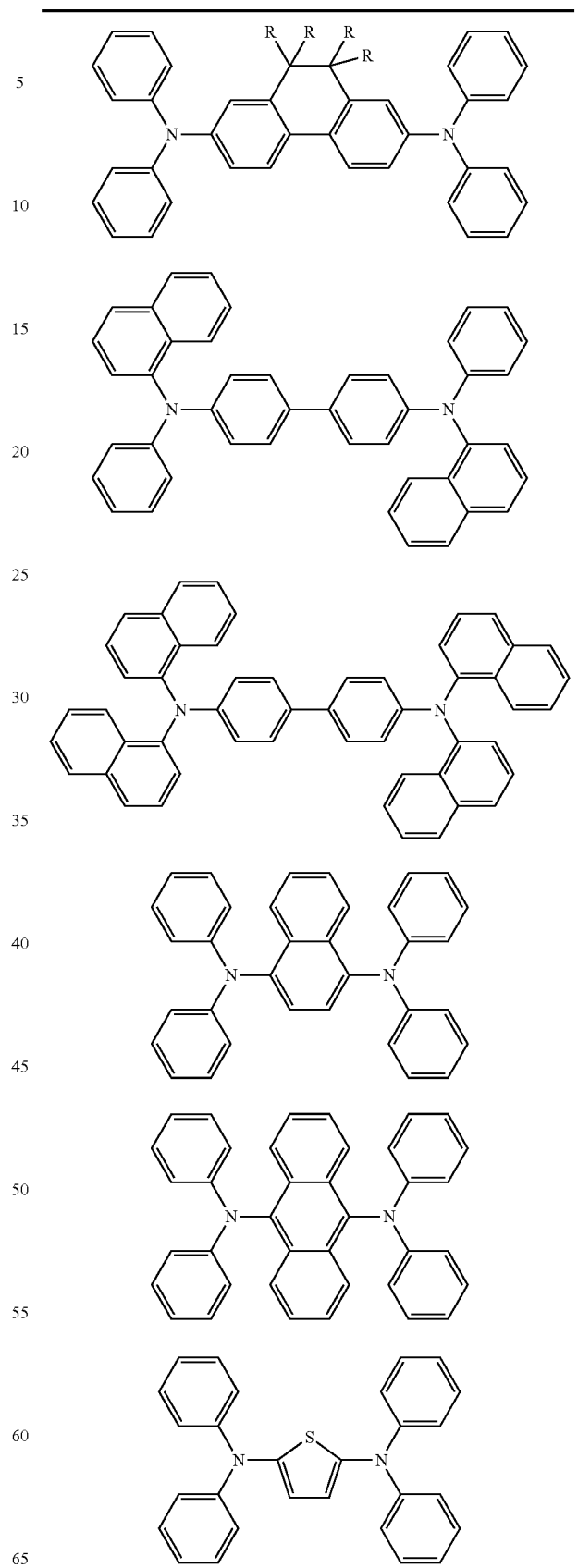

TABLE 1-continued

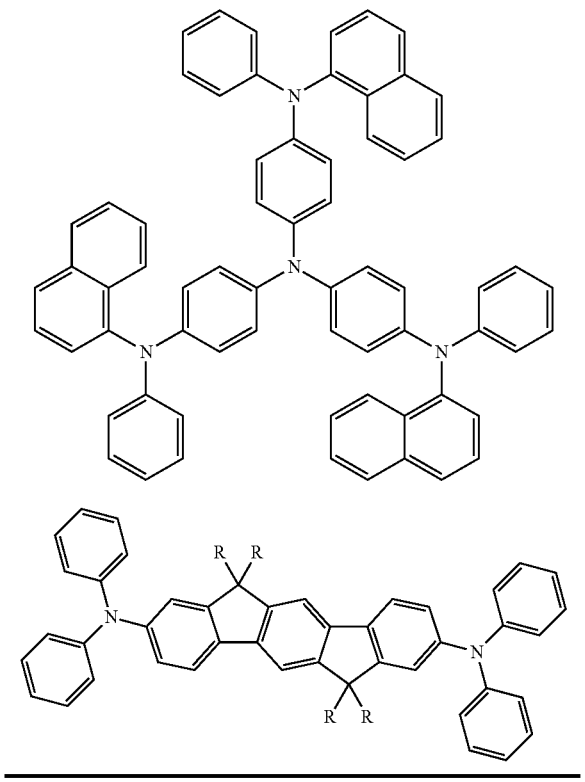

In another preferred embodiment, Ar2 may have a structure represented by Chemical Formula 4

$$(D^1)_{n1}\text{-}(Ar^{15})_{n2}\text{-}(D^2)_{n3}\text{-}(Ar^{16})_{n4} \qquad \text{Chemical Formula 4}$$

wherein $D^1$ and $D^2$ may be independently the same or different in multiple occurrences and may be selected from any of the following functional groups or any combinations thereof: thiophene, selenophene, thieno[2,3b]thiophene, thieno[3,2b] thiophene, dithienothiophene, pyrrole, and aniline, all of which functional groups may be optionally substituted by any group below: halogen, —CN, —NC, —NCO, —NCS, —OCN, SCN, C(=O)NR$^0$R$^{00}$, —C(=O)X, —C(=O)R$^0$, —NH$_2$, —NR$^0$R$^{00}$, SH, SR$^0$, —SO$_3$H, —SO$_2$R$^0$, —OH, —NO$_2$, —CF$_3$, —SFS, silyl or carbyl or hydrocarbyl having 1 to 40 C atoms, wherein R$^0$ and R$^{00}$ are substituent groups.

$Ar^{15}$ and $Ar^{16}$ may be independently selected from the same or different forms in multiple occurrences and may be selected from mononuclear or polynuclear aryl or heteroaryl and may be optionally fused to their respective adjacent $D^1$ and $D^2$.

n1-n4 may be independently selected from an integer from 0 to 4.

Preferably, $Ar^{15}$ and $Ar^{16}$ in the materials represented by Chemical Formula 4 are selected from phenylene, naphthalene, anthracene, fluorene, spirobifluorene, indenofluorene, phenanthrene, thiophene, pyrrole, carbazole, binaphthalene, dehydrophenanthrene, or a combination thereof.

The unit having the hole-transport property may correspond to the hole-transport material HTM in OLED. Suitable organic HTM materials may optionally comprise compounds having the following structural units: phthlocyanine, porphyrine, amine, aryl amine, triarylamine, thiophene, fused thiophene such as dithienothiophene and dibenzothiophene, pyrrole, aniline, carbazole, indolocarbazole, and their derivatives, or a combination thereof.

Examples of cyclic aryl amine-derived compounds that may be used as HTM include, but are not limited to, the general structure as follows:

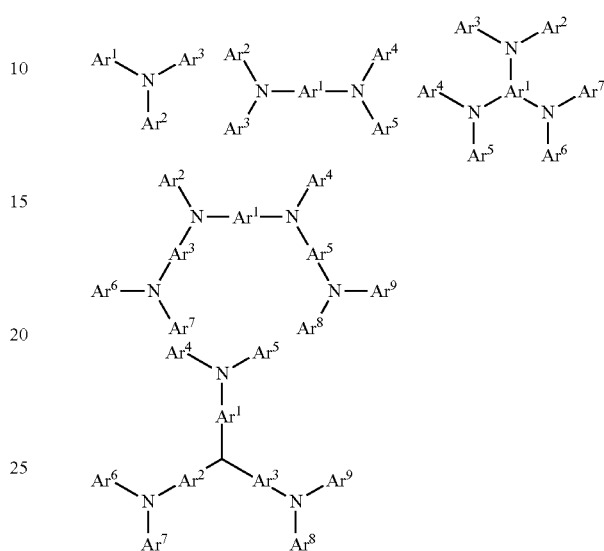

wherein each $Ar^1$ to $Ar^9$ may be independently selected from: cyclic aryl groups such as benzene, biphenyl, triphenyl, benzo, naphthalene, anthracene, phenalene, phenanthrene, fluorene, pyrene, chrysene, perylene, azulene; and heterocyclic aryl groups such as dibenzothiophene, dibenzofuran, furan, thiophene, benzofuran, benzothiophene, benzoselenophene, carbazole, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, dibenzoselenophene, benzoselenophene, benzofuropyridine, indolocarbazole, pyridylindole, pyrrolodipyridine, furodipyridine, benzothienopyridine, thienodipyridine, benzoselenophenopyridine, and selenophenodipyridine; groups comprising 2 to 10 ring structures which may be the same or different types of cyclic aryl or heterocyclic aryl and are bonded to each other directly or through at least one of the following groups, for example: oxygen atom, nitrogen atom, sulfur atom, silicon atom, phosphorus atom, boron atom, chain structure unit, and aliphatic cyclic group; and wherein each Ar may be further optionally substituted, and the substituents may optionally be hydrogen, alkyl, alkoxy, amino, alkene, alkyne, aralkyl, heteroalkyl, aryl and heteroaryl.

In one aspect, $Ar^1$ to $Ar^9$ may be independently selected from the group consisting of:

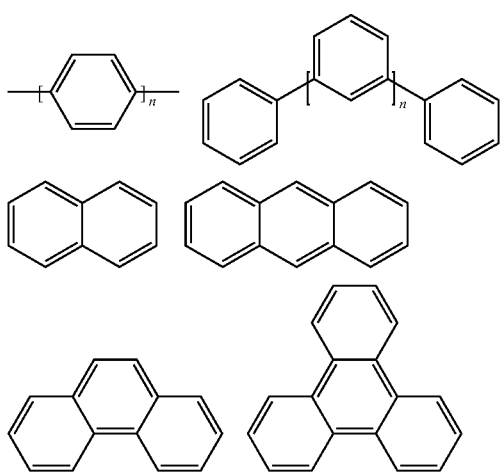
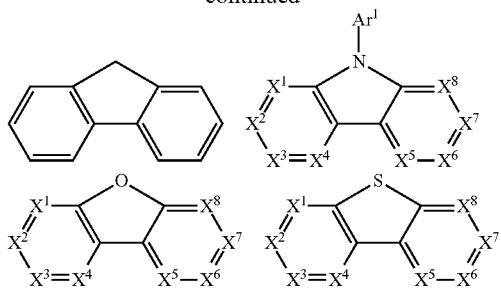
wherein n is an integer of 1 to 20; $X^1$ to $X^8$ are CH or N; $Ar^1$ is as defined above. Additional non-limiting examples of cyclic aryl amine-derived compounds may be found in U.S. Pat. Nos. 3,567,450, 4,720,432, 5,061,569, 3,615,404, and 5,061,569.
Suitable non-limiting examples of HTM compounds are set forth in the following table:
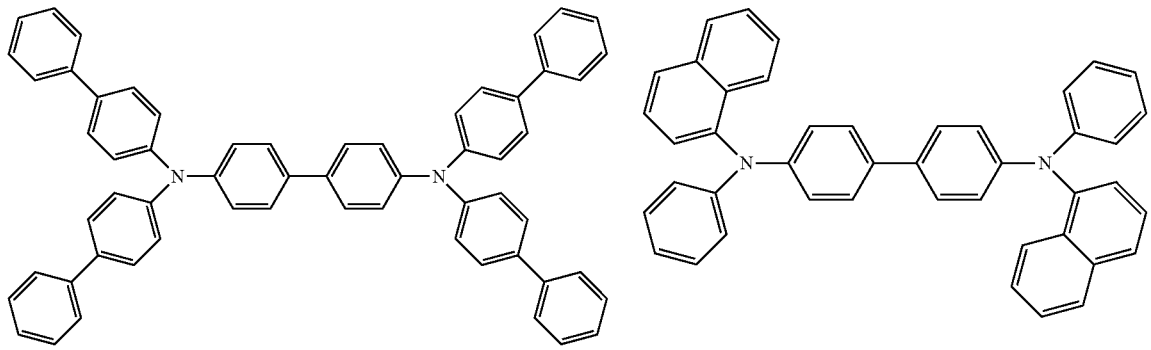
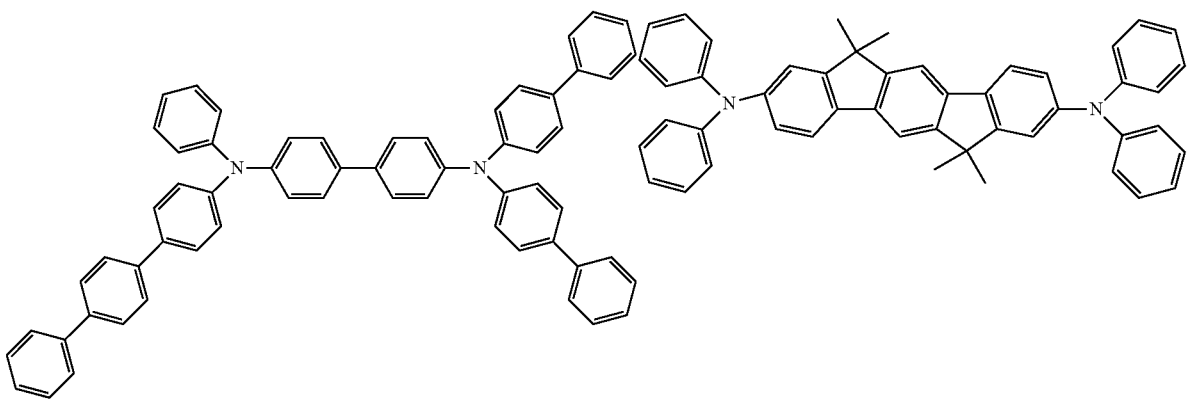

-continued

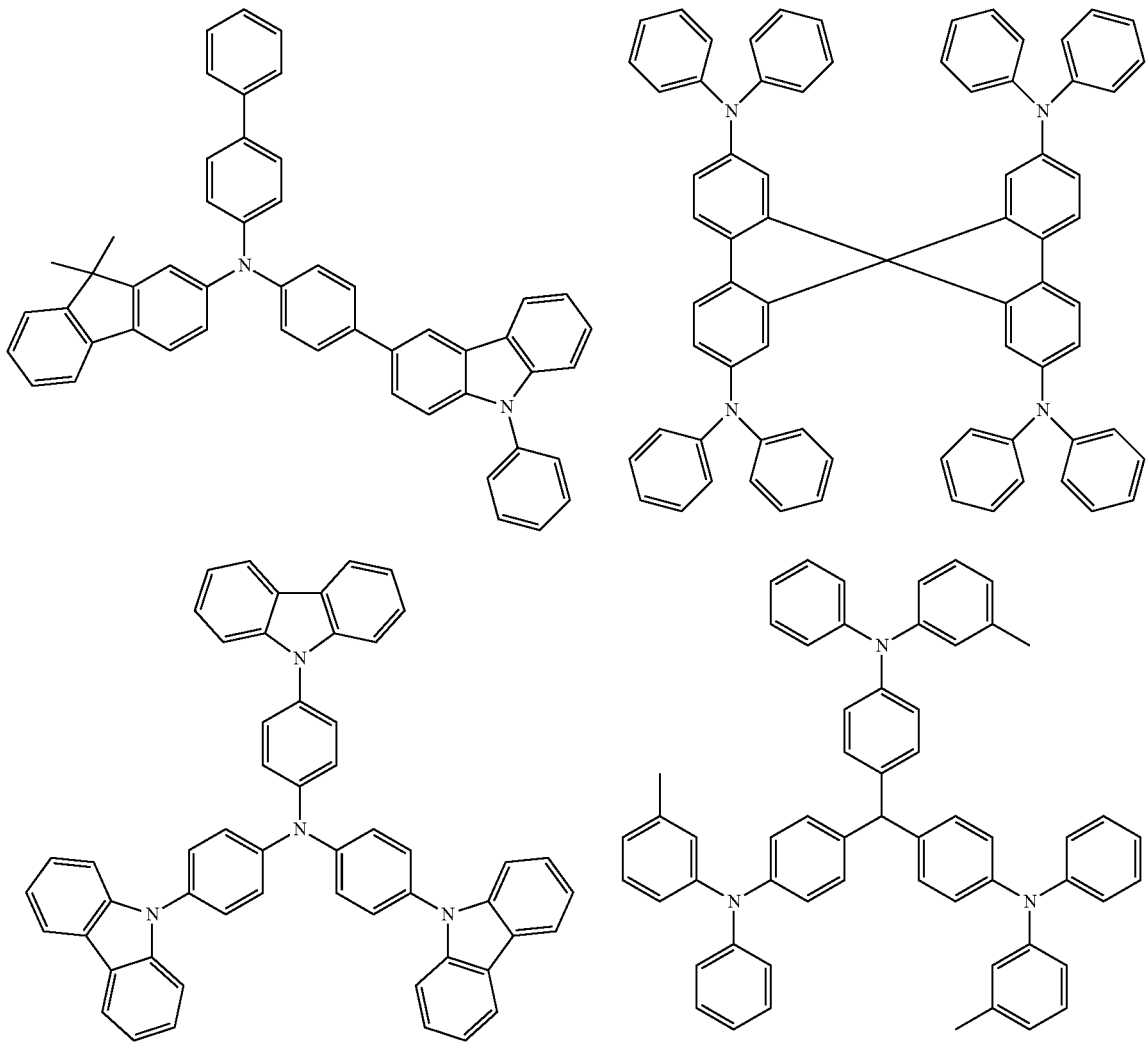

The HTM described above may be incorporated into the polymer of the present disclosure by a hole-transport structural unit.

In some embodiments, the polymers of the present disclosure have electron-transport properties.

In a preferred embodiment, according to one aspect of the present disclosure, wherein Ar2 may be selected from units having electron-transport properties, and preferred electron-transport units may be any one selected from the group consisting of pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, or a combination thereof.

The unit having the electron-transport characteristics may correspond to the electron-transport material ETM in the OLED. ETM is also sometimes called n-type organic semiconductor material. In principle, examples of suitable ETM materials are not particularly limited and any metal complexes or organic compounds may be used as ETM as long as they have electron-transport properties. Preferred organic ETM materials may be selected from the group consisting of tris (8-quinolinolato) aluminum (AlQ3), phenazine, phenanthroline, anthracene, phenanthrene, fluorene, bifluorene, spiro-bifluorene, phenylene-vinylene, triazine, triazole, imidazole, pyrene, perylene, trans-indenofluorene, cis-indenonfluorene, dibenzol-indenofluorene, indenonaphthalene, benzanthracene and their derivatives, or any combination thereof.

In another aspect, compounds that may be used as ETM may be molecules comprising at least one of the following groups:

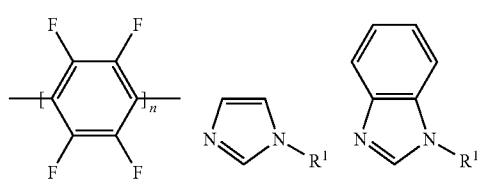

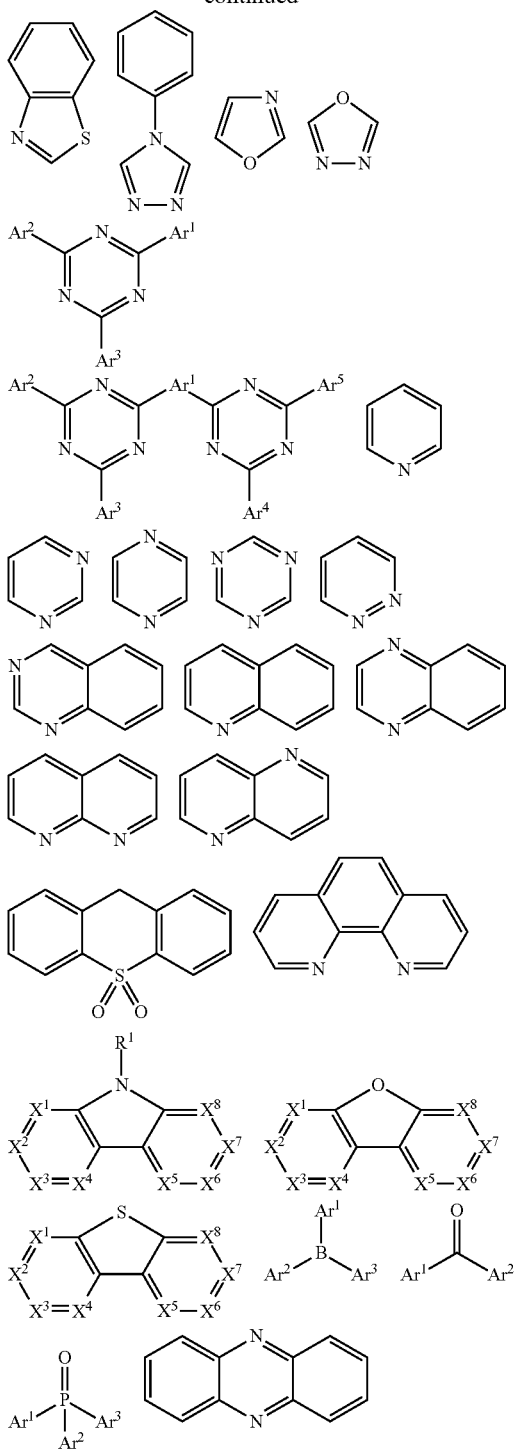

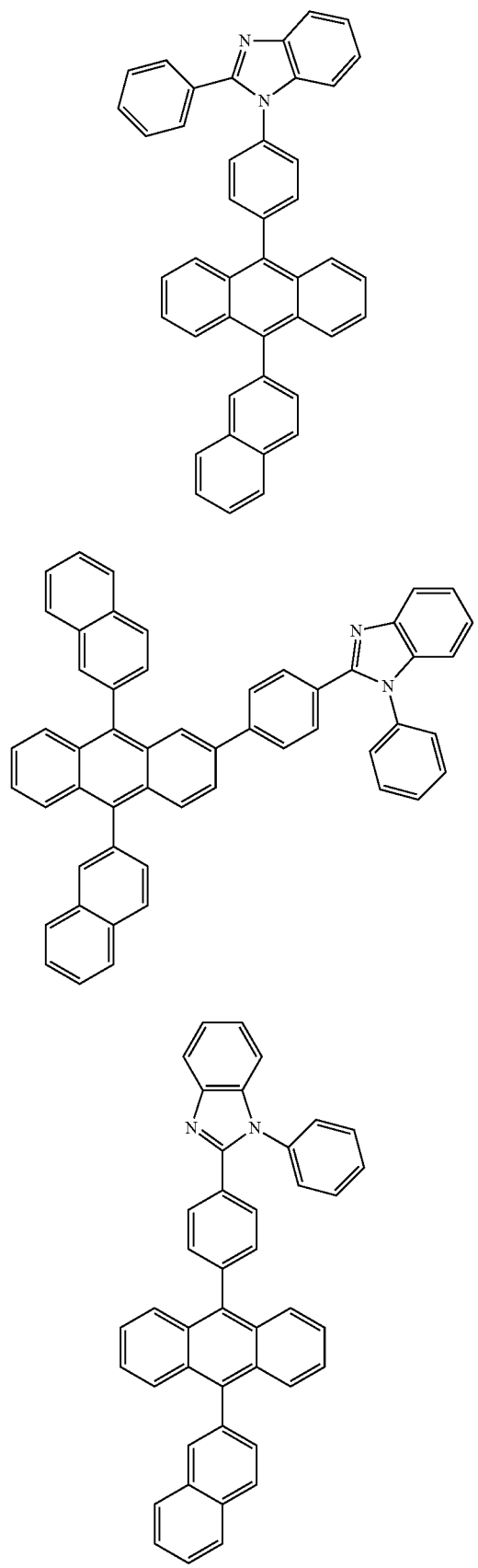

wherein $R^1$ may be selected from the group consisting of: hydrogen, alkyl, alkoxy, amino, alkene, alkyne, aralkyl, heteroalkyl, aryl and heteroaryl, wherein, when they are aryl or heteroaryl, they may have the same meaning as $Ar^1$ in HTM as described above; $Ar^1$-$Ar^5$ may have the same meaning as $Ar^1$ in HTM as described above; n is an integer from 0 to 20; and $X^1$-$X^8$ may be selected from $CR^1$ or N.

Non-limiting examples of suitable ETM compounds are listed in the following table:

The ETM described above may be incorporated into the polymer of the present disclosure by an electron-transport structural unit.

The conjugated polymer containing an ethynyl crosslinking group of structural Chemical Formula 1 according to one aspect of the present disclosure is provided, wherein R3 is a linking group. In a preferred embodiment, R3 may be selected from alkyl, alkoxy, amino, alkenyl, alkynyl, aralkyl, heteroalkyl, aryl and heteroaryl having from 2 to 30 carbon atoms.

In some embodiments, R3 is a non-conjugated linking group, preferably any one selected from the group consisting of alkyl, alkoxy, amino, alkenyl, alkynyl, aralkyl, heteroalkyl, or a combination thereof.

In some preferred embodiments, R3 is a conjugated linking group, preferably selected from C1 to C30 alkyl, C1 to C30 alkoxy, benzene, biphenyl, triphenyl, benzo, thiophene, anthracene, naphthalene, benzodithiophene, aryl amine, triphenylamine, naphthylamine, thiophene, carbazole, dibenzothiophene, dithienocyclopentadiene, dithienosilole, dibenzoselenophen, furan, thiophene, benzofuran, benzothiophene, benzoselenophene, carbazole, furan and the like, or a combination thereof.

Non-limiting examples of a suitable linking group R3 with a crosslinkable group are listed in the following table:

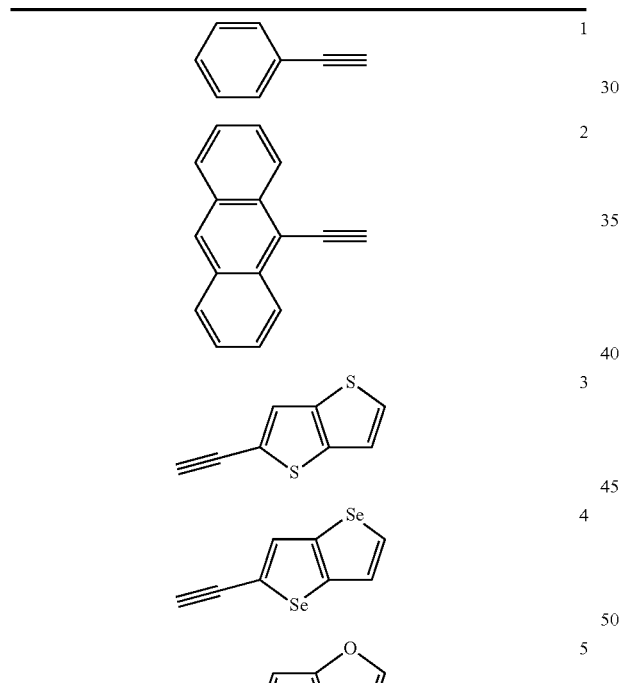

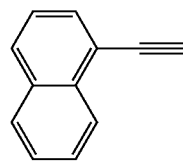

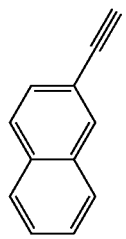

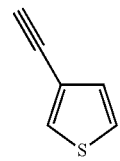

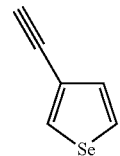

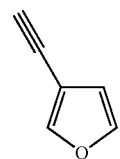

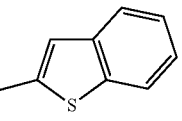

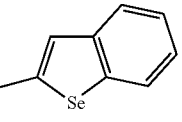

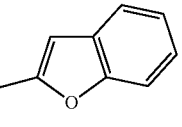

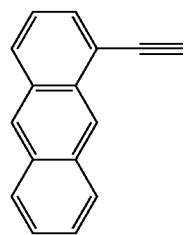 [SMILES: C#Cc1cccc2cc3ccccc3cc12]

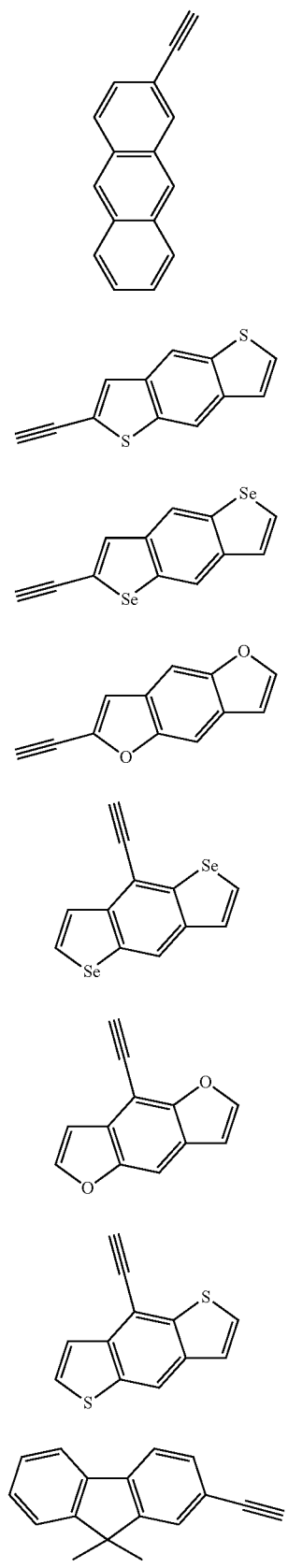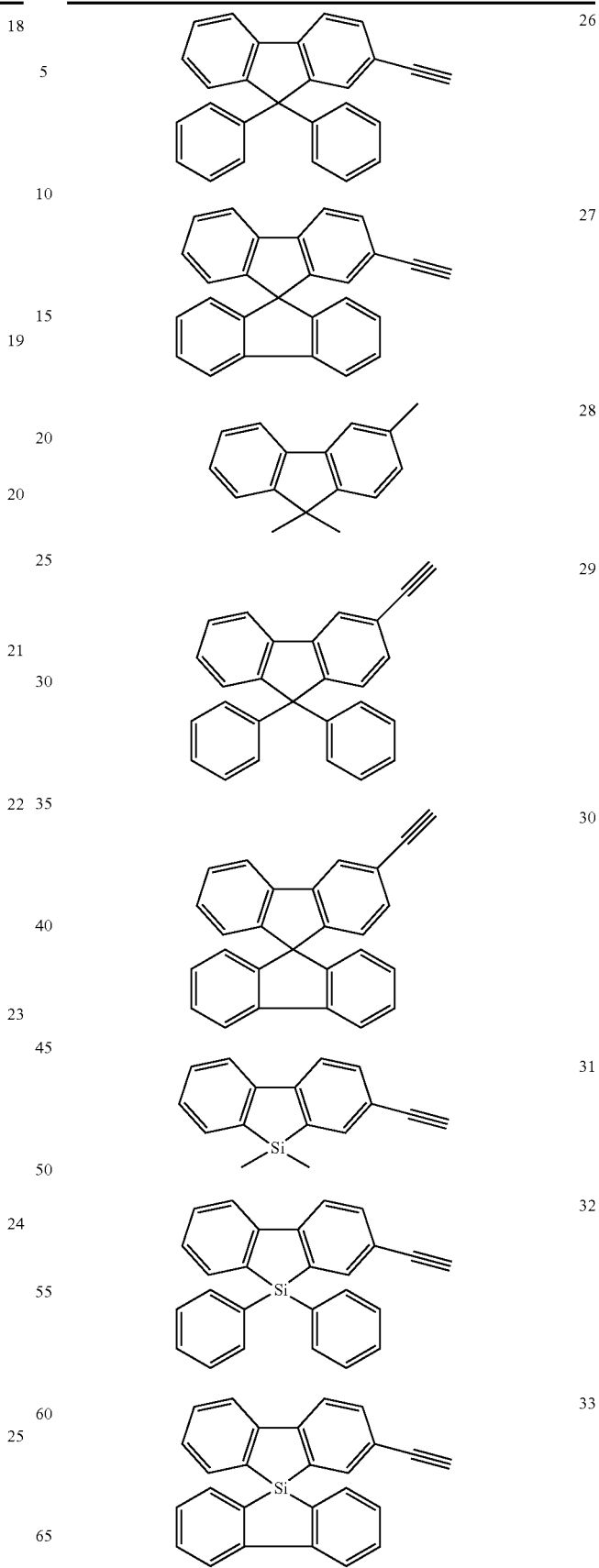

| 34 | 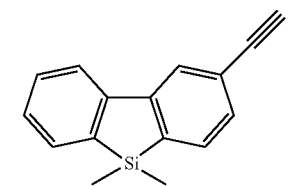 [SMILES: C#Cc1ccc2c(c1)-c1ccccc1[Si]2(C)C] | 42 | 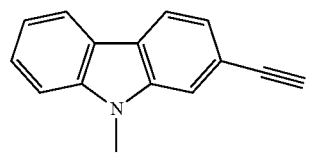 |
| 35 | 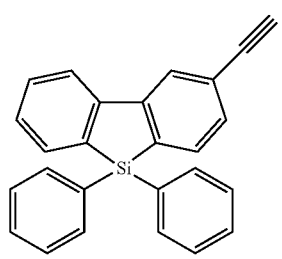 | 43 | 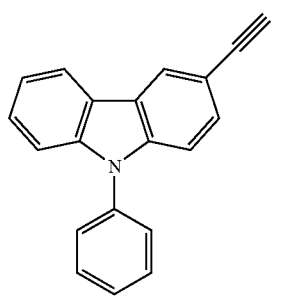 |
| 36 | 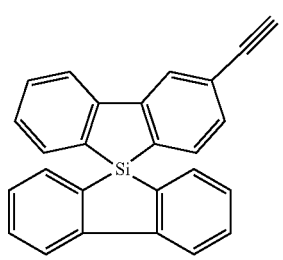 [SMILES: C#Cc1ccc2c(c1)-c1ccccc1[Si]21c2ccccc2-c2ccccc21] | 44 | 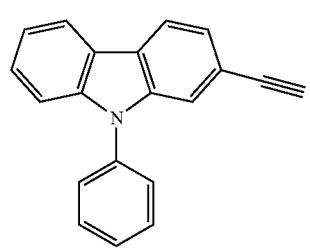 |
| 37 | 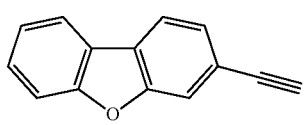 | 45 | 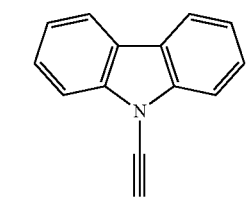 |
| 38 | 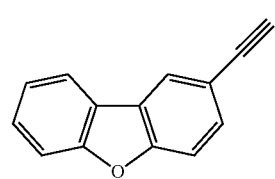 | 46 | 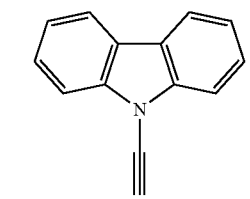 |
| 39 | 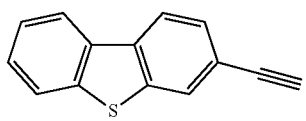 | 47 | 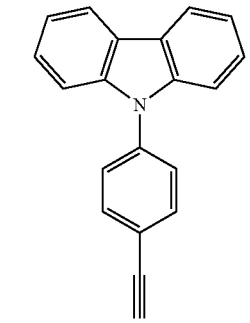 |
| 40 | 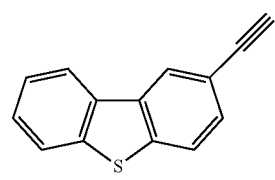 | | |
| 41 | 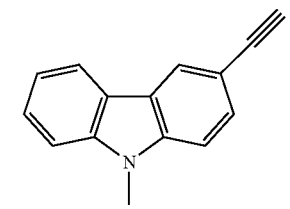 [SMILES: C#Cc1ccc2c(c1)c1ccccc1n2C] | | |

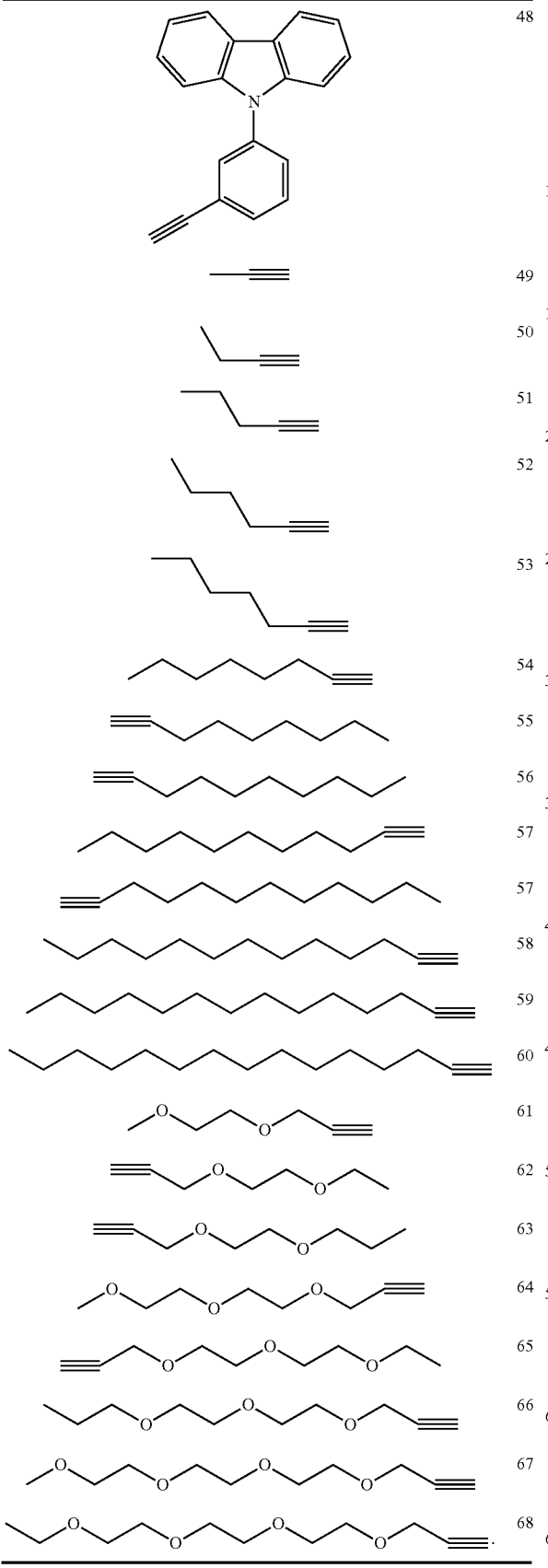

In a preferred embodiment, the conjugated polymer of the present disclosure may have the general Chemical Formula 5 below:

Chemical Formula 5

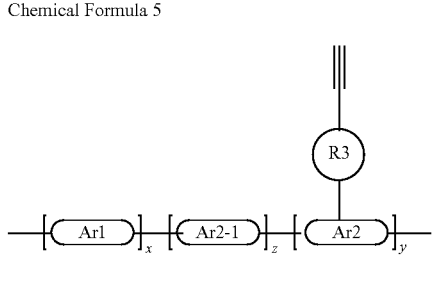

where x, y and z are mol % which are greater than 0 and x+y+z=1, and Ar2-1 has the same meaning as Ar2 described above.

In a more preferred embodiment, the conjugated polymer as described above is provided, wherein at least one of Ar1, Ar2 and Ar2-1 is selected as a hole-transport unit and at least one selected as an electron-transport unit.

Some of the more preferred combinations of non-limiting examples are:

1) Ar2-1 is selected as an electron-transport unit, Ar2 is selected as a hole-transport unit;

2) Ar1 is selected as a backbone structural unit having electron-transport property, Ar2-1 is selected as a hole-transport unit, and Ar2 is selected as a hole-transport unit, 3) Ar2-1 is selected as a light emitting unit (including singlet emitter and triplet emitter), and Ar2 is selected as a hole-transport unit;

4) Ar2-1 is selected as a hole-transport unit, Ar2 is selected as an electron-transport unit.

In some preferred embodiments, the crosslinking group may be present in an amount of not greater than 50 mol %, more preferably not greater than 40 mol %, more preferably not greater than 30 mol %, and most preferably not greater than 20 mol %.

Some non-limiting examples of repeating units containing crosslinking groups are:

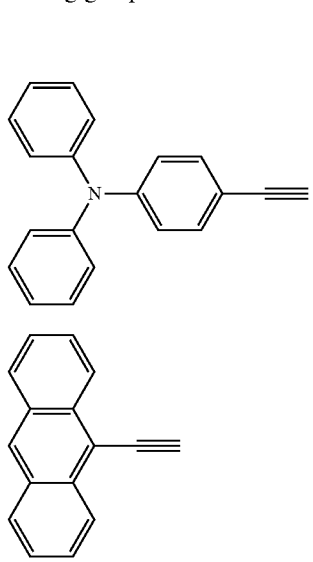

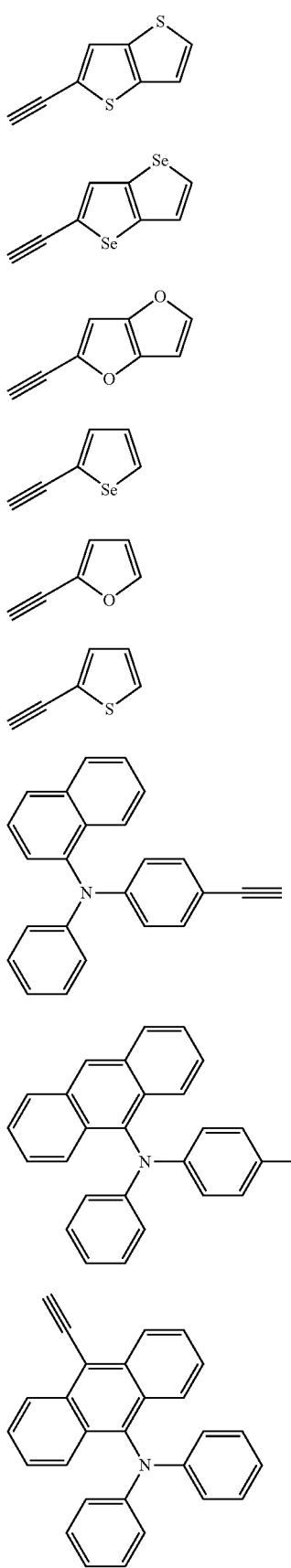
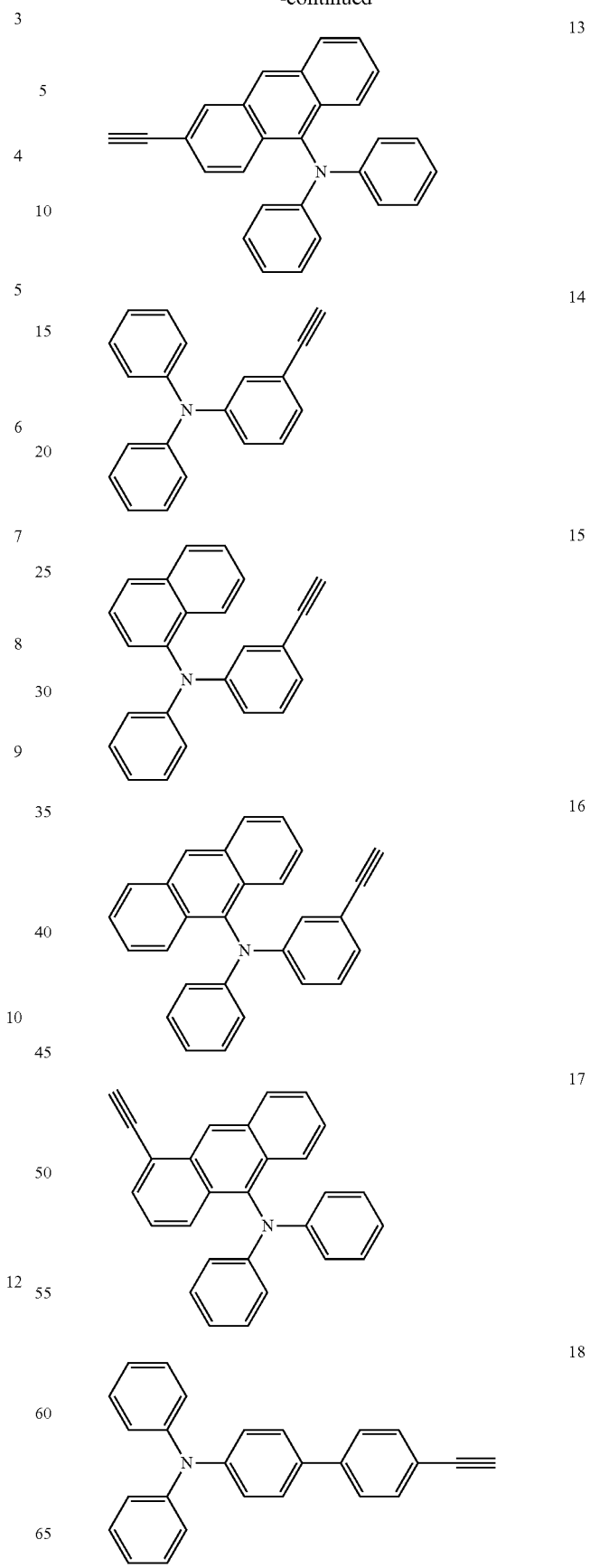

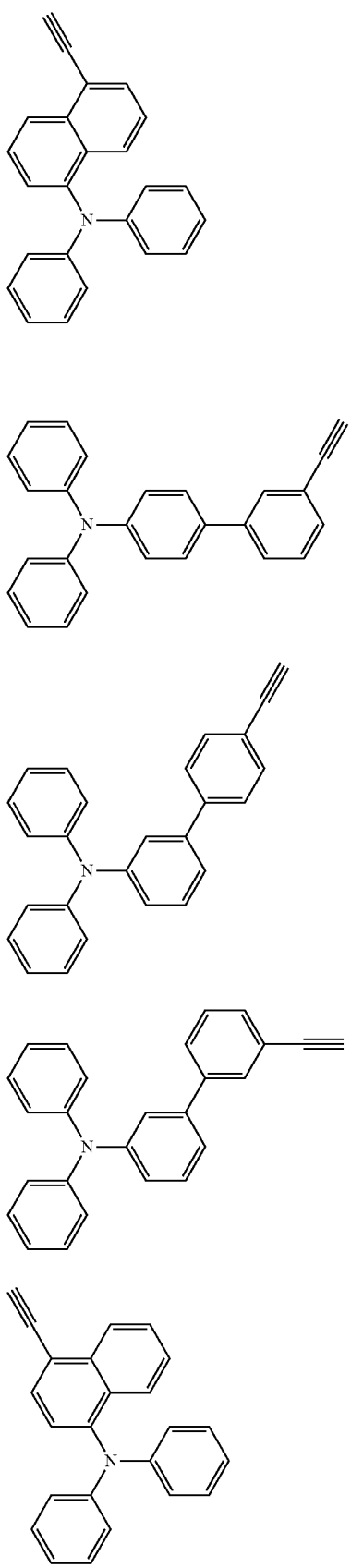
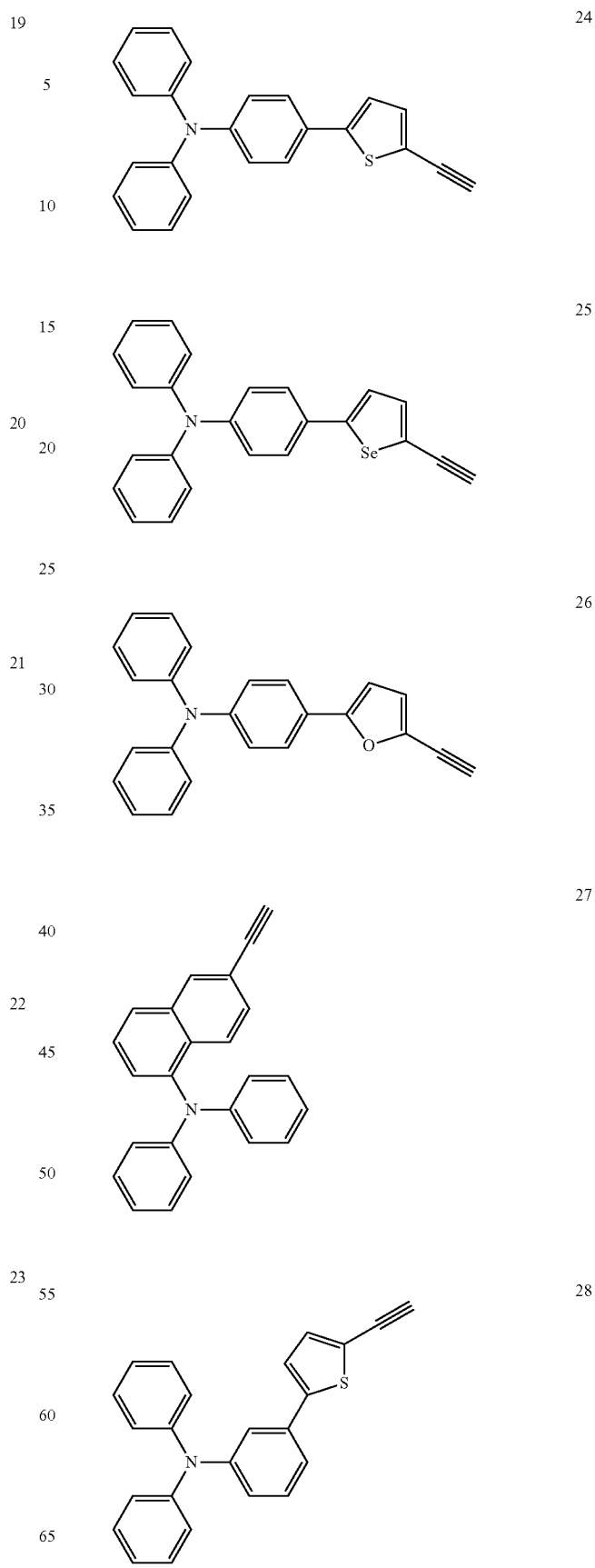

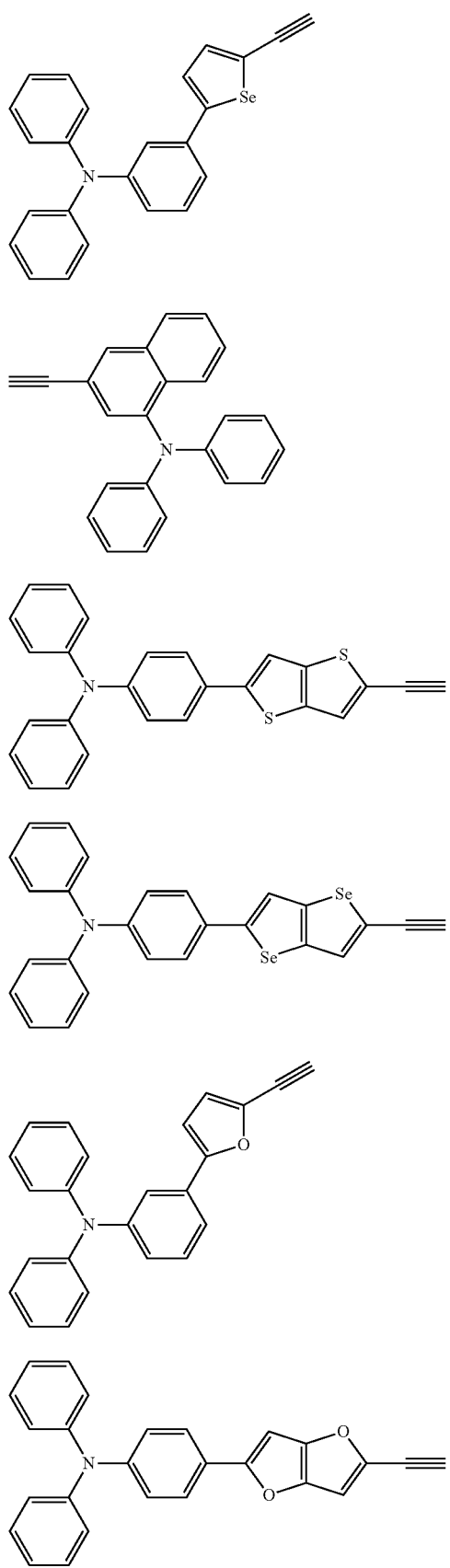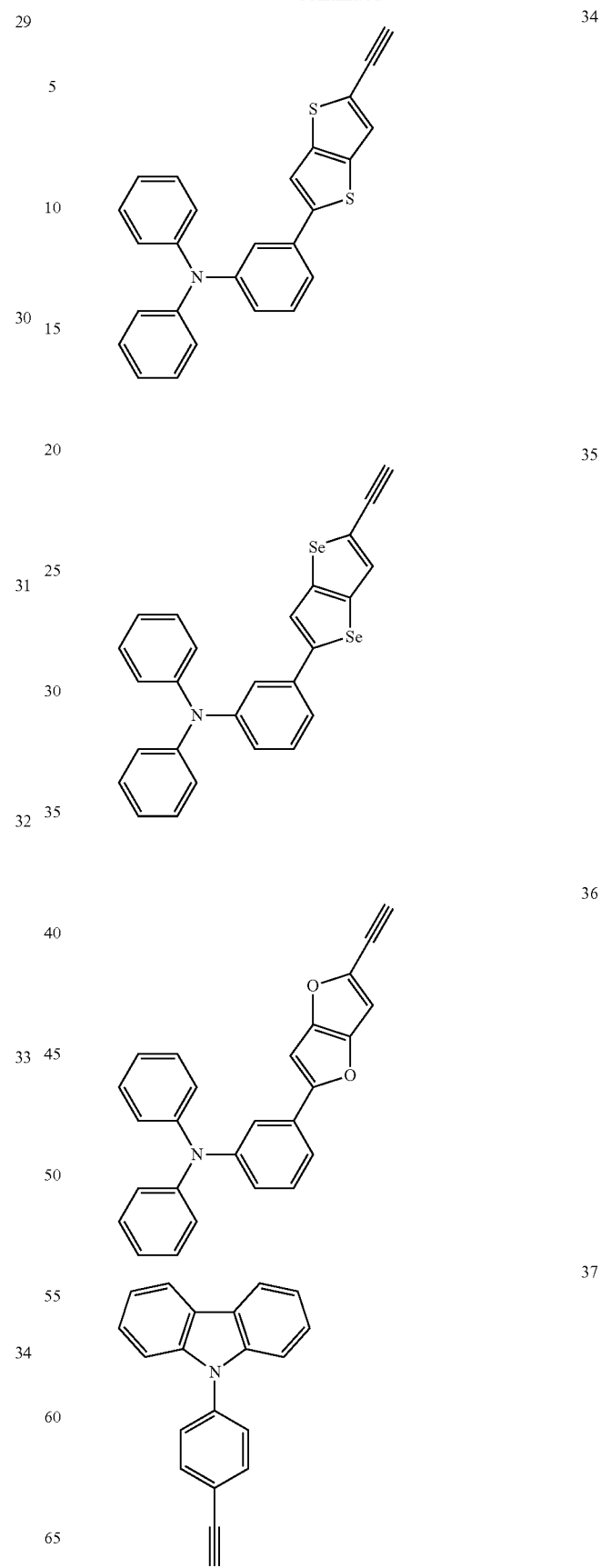

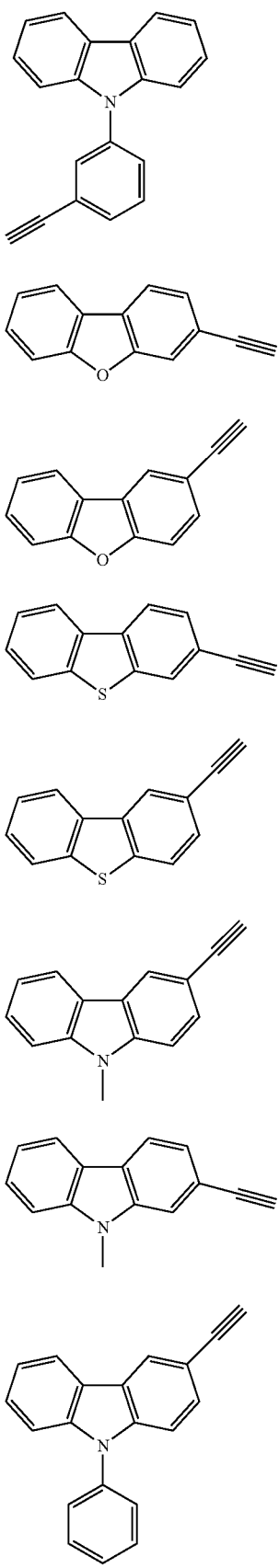
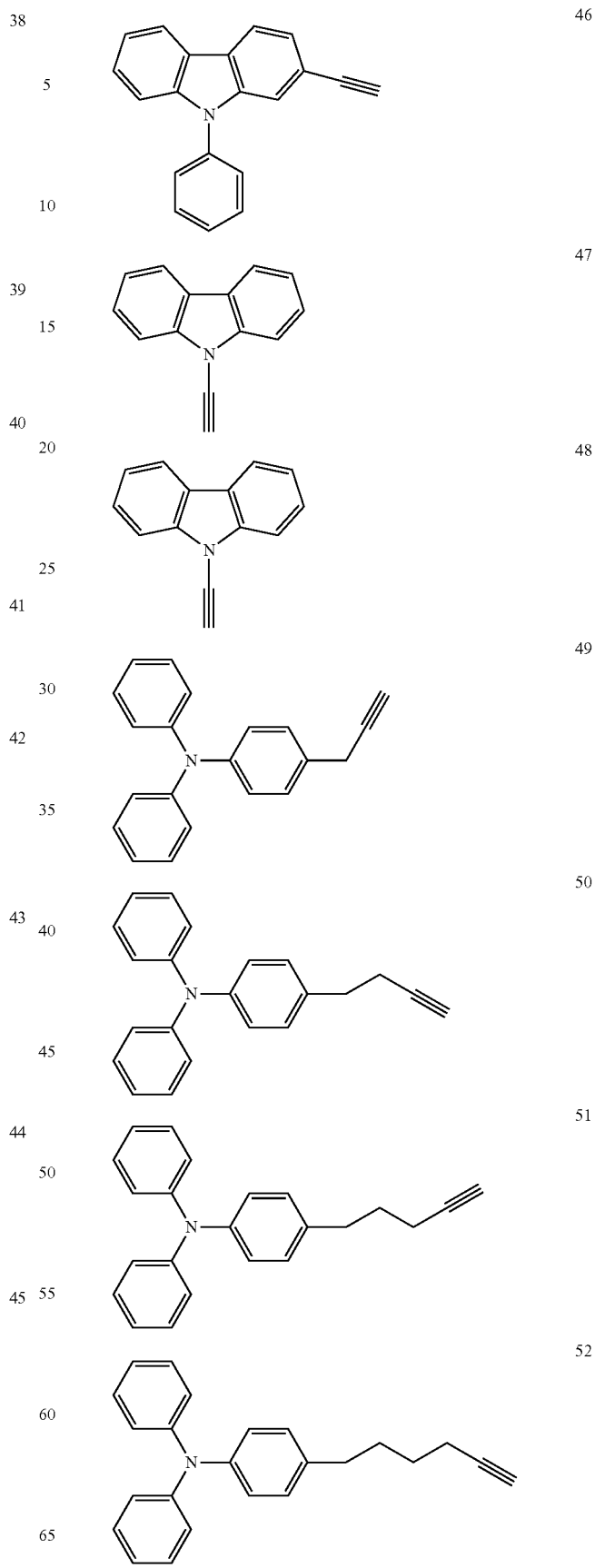

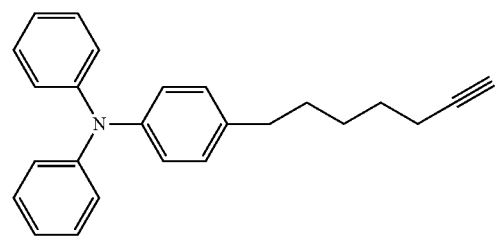

53

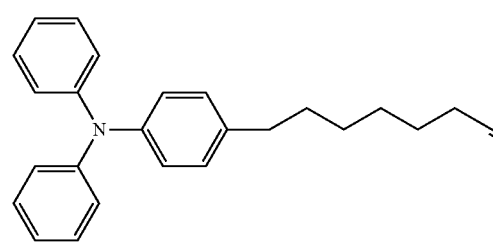

54

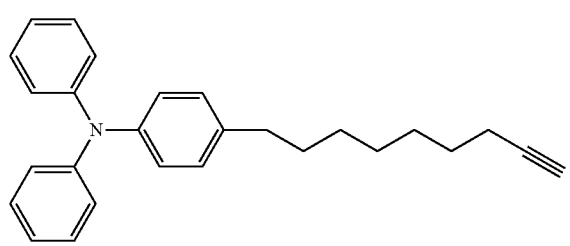

55

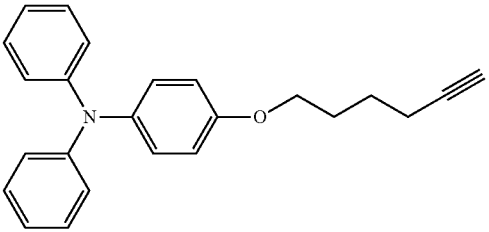

59

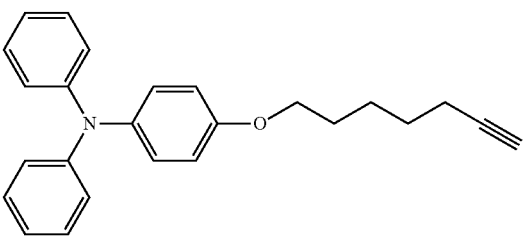

60

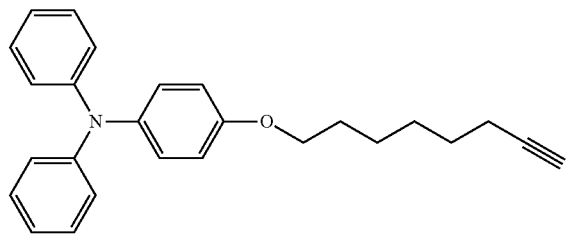

61

56

57

58

A general synthetic process of a conjugated polymer containing the ethynyl crosslinking group may be: first synthesizing a monomer with a functionalized ethynyl crosslinking group, and then producing the conjugated polymer containing the ethynyl crosslinking group using polymerization processes such as transition metal catalyzed coupling (Suzuki Polymerization, Heck Polymerization, Sonogashira Polymerization, Still Polymerization) and the Witting Reaction. The reaction duration, reaction temperature, monomer ratio, reaction pressure, solubility, amount of catalyst, ligand ratio, phase transfer catalyst, and other parameters may be manipulated to control the molecular weight and dispersion coefficient of the polymer. The synthesis route may be as follows:

A general synthetic process of a multi- (ternary or above) conjugated polymer containing ethynyl crosslinking group may be: first synthesizing a monomer with a functionalized ethynyl crosslinking group, and then producing the conjugated polymer containing the ethynyl crosslinking group with multiple species f monomers (three kinds or above) using polymerization processes such as transition metal catalyzed coupling (Suzuki Polymerization, Heck Polymerization, Sonogashira Polymerization, Still Polymerization) and the Witting Reaction. The reaction duration, reaction temperature, monomer ratio, reaction pressure, solubility, amount of catalyst, ligand ratio, phase transfer catalyst, and other parameters may be manipulated to control the molecular weight and dispersion coefficient of the polymer. The synthesis route may be as follows:

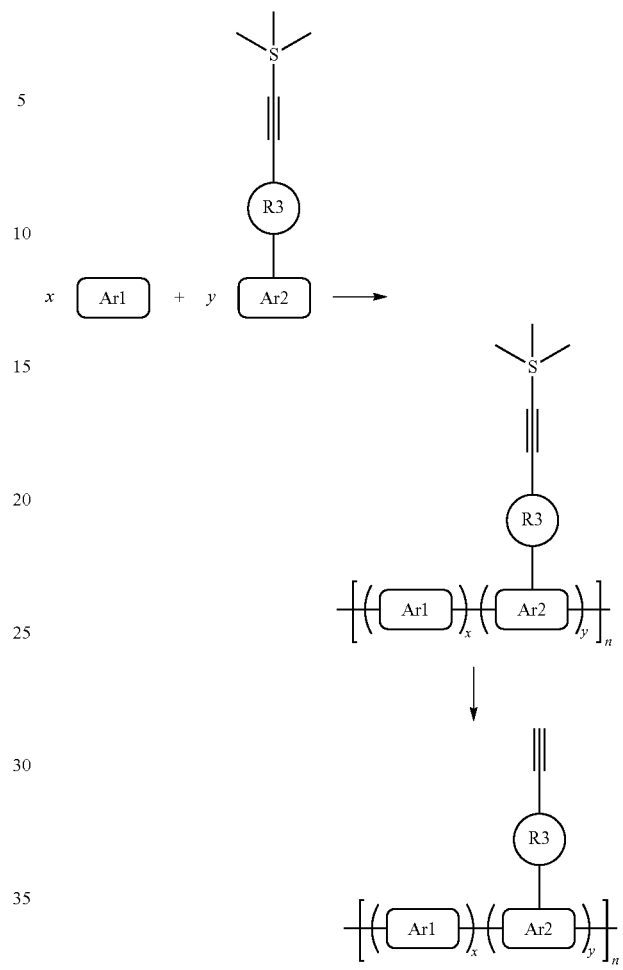

For some special polymer reaction, the ethynyl crosslinking group is sensitive to some of the specific chemical reagents, temperature and so on used in the polymer reaction process, which may initiate reaction of the ethynyl group. For example, if the temperature required for the polymerization reaction exceeds 180° C. or even higher than 280° C., or 380° C., the cross-linking groups of the conjugated polymer side chains are relatively active at high temperature and result in polymerization reaction of the ethynyl cross-linking groups to each other, generating an insoluble and infusible polymer with no solution processing characteristics. Therefore, under the special polymerization conditions, the terminal hydrogen atoms on the ethynyl crosslinking group may be first protected to reduce its chemical reactivity. The most common protecting group for the terminal hydrogen atom of the ethynyl crosslinking group may be trimethylsilyl (TMS). After formation of a trimeryl-containing polymer precursor, the polymer precursor may be treated with an alkali solution for some time to generate the targeted conjugated polymer, i.e., the conjugated polymer containing the ethynyl crosslinking group. The optimized conjugated polymer synthesis route is shown in the following figure:

The synthetic route of the conjugated organic monomer containing an ethynyl crosslinking group may be as shown below, but is not limited to the use of the following route to synthesize the target compound. The starting material A (commercial chemical reagents or synthesized via chemical processes) may be obtained by electrophilic optional substitutiion reaction (e.g., halogenation such as chlorination, bromination, iodination) to obtain compound B. And the compound B can react with trimethylsilyl acetylene in a Sonogashira coupling reaction catalyzed by Pd—Cu co-catalyst to yield compound C. The trimethylsilyl protective functional group may be removed from the compound C in an alkaline solution to produce the target compound D.

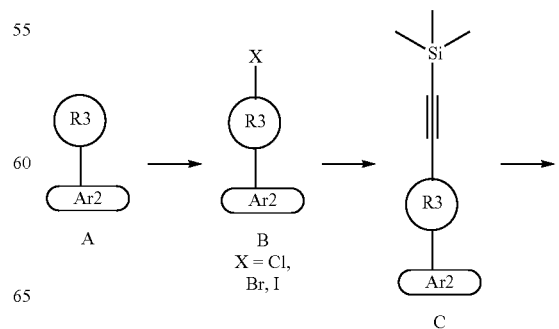

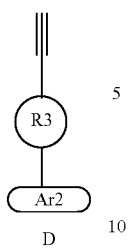

In order to facilitate understanding of the conjugated polymer containing an ethynyl crosslinking group according to the present disclosure, examples of the conjugated polymers containing an ethynyl crosslinking group are given below, but are not limited thereto. The conjugated polymers containing the ethynyl crosslinking group listed herein have a distinct feature that the ethynyl group is linked to the backbone of the conjugated polymer directly or linked by a chain of conjugated aryl ring or heterocyclic aryl ring.

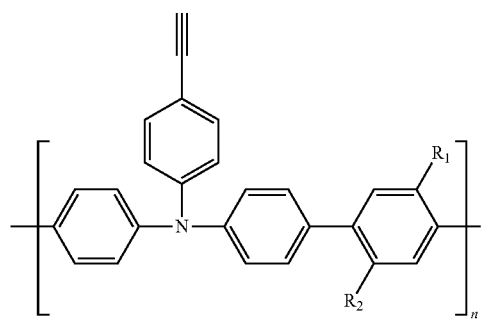

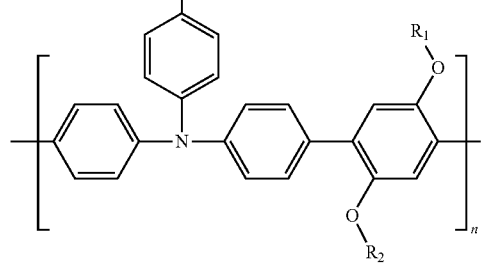

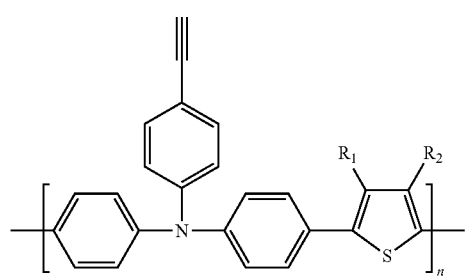

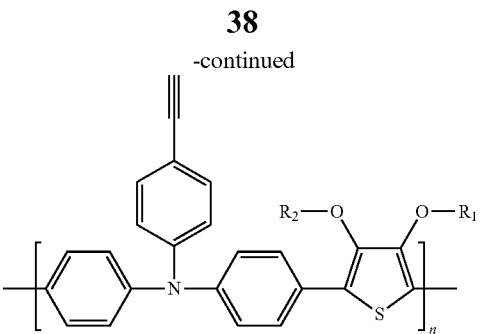

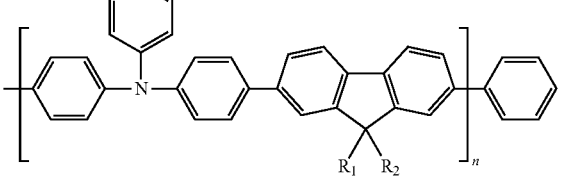

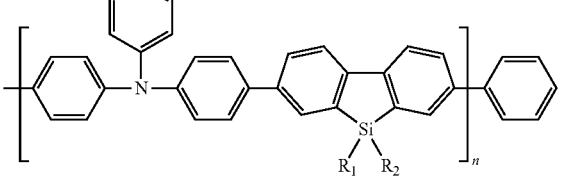

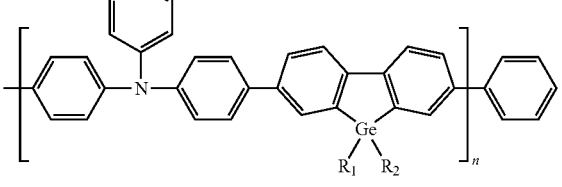

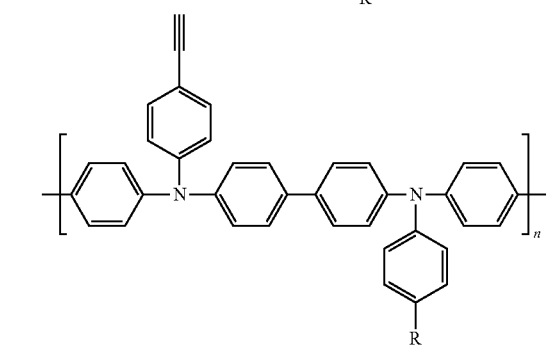

-continued
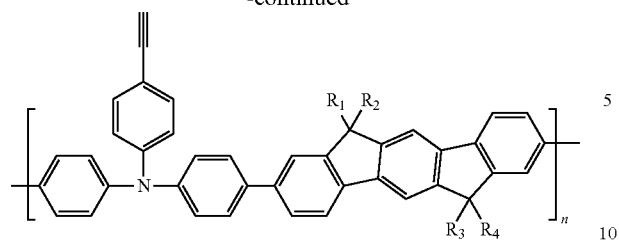
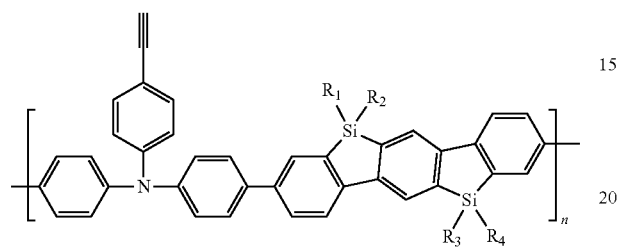
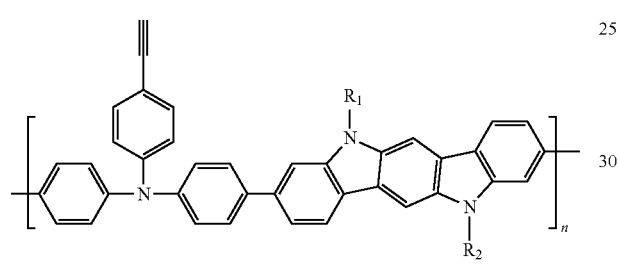
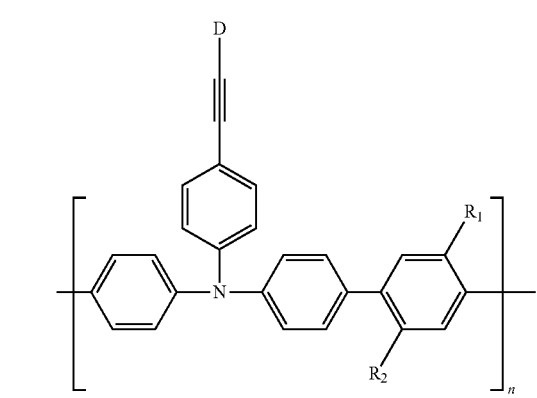
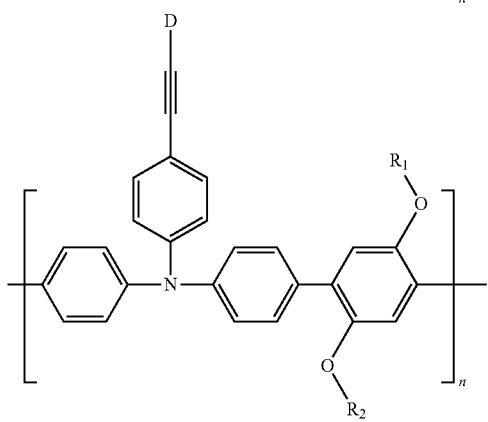
-continued
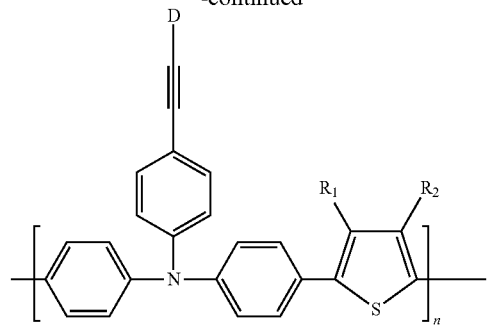
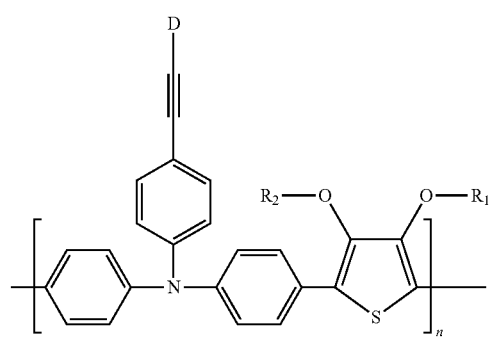
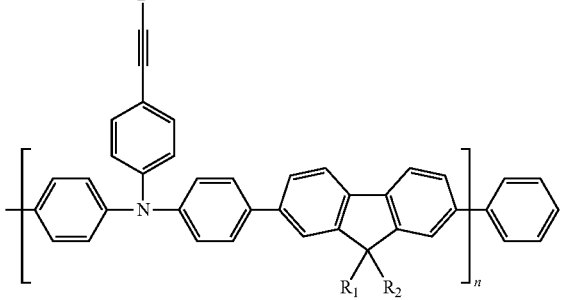
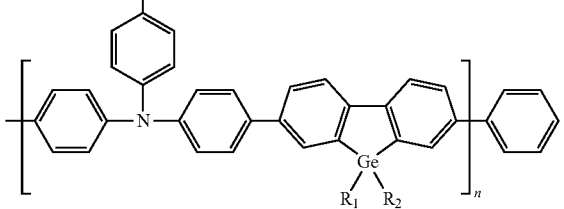

-continued

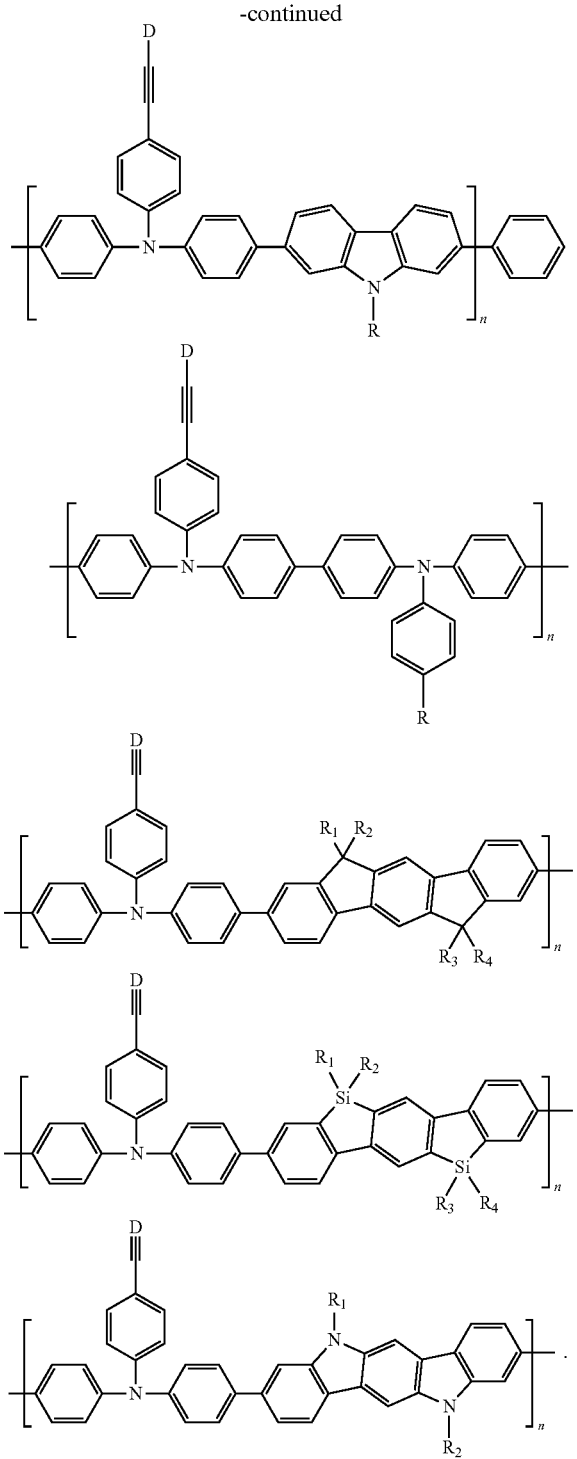

The present disclosure also provides a mixture which may comprise a polymer according to one aspect of the disclosure, and at least another organic functional material. The organic functional material may include hole (also referred to as electron hole) injecting or transport material (HIM/HTM), hole-blocking material (HBM), electron-injection or transport material (EIM/ETM), electron-blocking material (EBM), organic host material (Host), singlet emitter (fluorescent emitter), multiplet emitter (phosphorescent emitter), especially light-emitting organometallic complexes. Non-limiting examples of various organic functional materials are described, for example, in WO2010135519A1, US20090134784A1, and WO 2011110277A1. The organic functional material may be a small-molecule polymeric material. The following is a more detailed description the organic functional material (but not limited thereto).

1. HIM/HTM

HTM has been described earlier and will be further discussed below.

Suitable organic HIM/HTM materials for use in one aspect of the present disclosure may include any one of the compounds having the following structural units: phthalocyanines, porphyrins, amines, aryl amines, biphenyl triaryl amines, thiophenes, thiophenes such as dithiophenethiophene and thiophthene, pyrrole, aniline, carbazole, indenofluorene, and derivatives thereof. Other suitable HIMs also include: fluorocarbon-containing polymers; polymers comprising conductive dopants; conductive polymers such as PEDOT/PSS; self-assembled monomers such as compounds comprising phosphonic acid and sliane derivatives; metal oxides, such as MoOx; metal complex, and a crosslinking compound, or a combination thereof.

Other examples of metal complexes that may be used as HTM or HIM may include, but are not limited to, the general structure as follows:

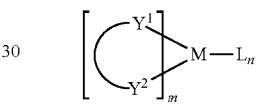

M may be metal having an atomic weight greater than 40; $(Y^1-Y^2)$ is a bidentate ligand, wherein $Y^1$ and $Y^2$ are independently selected from C, N, O, P, and S; L is an auxiliary ligand; m is an integer from 1 to the maximum coordination number of the metal; m+n is the maximum coordination number of the metal.

In one embodiment, $(Y^1-Y^2)$ may be a 2-phenylpyridine derivative.

In another embodiment, $(Y^1-Y^2)$ may be a carbene ligand.

In another embodiment, M may be selected from Ir, Pt, Os, and Zn.

In another aspect, the HOMO of the metal complex is greater than −5.5 eV (relative to the vacuum level).

2. EIM/ETM/HBM

ETM has been described earlier and will be further discussed below.

Examples of EIM/ETM material used in one aspect of the present disclosure are not particularly limited, and any metal complex or organic compound may be used as EIM/ETM as long as they can transfer electrons. Preferred organic EIM/ETM materials may be selected from the group consisting of tris (8-quinolinolato) aluminum (AlQ3), phenazine, phenanthroline, anthracene, phenanthrene, fluorene, bifluorene, spiro-bifluorene, phenylene-vinylene, triazine, triazole, imidazole, pyrene, perylene, trans-indenofluorene, cis-indenonfluorene, dibenzol-indenofluorene, indenonaphthalene, benzanthracene and their derivatives, or any combination thereof.

The hole-blocking layer (HBL) used in one aspect of the present disclosure is typically used to block holes from adjacent functional layers, particularly light-emitting layers. In contrast to a light-emitting device without a barrier layer, the presence of HBL usually leads to an increase in luminous efficiency. The hole-blocking material (HBM) of the hole-blocking layer (HBL) requires a lower HOMO than the adjacent functional layer, such as the light-emitting layer. In a preferred embodiment, the HBM has a greater energy level of excited state than the adjacent light-emitting layer, such as a singlet or triplet, depending on the emitter. In another preferred embodiment, the HBM has an electron-transport function. Typically, EIM/ETM materials with deep HOMO levels may be used as HBM.

On the other hand, examples of metal complexes that may be used as EIM/ETM may include, but are not limited to, the following general structure:

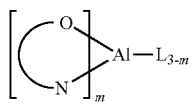 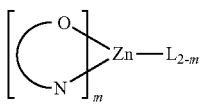

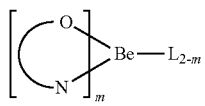 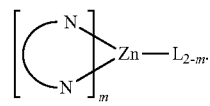

(O—N) or (N—N) is a bidentate ligand, wherein the metal coordinates with O, N, or N, N; L is an auxiliary ligand; and m is an integer whose value is from 1 to the maximum coordination number of the metal.

In another preferred embodiment, the organic alkali metal compound may be used as the EIM. In the present disclosure, the organic alkali metal compound may be understood as a compound having at least one alkali metal, i.e., lithium, sodium, potassium, rubidium, and cesium, and further comprising at least one organic ligand.

Non-limiting examples of suitable organic alkali metal compounds used in one aspect of the present disclosure may include the compounds described in U.S. Pat. No. 7,767,317 B2, EP 1941562B1 and EP 1144543B1.

The preferred organic alkali metal compound may be a compound of the following formula:

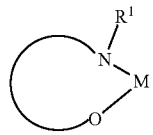

wherein $R^1$ has the same meaning as described above, and the arc represents two or three atoms and the bond to form a 5- or 6-membered ring with metal M when necessary, while the atoms may be optionally substituted with one or more $R^1$; and wherein M is an alkali metal selected from lithium, sodium, potassium, rubidium, and cesium.

The organic alkali metal compound may be in the form of a monomer, as described above, or in the form of an aggregate, for example, two alkali metal ions with two ligands, 4 alkali metal ions and 4 ligands, 6 alkali metal ions and 6 ligand, or in other forms.

The preferred organic alkali metal compound may be a compound of the following formula:

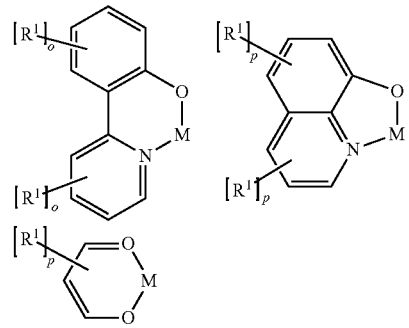

wherein, the symbols used are as defined above, and in addition:

o, each time it may be the same or different, selected from 0, 1, 2, 3 or 4; and p, each time it may be the same or different, selected from 0, 1, 2 or 3.

In a preferred embodiment, the alkali metal M is selected from the group consisting of lithium, sodium, potassium, more preferably lithium or sodium, and most preferably lithium.

In a preferred embodiment, the organic alkali metal compound is used in the electron-injection layer, and more preferably the electron-injection layer consists of the organic alkali metal compound.

In another preferred embodiment, the organic alkali metal compound is doped into other ETMs to form an electron-transport layer or an electron-injection layer, more preferably an electron-transport layer.

Non-limiting examples of a suitable organic alkali metal compound are listed in the following table:

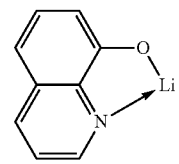

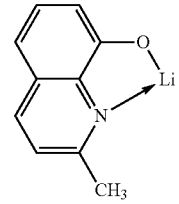

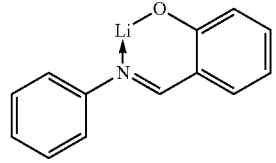

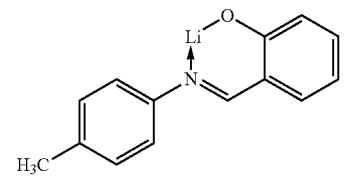

-continued
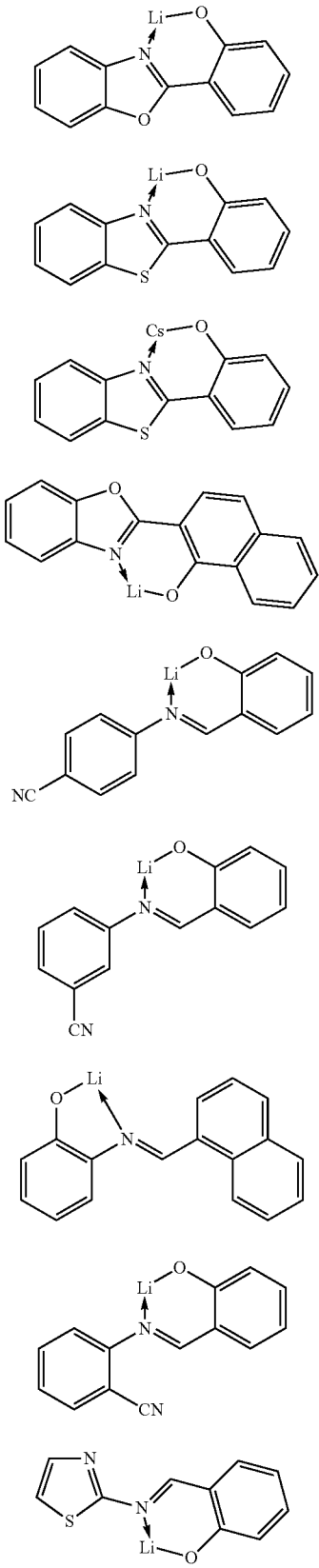
-continued
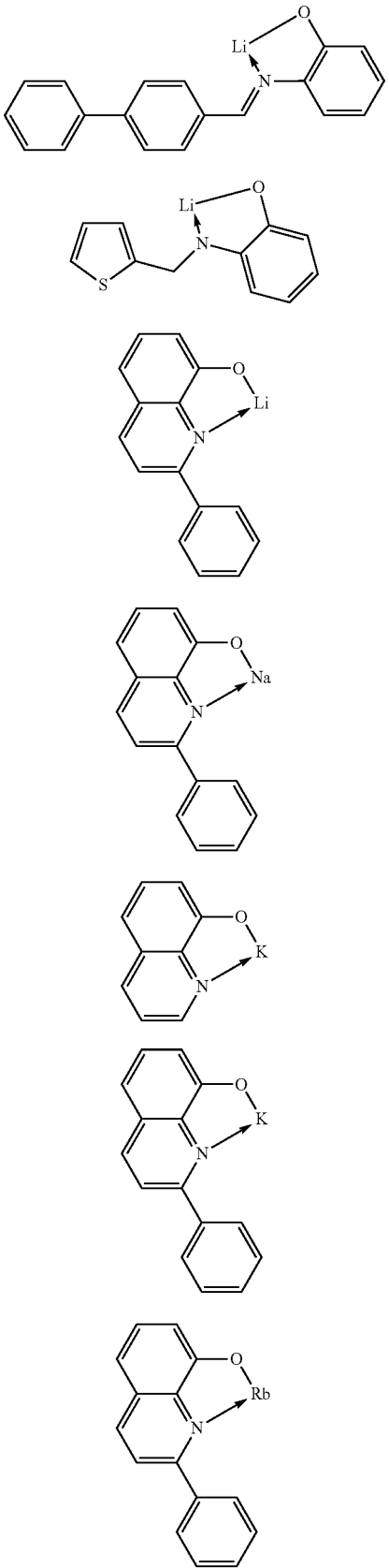

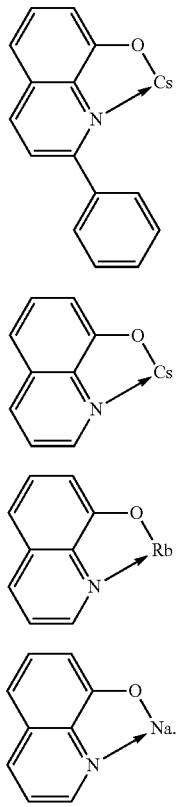

3. Triplet Host Materials:

Examples of a triplet host material used in one aspect of the present disclosure are not particularly limited and any metal complex or organic compound may be used as the host material as long as its triplet energy is greater than that of the light emitter, especially a triplet emitter or phosphorescent emitter.

Examples of metal complexes that may be used as triplet hosts may include, but are not limited to, the general structure as follows:

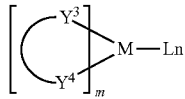

wherein M may be a metal; ($Y^3$-$Y^4$) may be a bidentate ligand, $Y^3$ and $Y^4$ may be independently selected from C, N, O, P, and S; L may be an auxiliary ligand; m may be an integer with the value from 1 to the maximum coordination number of the metal; and, m+n is the maximum number of coordination of the metal.

In a preferred embodiment, the metal complex which may be used as the triplet host has the following form:

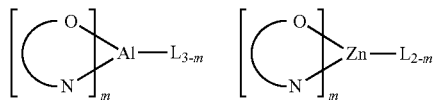

(O—N) may be a bidentate ligand in which the metal is coordinated to O and N atoms.

In one embodiment, M may be selected from Ir and Pt.

Non-limiting examples of organic compounds that may be used as triplet host are selected from: compounds containing cyclic aryl groups, such as benzene, biphenyl, triphenyl, benzo, and fluorene; compounds containing heterocyclic aryl groups, such as triphenylamine, dibenzothiophene, dibenzofuran, dibenzoselenophen, furan, thiophene, benzofuran, benzothiophene, benzoselenophene, carbazole, indolocarbazole, indolopyridine, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, or a combination thereof; and groups containing 2 to 10 ring structures, which may be the same or different types of cyclic aryl or heterocyclic aryl and are linked to each other directly or by at least one of the following groups, such as oxygen atom, nitrogen atom, sulfur atom, silicon atom, phosphorus atom, boron atom, chain structure unit, and aliphatic ring, wherein each Ar may be further optionally substituted and the substituents may be any one of hydrogen, alkyl, alkoxy, amino, alkene, alkyne, aralkyl, heteroalkyl, aryl and heteroaryl, or a combination thereof.

In a preferred embodiment, the triplet host material may be selected from compounds comprising at least one of the following groups:

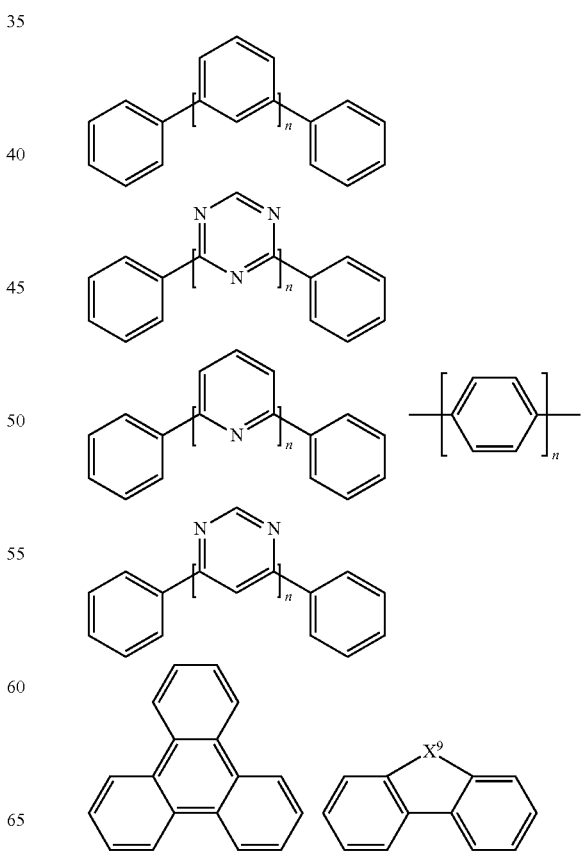

-continued

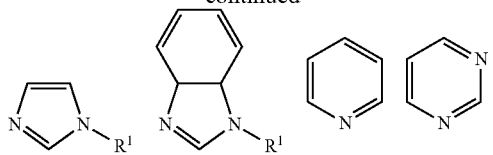
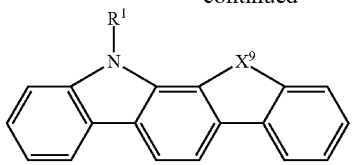
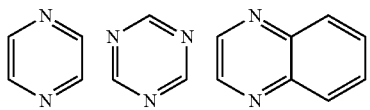
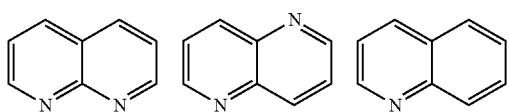
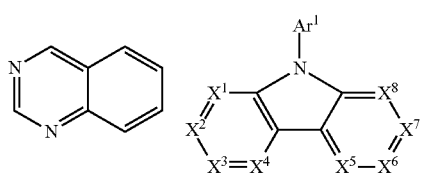
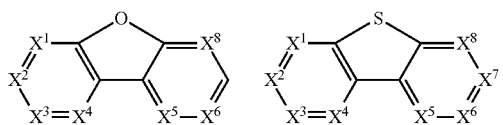
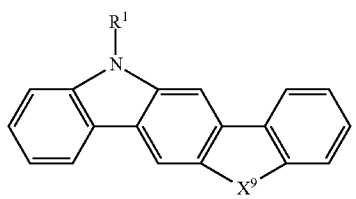

-continued

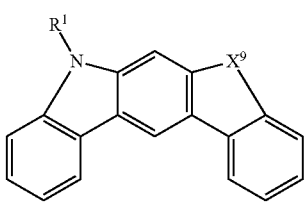
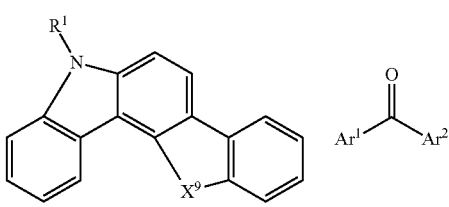
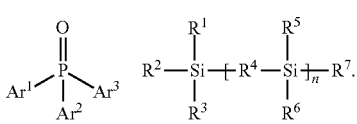

$R^1$-$R^7$ may be independently selected from the group consisting of hydrogen, alkyl, alkoxy, amino, alkene, alkyne, aralkyl, heteroalkyl, aryl and heteroaryl, which may have the same meaning as $Ar^1$ and $Ar^2$ described above when they are aryl or heteroaryl; n may be an integer from 0 to 20; $X^1$-$X^8$ may be selected from CH or N; and $X^9$ may be selected from $CR^1R^2$ or $NR^1$.

Non-limiting examples of suitable triplet host material are listed in the following table:

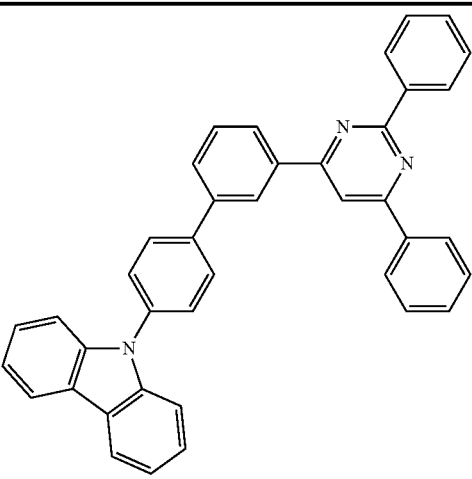

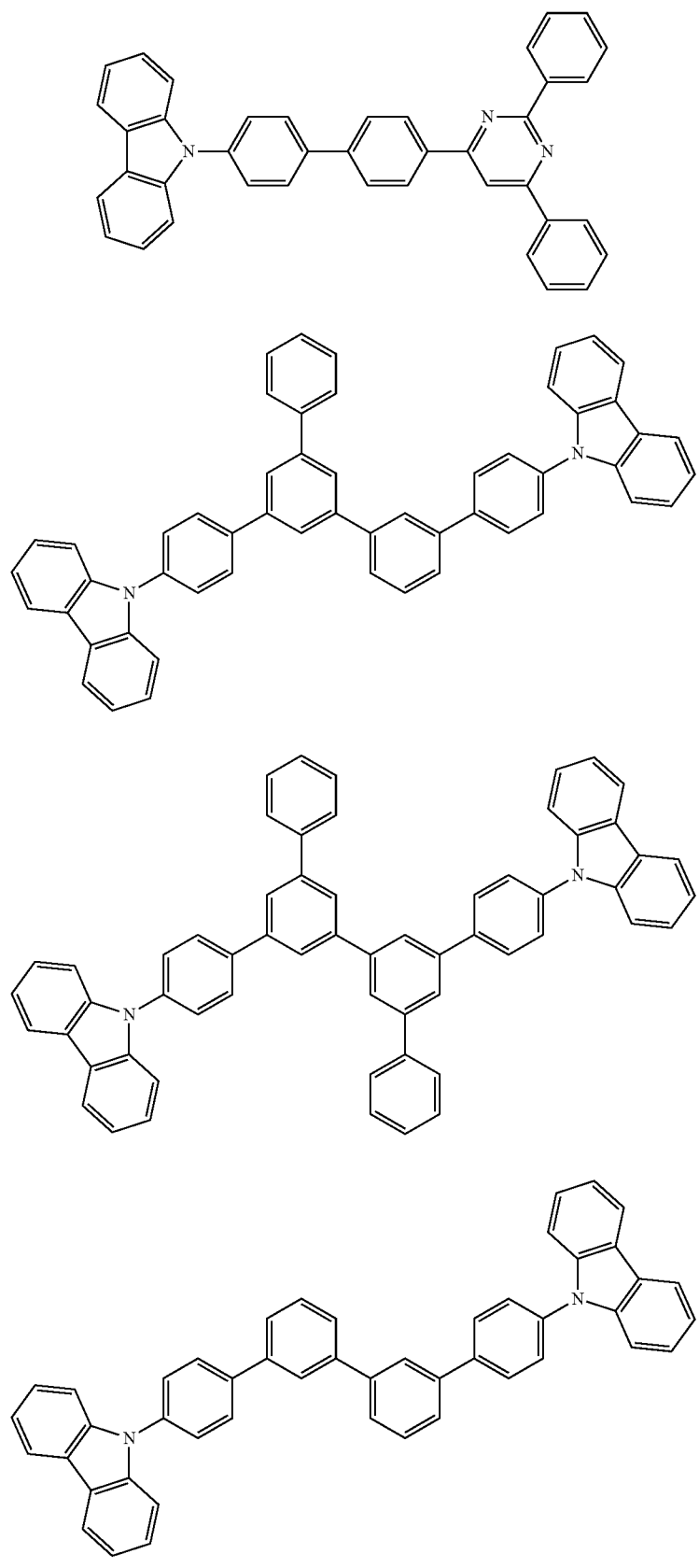

4. Singlet Host Material:

Examples of singlet host material used in one aspect of the present disclosure are not particularly limited and any organic compound may be used as the host as long as its singlet state energy is greater than that of the light emitter, especially the singlet emitter or fluorescent light emitter.

Non-limiting examples of organic compounds used as singlet host materials may be selected from: cyclic aryl compounds, such as benzene, biphenyl, triphenyl, benzo, naphthalene, anthracene, phenalene, phenanthrene, fluorene, pyrene, chrysene, perylene, azulene; heterocyclic aryl compounds, such as triphenylamine, dibenzothiophene, dibenzofuran, dibenzoselenophen, furan, thiophene, benzofuran, benzothiophene, benzoselenophene, carbazole, indolocarbazole, indolopyridine, pyrrolodipyridine, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and groups comprising 2 to 10 ring structures, which may be the same or different types of cyclic aryl or heterocyclic aryl and are linked to each other directly or by at least one of the following groups, such as oxygen atom, nitrogen atom, sulfur atom, silicon atom, phosphorus atom, boron atom, chain structure unit, and aliphatic rings.

In a preferred embodiment, the monomorphic host material may be selected from compounds comprising at least one of the following groups:

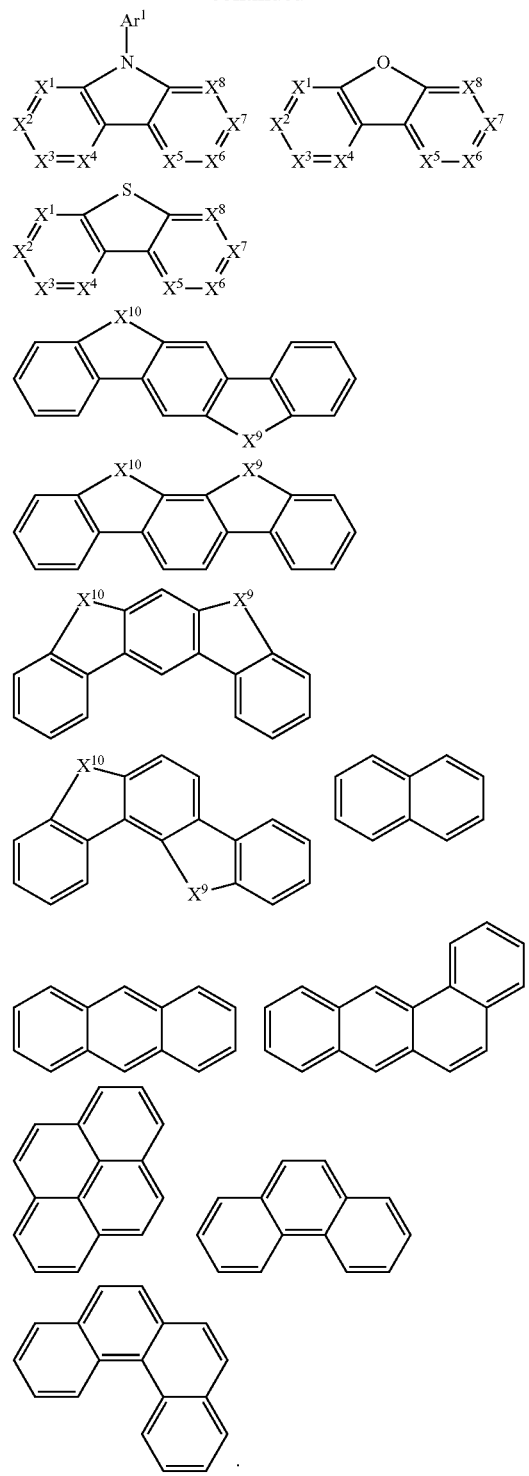

$R^1$ may be independently selected from the group consisting of hydrogen, alkyl, alkoxy, amino, alkene, alkyne, aralkyl, heteroalkyl, aryl and heteroaryl; $Ar^1$ is aryl or heteroaryl and has the same meaning as $Ar^1$ defined in the HTM above; n is an integer from 0 to 20; $X^1$-$X^8$ is selected from CH or N; $X^9$ and $X^{10}$ are selected from $CR^1R^2$ or $NR^1$.

Non-limiting examples of a suitable singlet host material are listed in the following table:

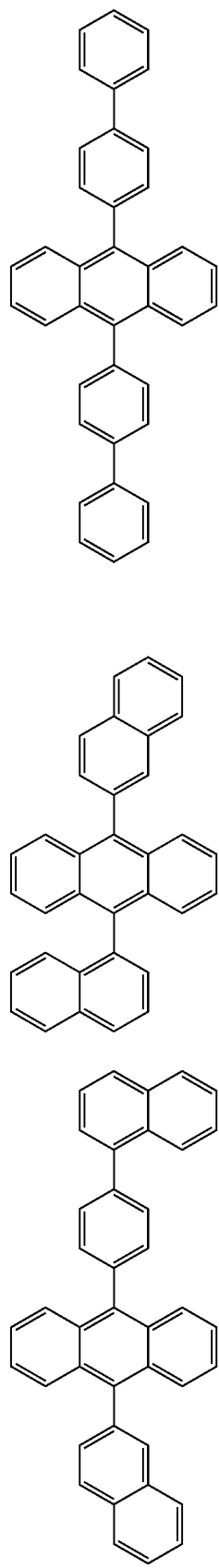

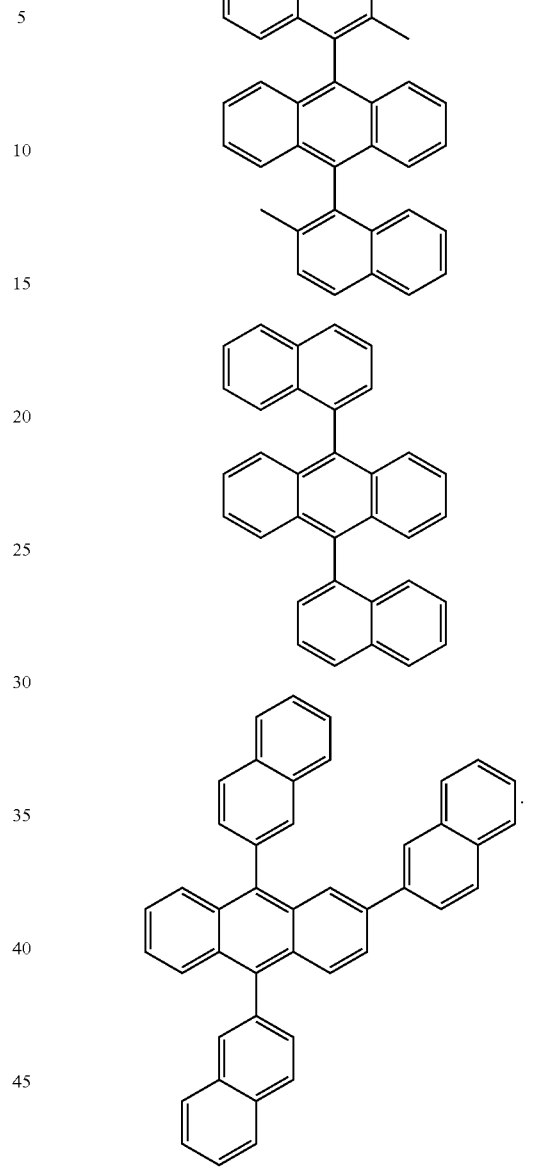

5. Hole-Blocking Material (HBM)

The hole-blocking layer (HBL) used in one aspect of the present disclosure is typically used to block holes from adjacent functional layers, particularly light-emitting layers. In contrast to a light-emitting device without a barrier layer, the presence of HBL usually leads to an increase in luminous efficiency. The hole-blocking material (HBM) of the hole-blocking layer (HBL) requires a lower HOMO than the adjacent functional layer, such as the light-emitting layer. In a preferred embodiment, the HBM has a greater energy level of excited state than the adjacent light-emitting layer, such as a singlet or triplet, depending on the emitter. In another preferred embodiment, the HBM has an electron-transport function.

In one embodiment, the HBM used comprises the same molecules as the host material in the light-emitting layer.

In another preferred embodiment, the HBM may be selected from compounds comprising at least one of the following groups:

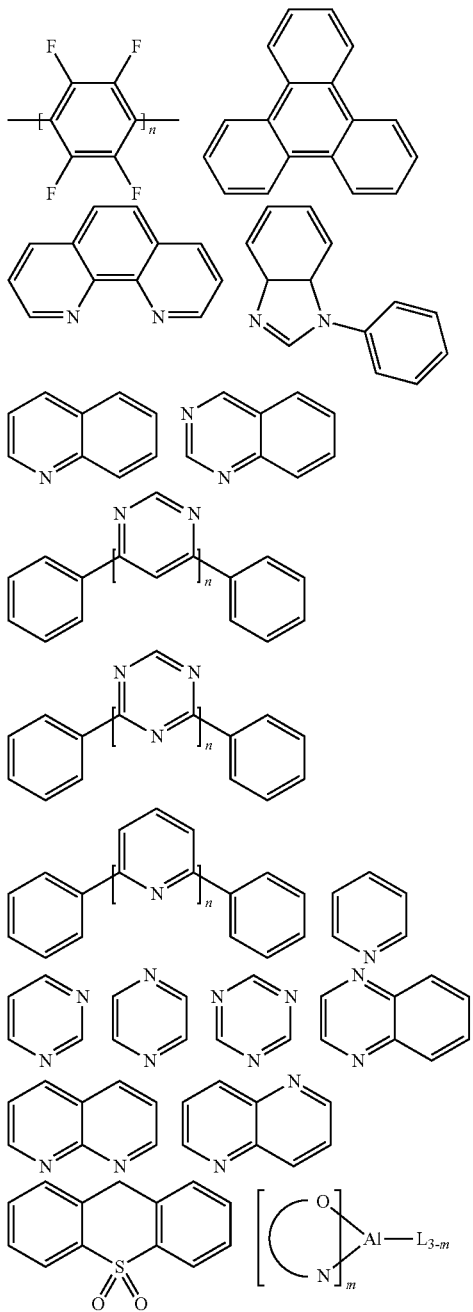

wherein n may be an integer from 0 to 20; L may be an auxiliary ligand; and m may be an integer from 1 to 3.

6. Singlet Emitter

The singlet emitter used in one aspect of the present disclosure tends to have a longer conjugate π-electron system. To date, there have been many examples, such as, but not limited to, any one of styrylamine and its derivatives or combinations thereof, and any one of indenofluorene and its derivatives or combinations thereof.

In a preferred embodiment, the singlet emitter may be selected from the group consisting of monostyrylamines, distyrylamines, tristyrylamines, tetrastyrylamines, styrylphosphines, styryl ethers, and arylamines, or combinations thereof.

Mono styrylamine refers to a compound which comprises an unsubstituted or optionally substituted styryl group and at least one amine, most preferably an aryl amine. Distyrylamine refers to a compound comprising two unsubstituted or optionally substituted styryl groups and at least one amine, most preferably an aryl amine. Ternarystyrylamine refers to a compound which comprises three unsubstituted or optionally substituted styryl groups and at least one amine, most preferably an aryl amine. Quaternarystyrylamine refers to a compound comprising four unsubstituted or optionally substituted styryl groups and at least one amine, most preferably an aryl amine. Preferred styrene is stilbene, which may be further optionally substituted. The corresponding phosphines and ethers are defined similarly to amines. Aryl amine or aromatic amine refers to a compound comprising three unsubstituted or optionally substituted cyclic or heterocyclic aryl systems directly attached to nitrogen. At least one of these cyclic or heterocyclic aryl systems is preferably selected from fused ring systems and most preferably has at least 14 aryl ring atoms. Among the preferred examples are aryl anthramine, aryl anthradiamine, aryl pyrene amines, aryl pyrene diamines, aryl chrysene amines and aryl chrysene diamine. Aryl anthramine refers to a compound in which a diarylamino group is directly attached to anthracene, most preferably at position 9. Aryl anthradiamine refers to a compound in which two diarylamino groups are directly attached to anthracene, most preferably at positions 9, 10. Aryl pyrene amines, aryl pyrene diamines, aryl chrysene amines and aryl chrysene diamine are similarly defined, wherein the diarylarylamino group is most preferably attached to position 1 or 1 and 6 of pyrene.

Non-limiting examples of singlet emitter based on vinylamine and arylamine are also preferred examples which may be found in the following patent documents: WO 2006/000388, WO 2006/058737, WO 2006/000389, WO 2007/065549, WO 2007/115610, U.S. Pat. No. 7,250,532 B2, DE 102005058557 A1, CN 1583691 A, JP 08053397 A, U.S. Pat. No. 6,251,531 B1, US 2006/210830 A, EP 1957606 A1, and US 2008/0113101 A1.

Non-limiting examples of singlet light emitters based on distyrylbenzene and its derivatives may be found in, for example, U.S. Pat. No. 5,121,029.

Further preferred singlet emitters may be selected from the group consisting of: indenofluorene-amine, indenofluorene-diamine, benzoindenofluorene-amine, benzoindenofluorene-diamine, dibenzoindenofluorene-amine, and dibenzoindenofluorene-diamine.

Other materials useful as singlet emissors include, but are not limited to, polycyclic aryl compounds, especially any one selected from the derivatives of the following compounds: anthracenes such as 9,10-di-naphthylanthracene, naphthalene, tetraphenyl, phenanthrene, perylene such as 2,5,8,11-tetra-t-butylatedylene, indenoperylene, phenylenes such as 4,4'-(bis (9-ethyl-3-carbazovinylene)-1,1'-biphenyl, periflanthene, decacyclene, coronene, fluorene, spirobifluorene, arylpyren (e.g., US 20060222886), arylenevinylene (e.g., U.S. Pat. Nos. 5,121,029, 5,130,603), cyclopentadiene such as tetraphenylcyclopentadiene, rubrene, coumarine, rhodamine, quinacridone, pyrane such as 4 (dicyanoethylene)-6-(4-dimethylaminostyryl-2-methyl)-4H-pyrane (DCM), thiapyran, bis (azinyl) imine-boron compounds (US 2007/0092753 A1), bis (azinyl) methene compounds, carbostyryl compounds, oxazone, benzoxazole, benzothiazole, benzimidazole, and diketopyrrolopyrrole, or combinations thereof. Non-limiting examples of some singlet emitter material may be found in the following patent documents: US 20070252517 A1, U.S. Pat. Nos. 4,769,292, 6,020,078, US 2007/0252517 A1, and US 2007/0252517 A1.

Non-limiting examples of suitable singlet emitters are listed in the following table:

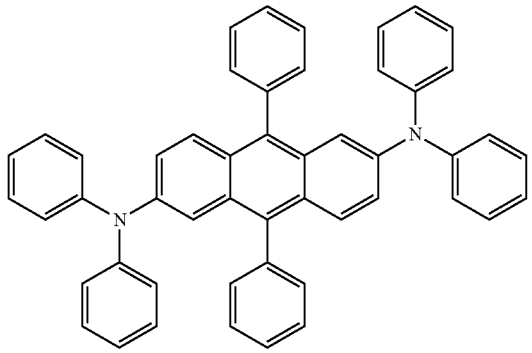 [SMILES: c1ccc(-c2c3ccc(N(c4ccccc4)c4ccccc4)cc3c(-c3ccccc3)c3ccc(N(c4ccccc4)c4ccccc4)cc23)cc1]

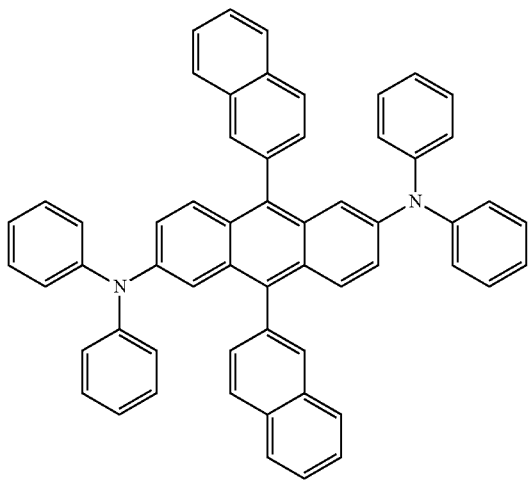 [SMILES: c1ccc(N(c2ccccc2)c2ccc3c(-c4ccc5ccccc5c4)c4cc(N(c5ccccc5)c5ccccc5)ccc4c(-c4ccc5ccccc5c4)c3c2)cc1]

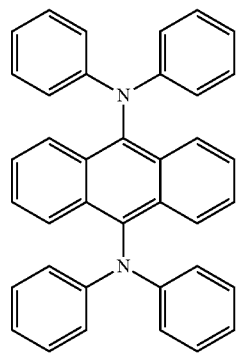 [SMILES: c1ccc(N(c2ccccc2)c2c3ccccc3c(N(c3ccccc3)c3ccccc3)c3ccccc23)cc1]

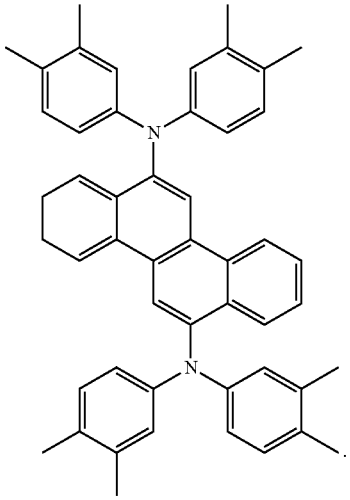

7. Triplet Emitter

The triplet emitter used in one aspect of the present disclosure is also called a phosphorescent emitter. In a preferred embodiment, the triplet emitter may be a metal complex of the general formula M (L) n, wherein M may be a metal atom; L may be a same or different ligand each time it is present, and may be bonded or coordinated to the metal atom M at one or more positions; n may be an integer greater than 1, preferably 1, 2, 3, 4, 5 or 6. Alternatively, these metal complexes may be attached to a polymer by one or more positions, most preferably through an organic ligand.

In a preferred embodiment, the metal atom M may be selected from the group consisting of transition metal elements or lanthanides or actinides, preferably Ir, Pt, Pd, Au, Rh, Ru, Os, Sm, Eu, Gd, Tb, Dy, Re, Cu or Ag, and particularly preferably Os, Ir, Ru, Rh, Re, Pd, or Pt.

Preferably, the triplet emitter comprises a chelating ligand, i.e., a ligand, coordinated to the metal by at least two bonding sites, and it is particularly preferred that the triplet emitter comprises two or three identical or different bidentate or multidentate ligand. Chelating ligands help to improve stability of metal complexes.

Non-limiting examples of organic ligands may be selected from the group consisting of phenylpyridine derivatives, 7,8-benzoquinoline derivatives, 2 (2-thienyl) pyridine derivatives, 2 (1-naphthyl) pyridine derivatives, or 2 phenylquinoline derivatives. All of these organic ligands may be optionally substituted, for example, optionally substituted with fluoromethyl or trifluoromethyl. The auxiliary ligand may be preferably selected from acetylacetonate or picric acid.

In a preferred embodiment, the metal complex which may be used as the triplet emitter may have the following form:

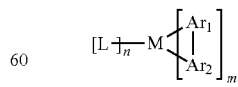

wherein M is a metal selected from the group consisting of transition metal elements or lanthanides or actinides;

$Ar^1$ may be the same or different cyclic group each time it is present, which comprises at least one donor atom, that is, an atom with a lone pair of electrons, such as nitrogen atom or phosphorus atom, which is coordinated to the metal through its ring group; Ar² may be the same or different cyclic group comprising at least one C atom and is coordinated to the metal through its ring group; Ar¹ and Ar² are covalently bonded together, wherein each of them may carry one or more substituents which may also be joined together by substituents; L may be the same or different at each occurrence and is an auxiliary ligand, preferably a bidentate chelating ligand, and most preferably a monoanionic bidentate chelating ligand; m is 1, 2 or 3, preferably 2 or 3, and particularly preferably 3; and, N is 0, 1, or 2, preferably 0 or 1, particularly preferably 0.

Non-limiting examples of triplet emitter materials that are extremely useful may be found in the following patent documents and references: WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, WO 2009118087A1.

Non-limiting examples of suitable triplet emitter are given in the following table:

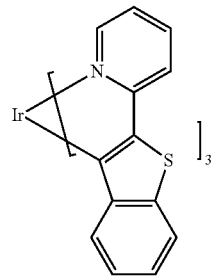

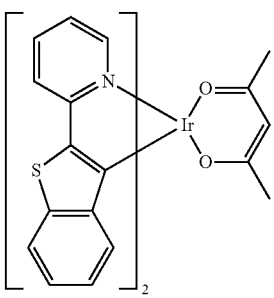

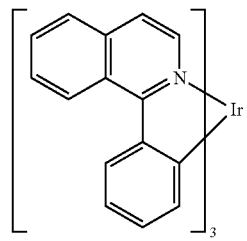

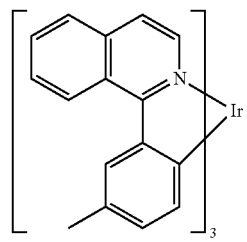

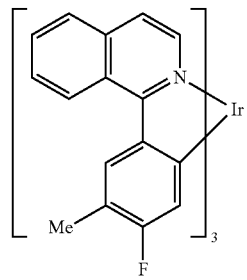

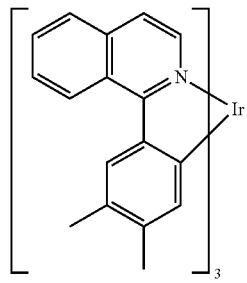

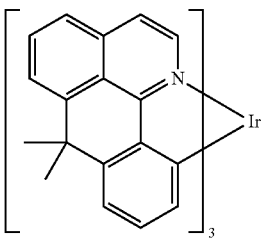

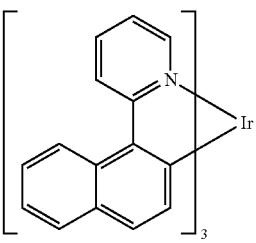

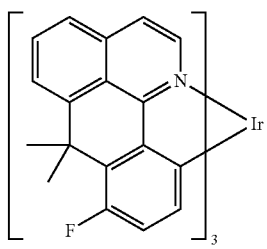
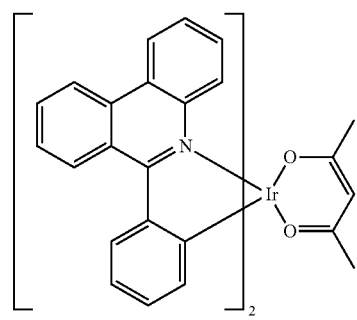
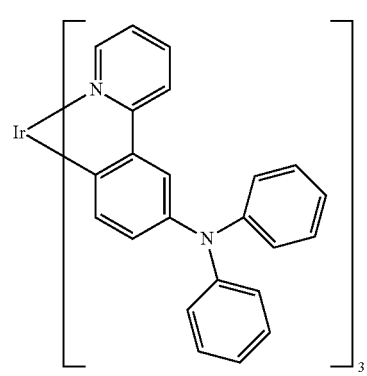
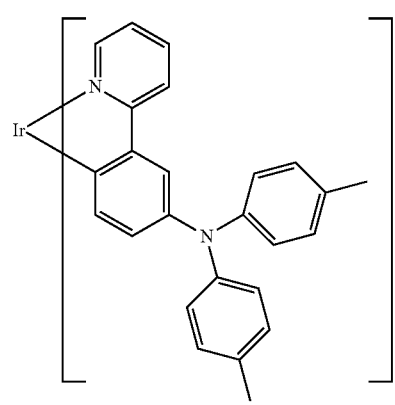
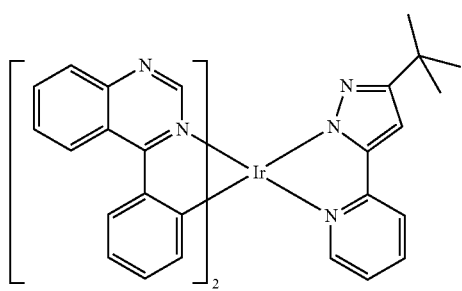
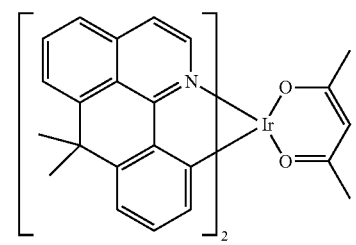
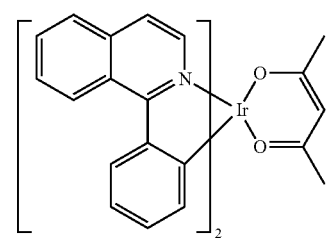
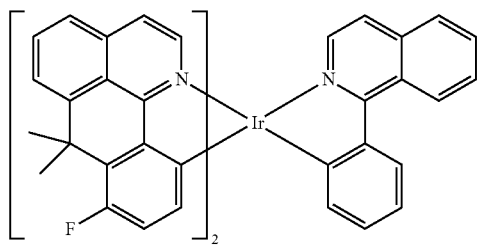
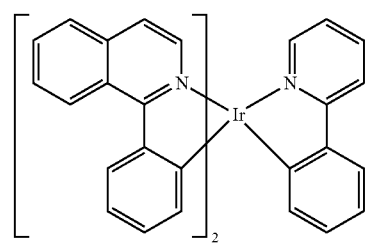
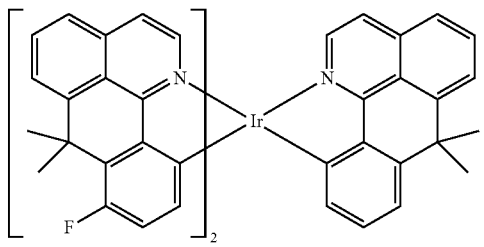

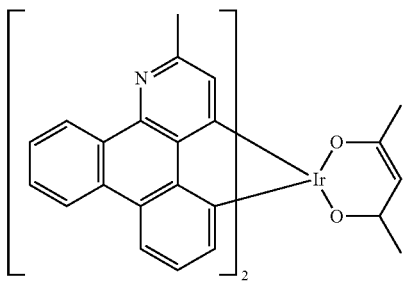
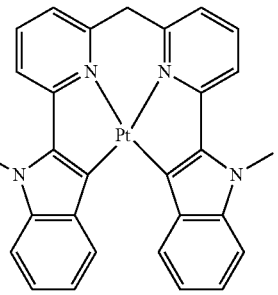
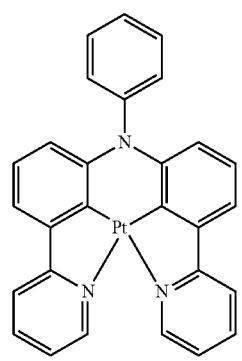
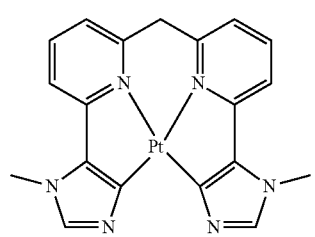
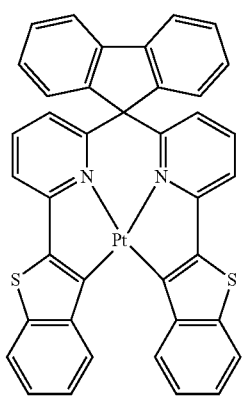
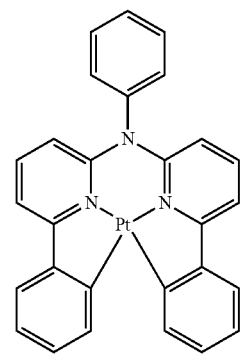
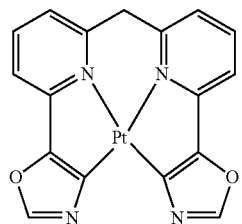
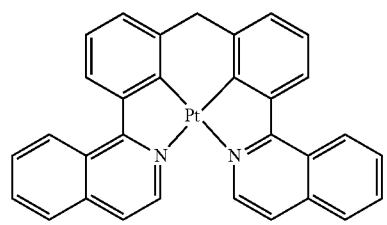
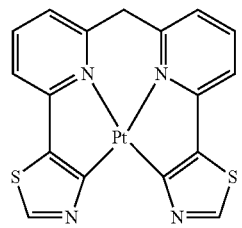
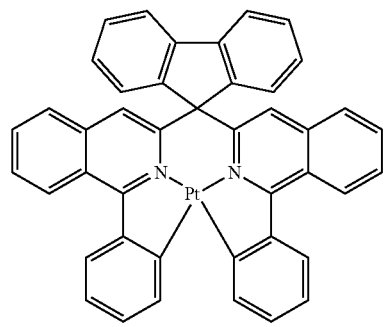

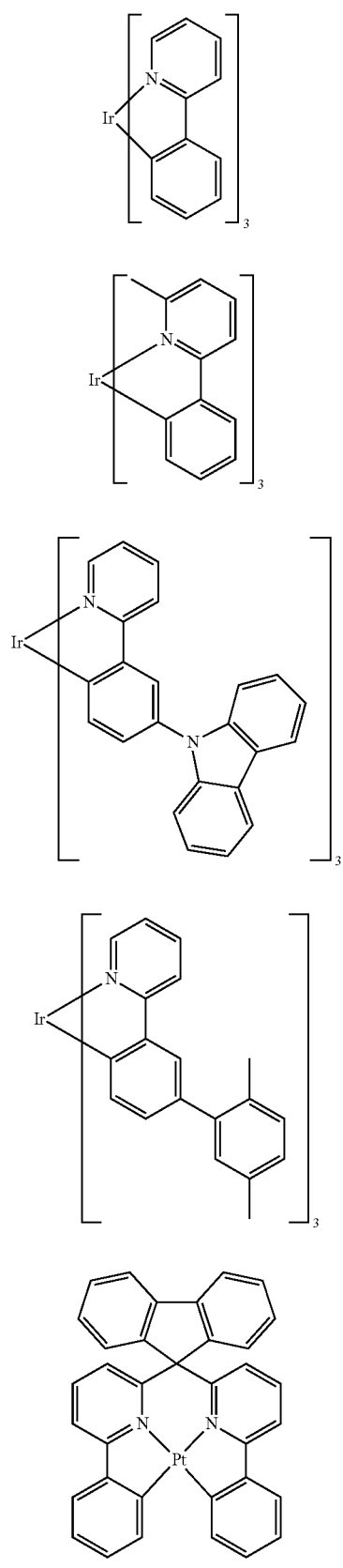
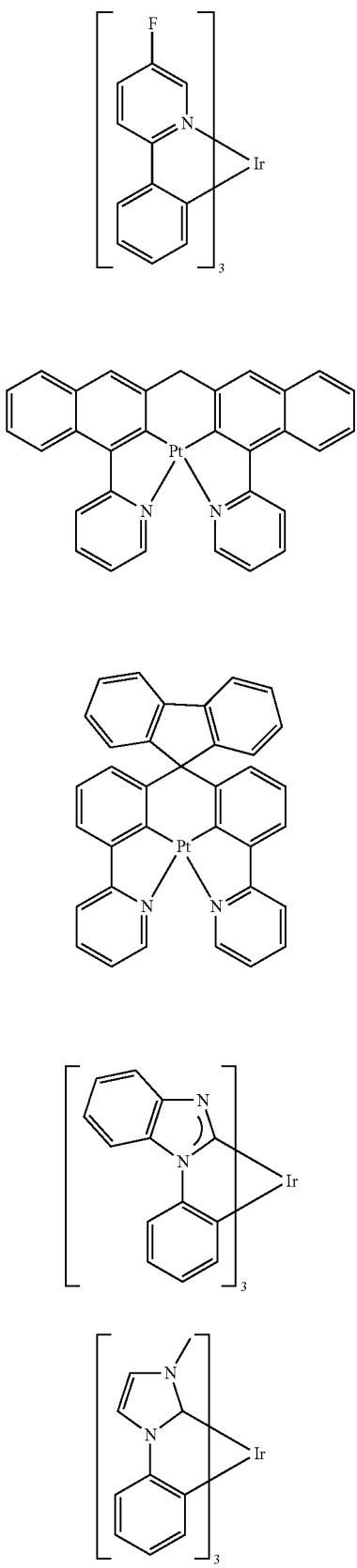

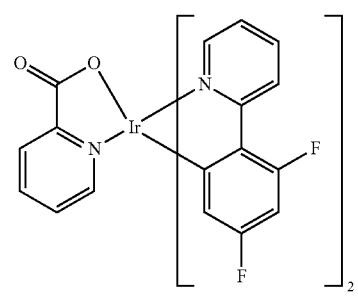
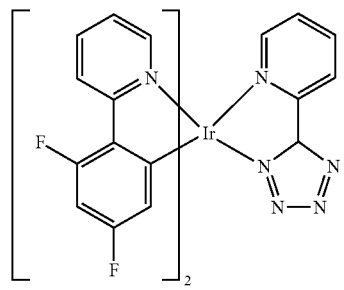
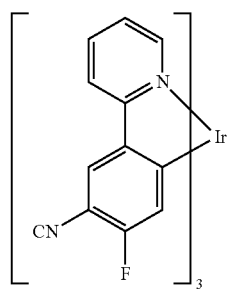
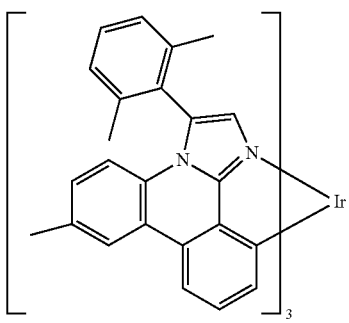
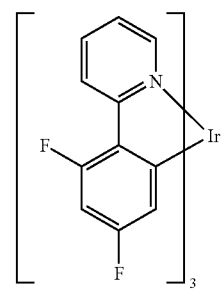
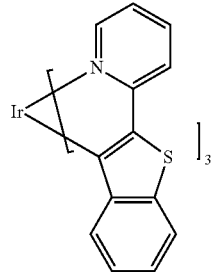
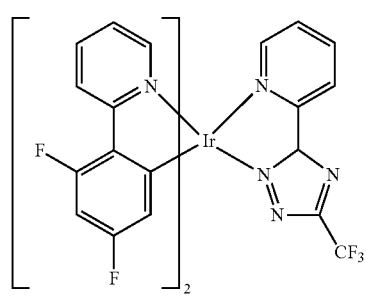
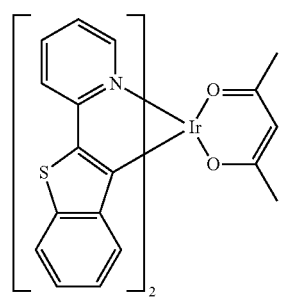
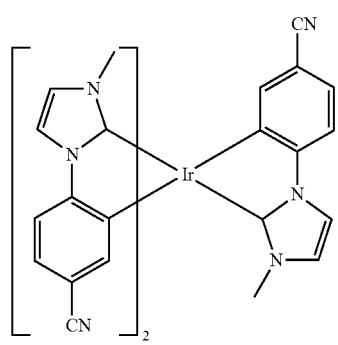
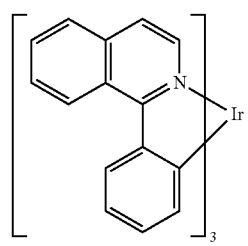

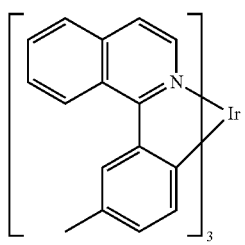
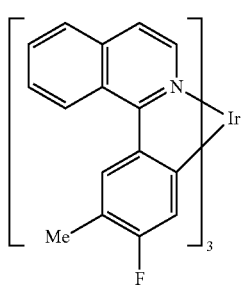
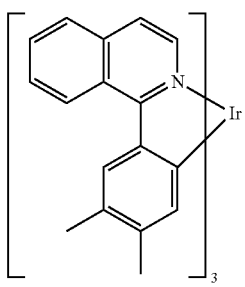
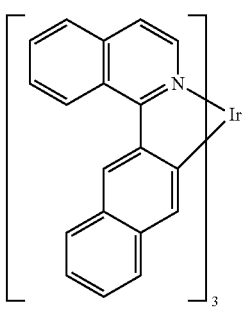
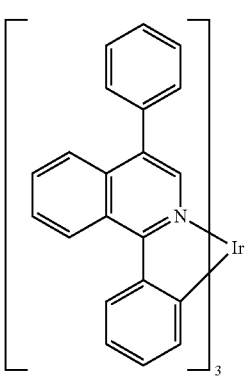
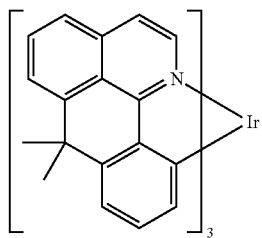
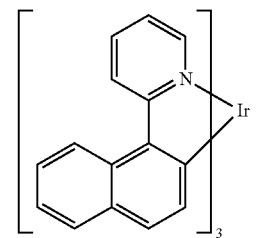
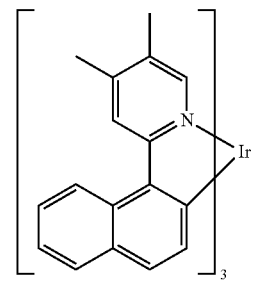
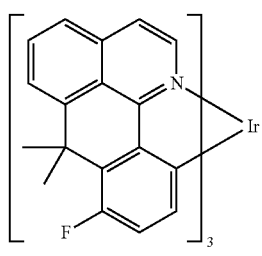
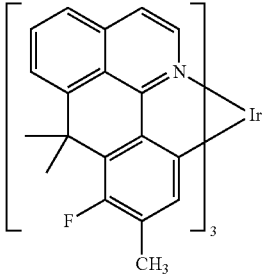

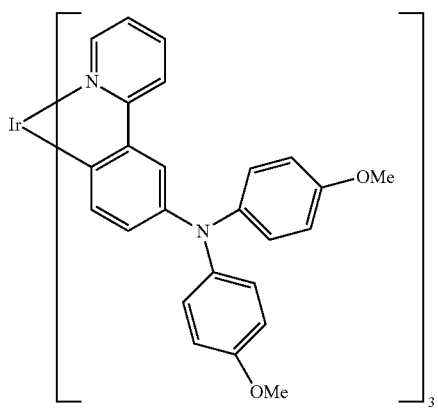
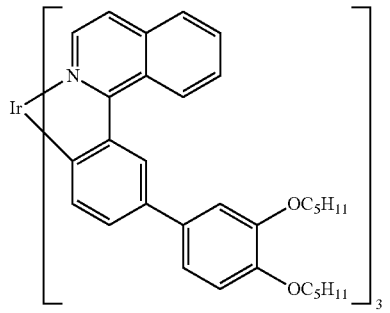
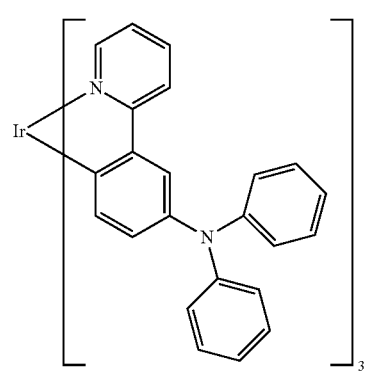
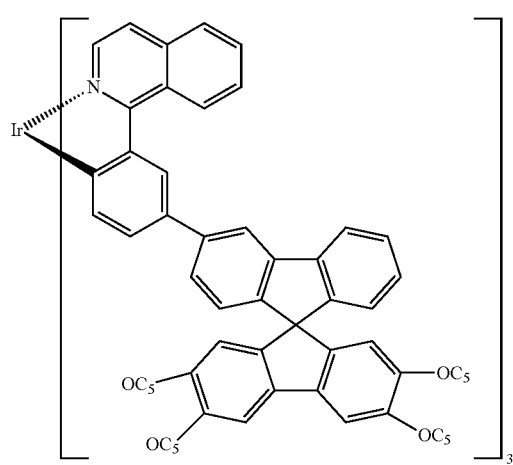
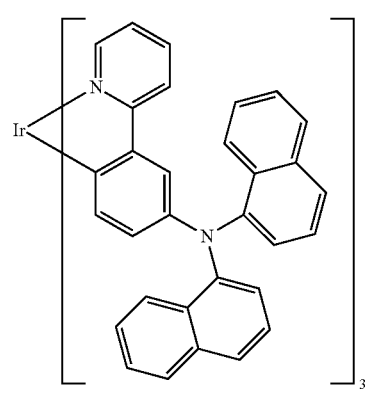
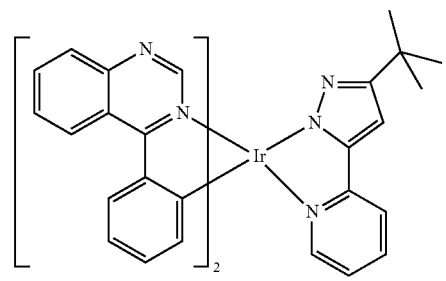
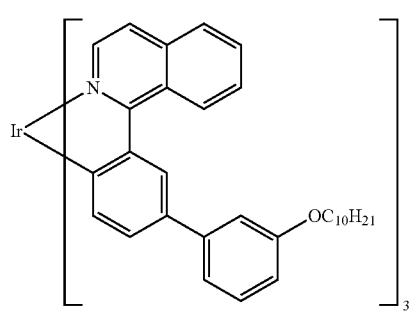
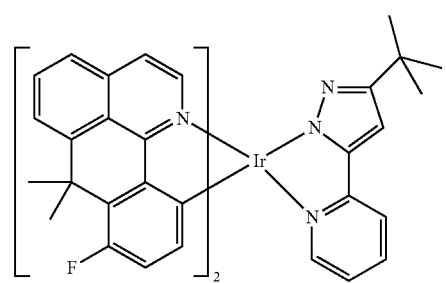
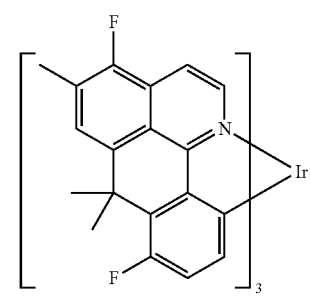

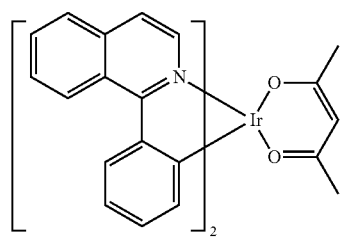
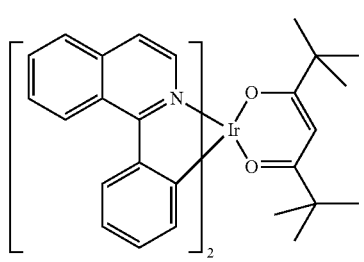
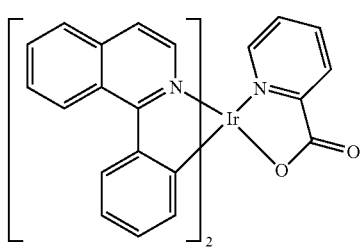
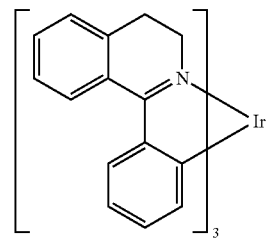
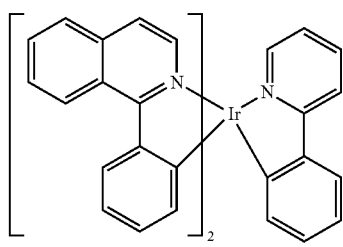
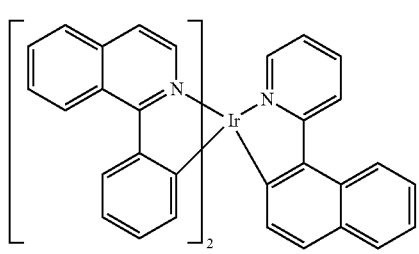
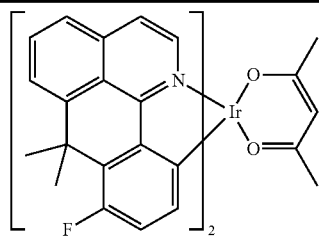
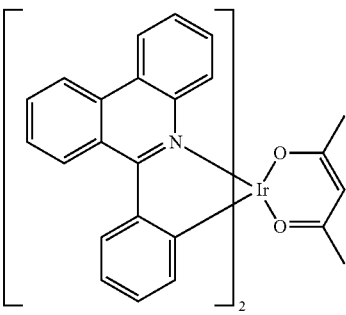
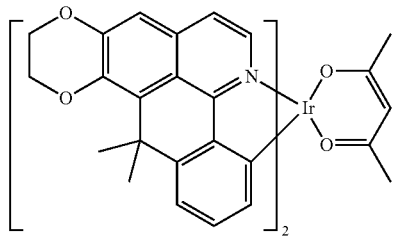
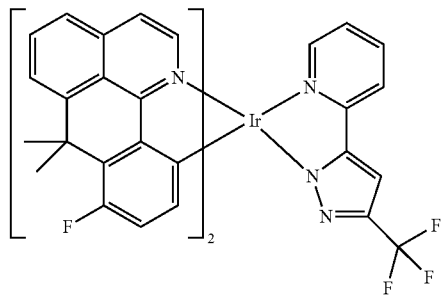
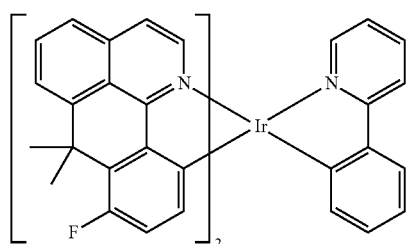
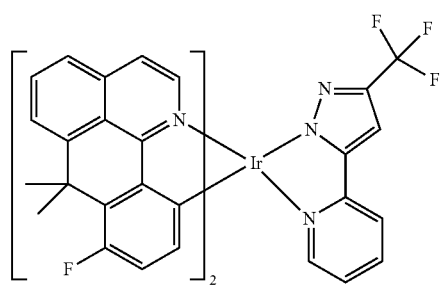

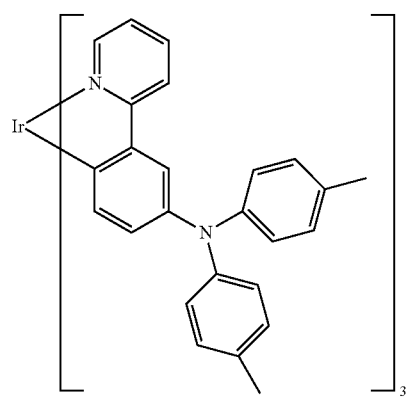
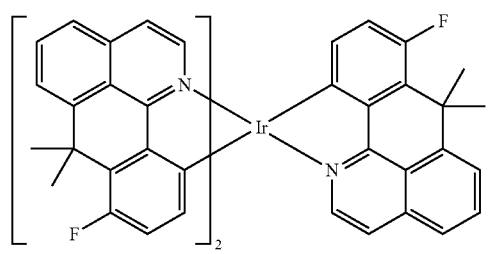
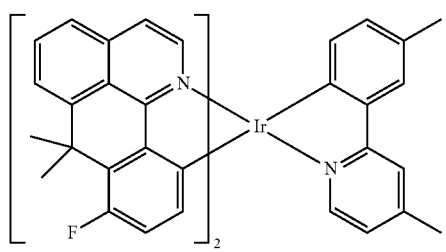
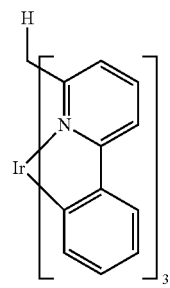
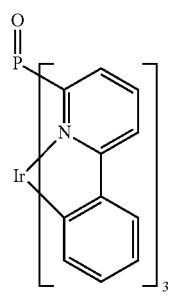
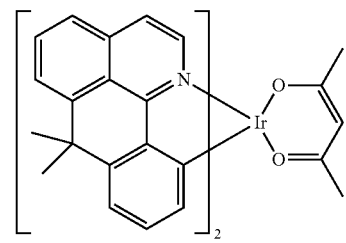
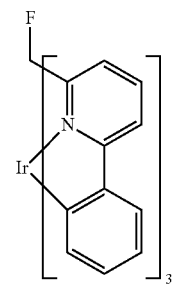
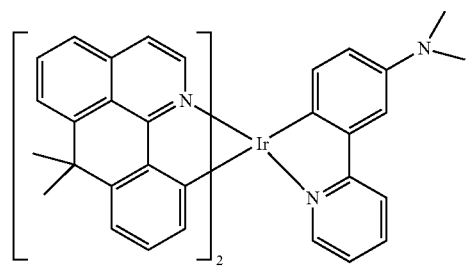
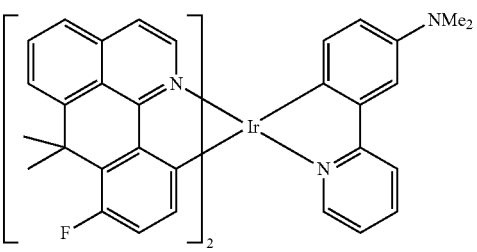
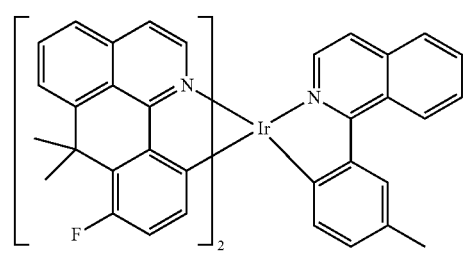
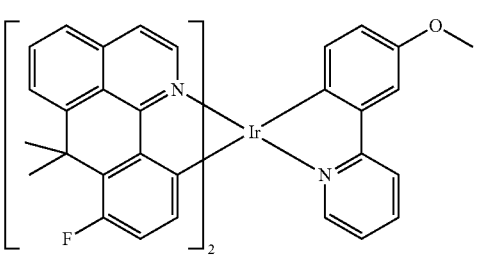

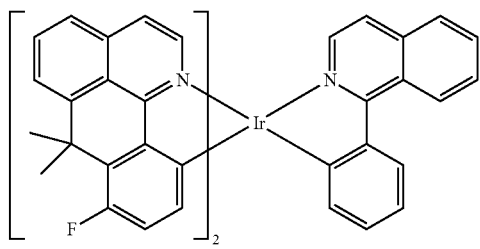
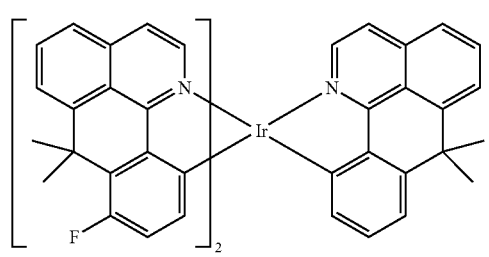
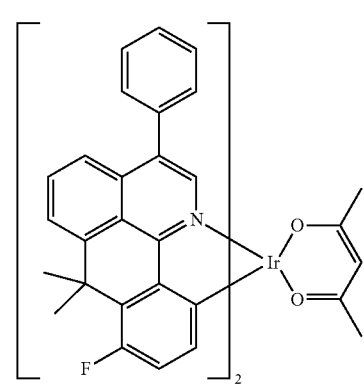
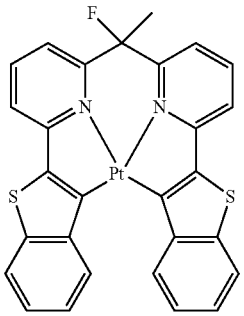
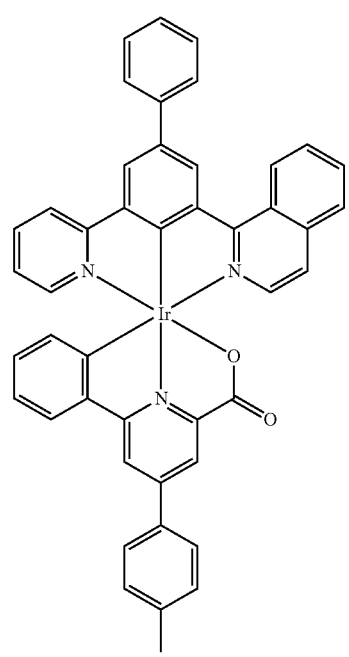

81
-continued
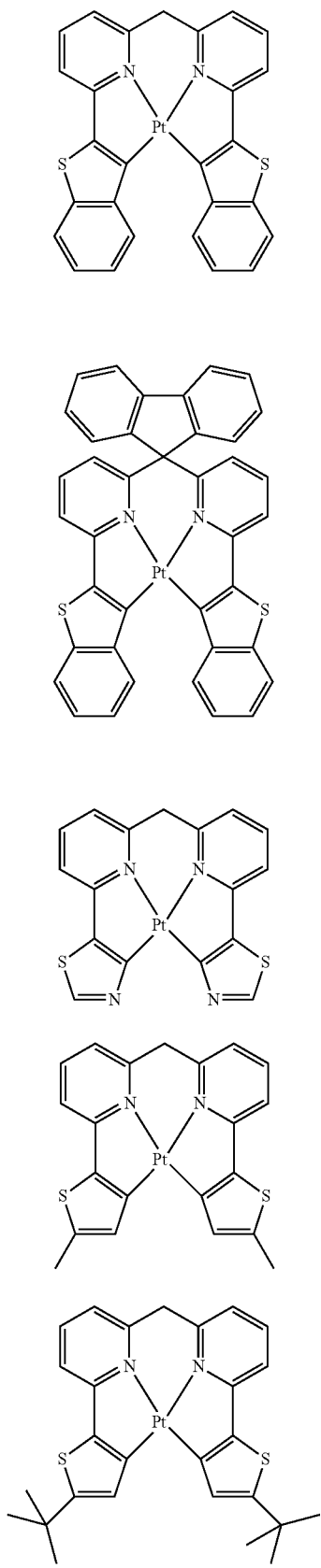
82
-continued
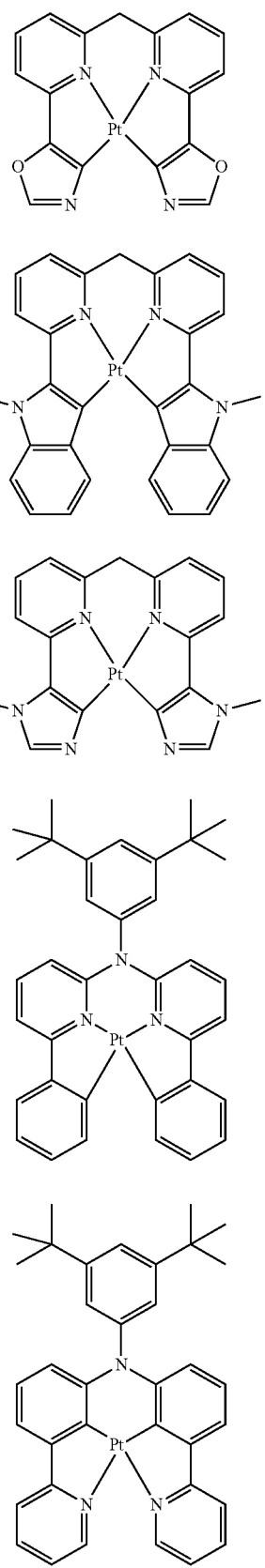

-continued
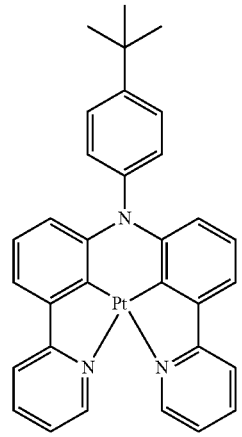
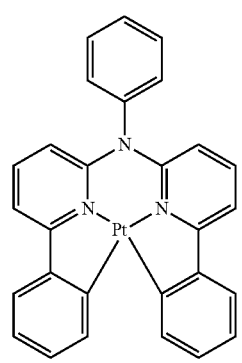
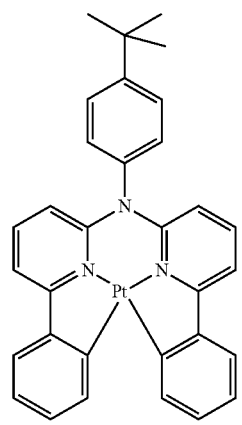
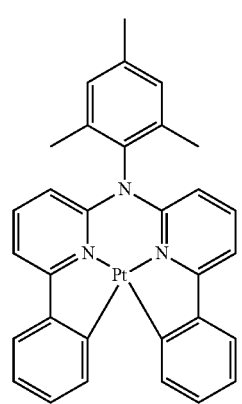
-continued
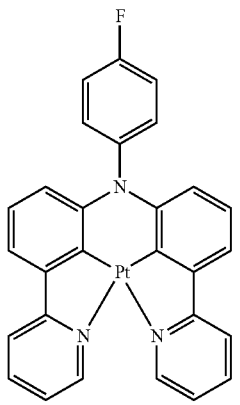
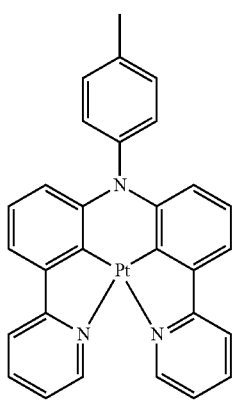
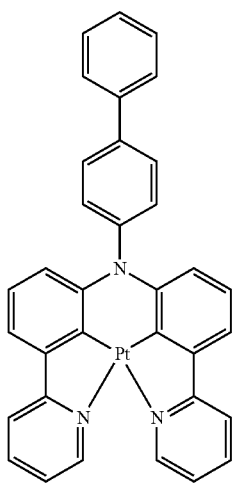

85
-continued
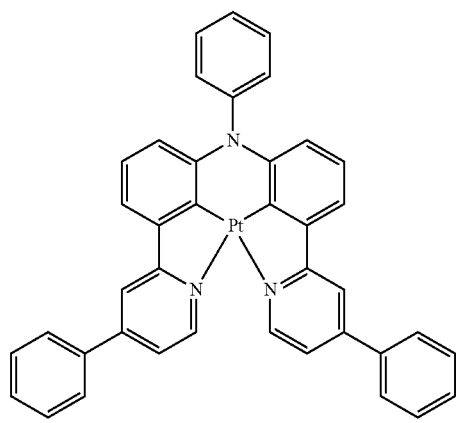
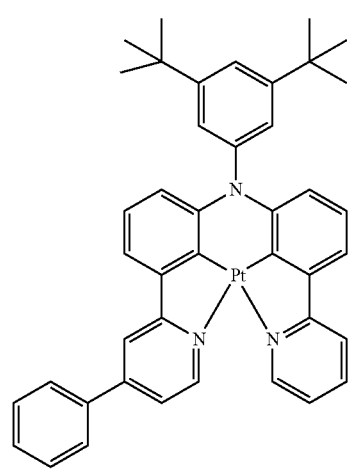
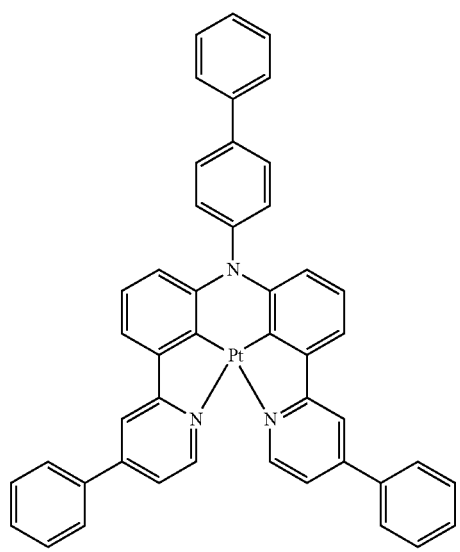
86
-continued
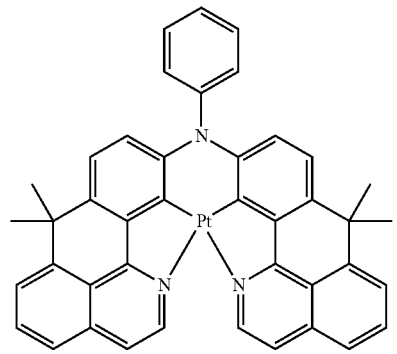
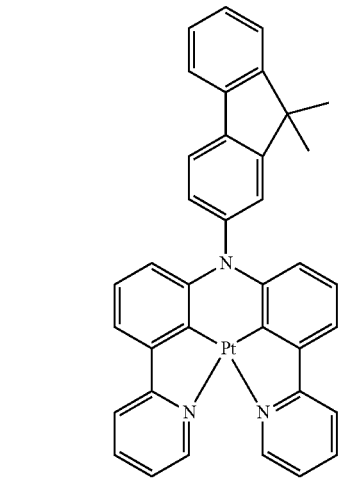
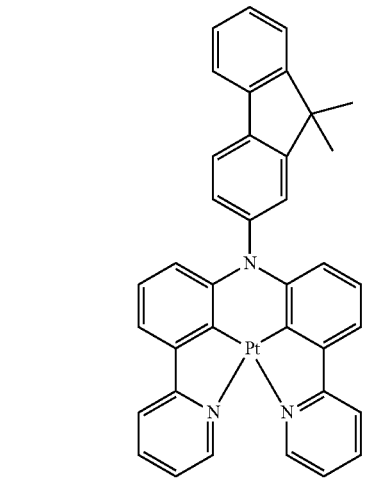

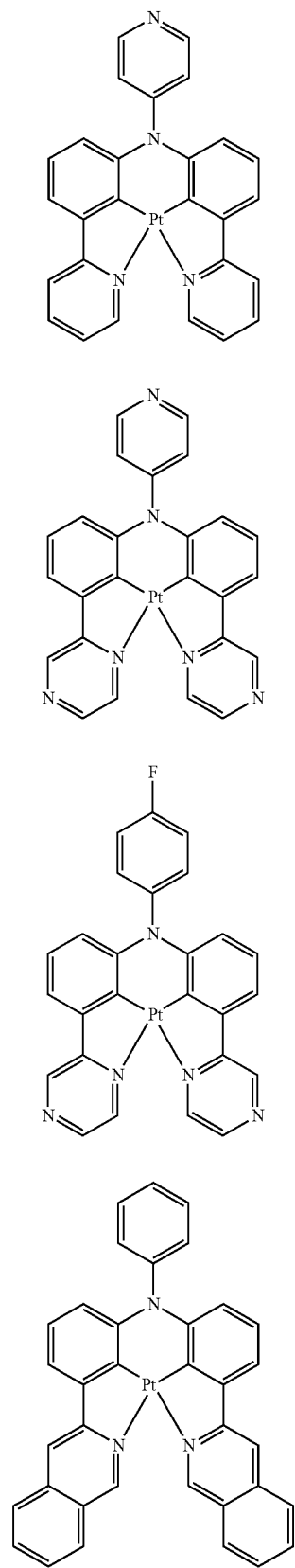
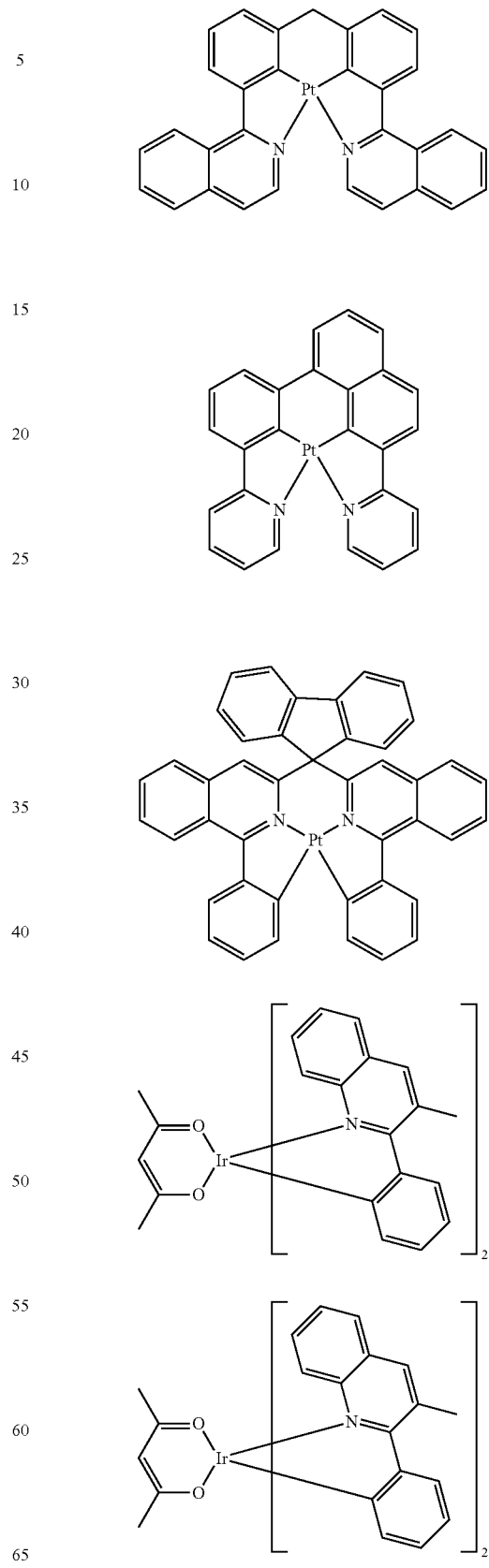

-continued
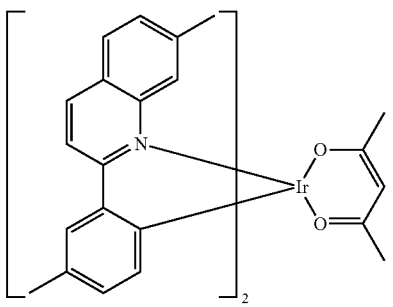
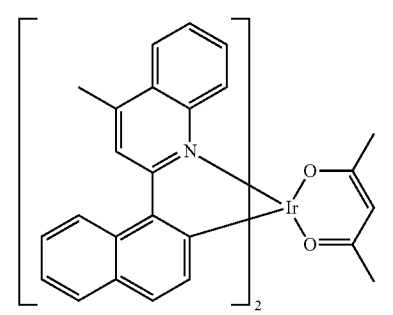
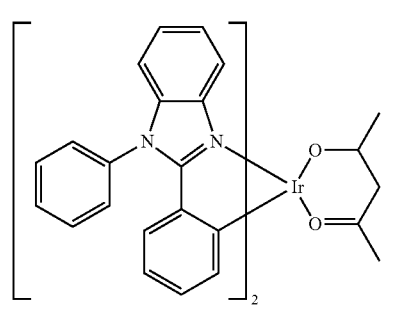
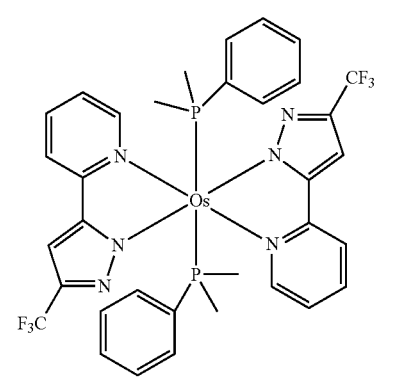
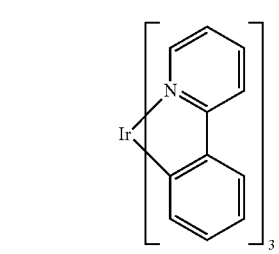
-continued
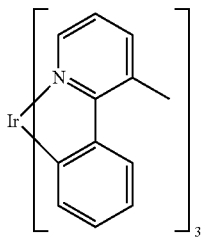
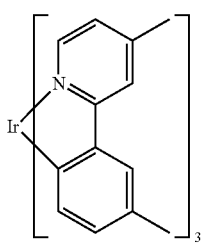
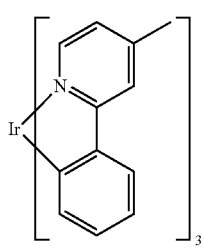
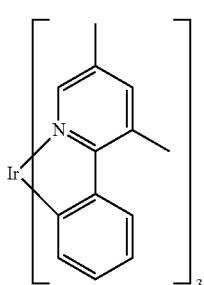
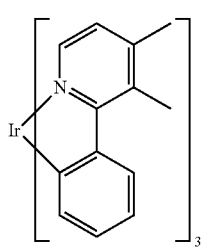
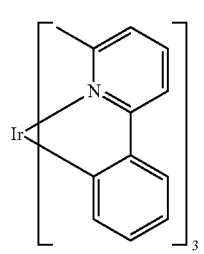

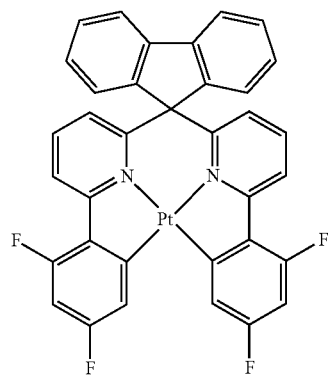
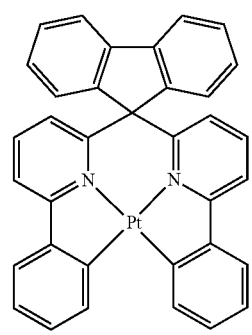
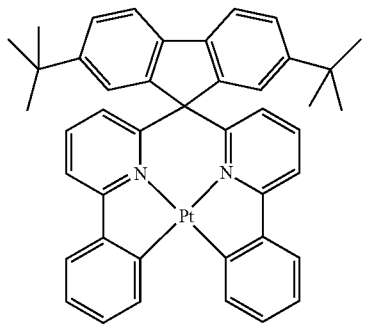
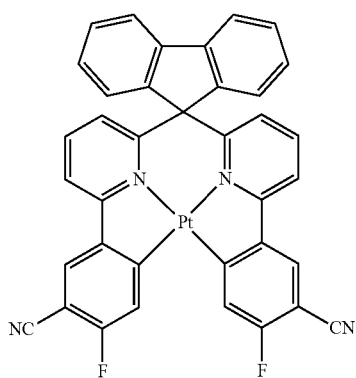
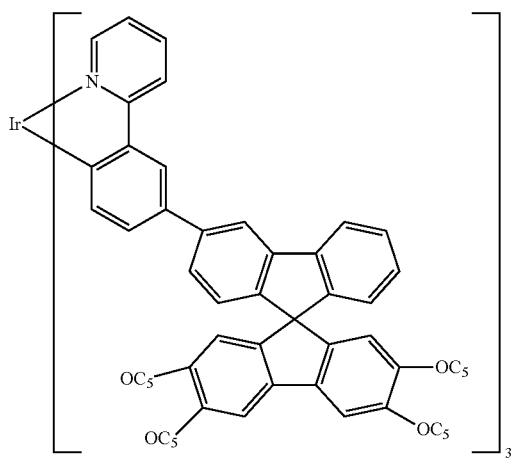

93
-continued
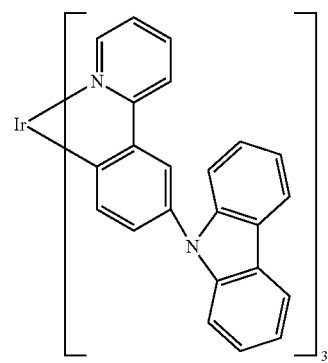
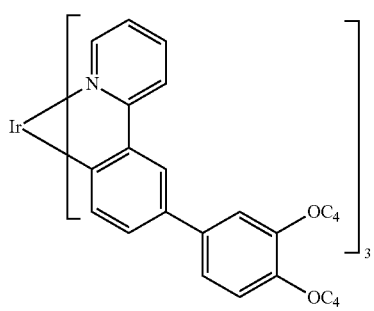
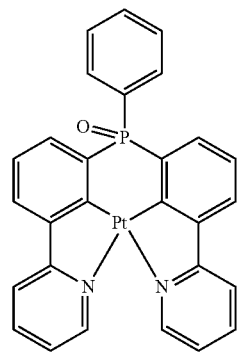
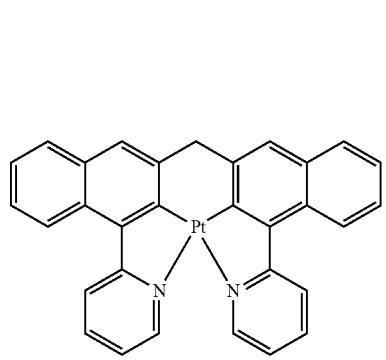
94
-continued
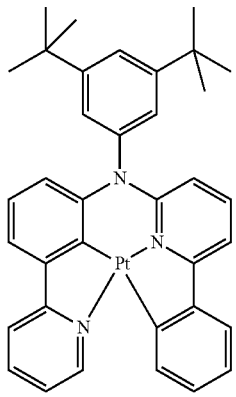
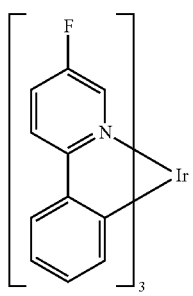
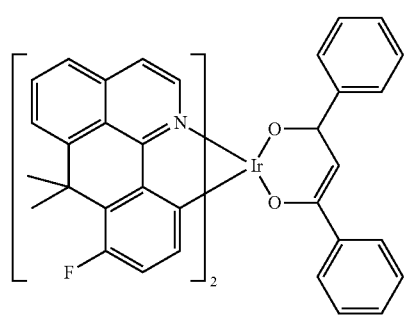
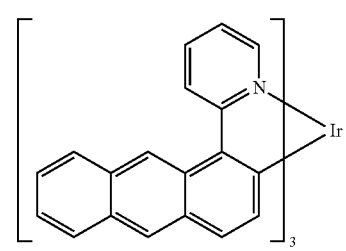
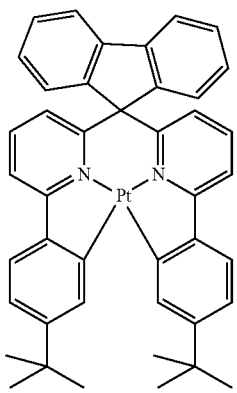

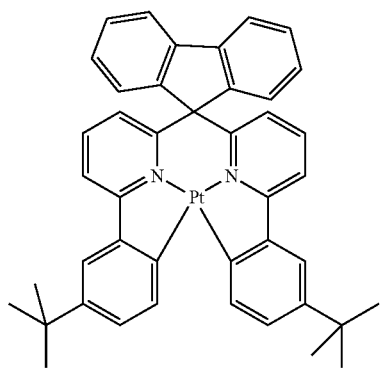
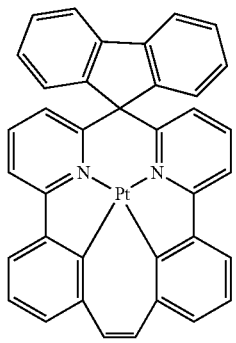
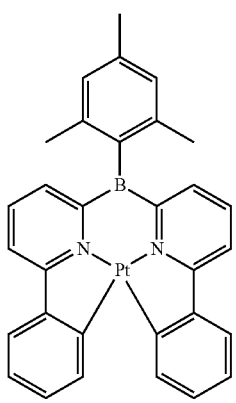
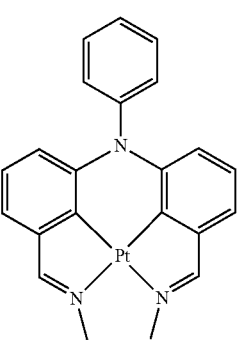
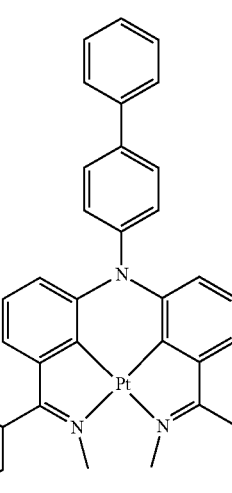

97
-continued
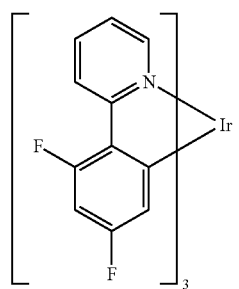
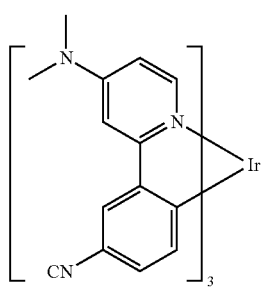
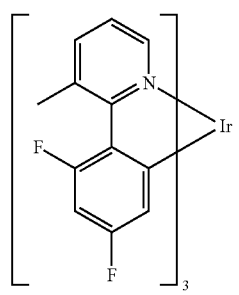
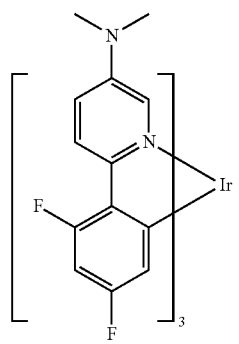
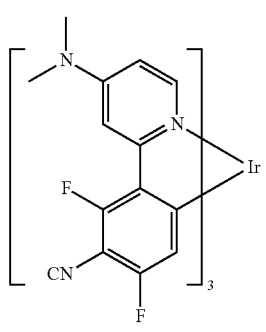
98
-continued
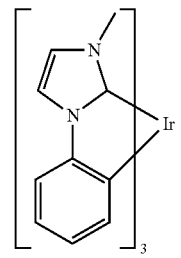
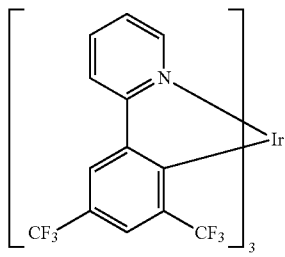
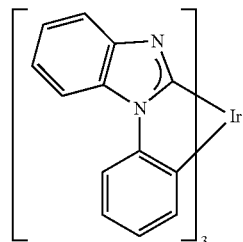
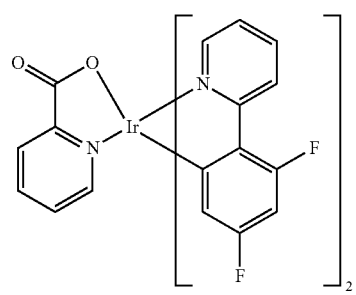
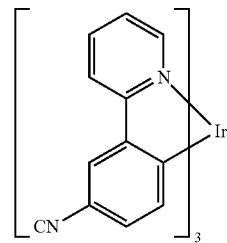
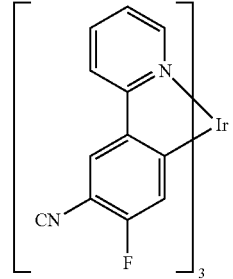

99
-continued
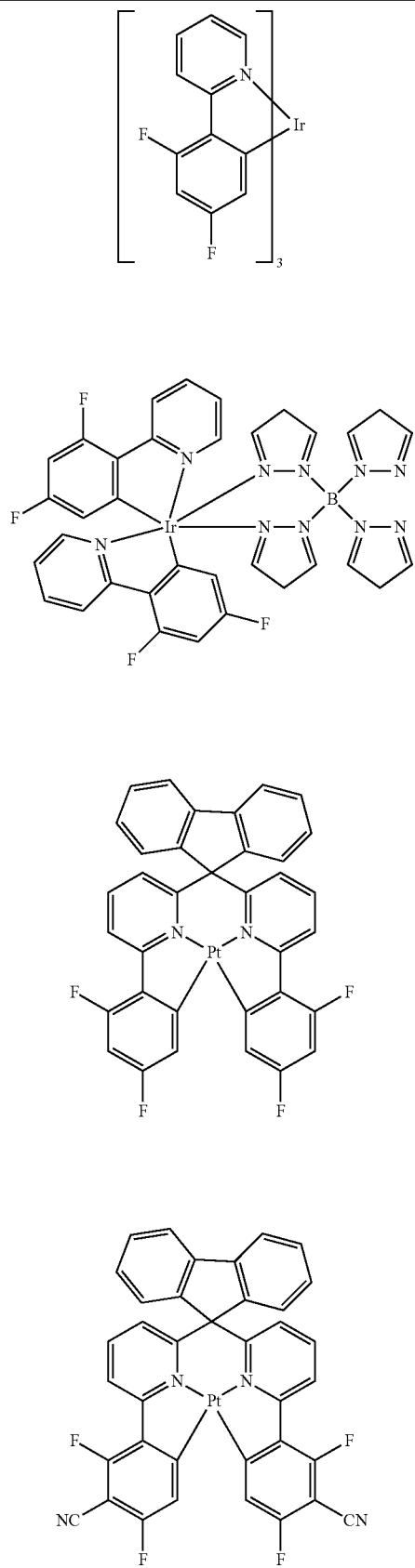
100
-continued
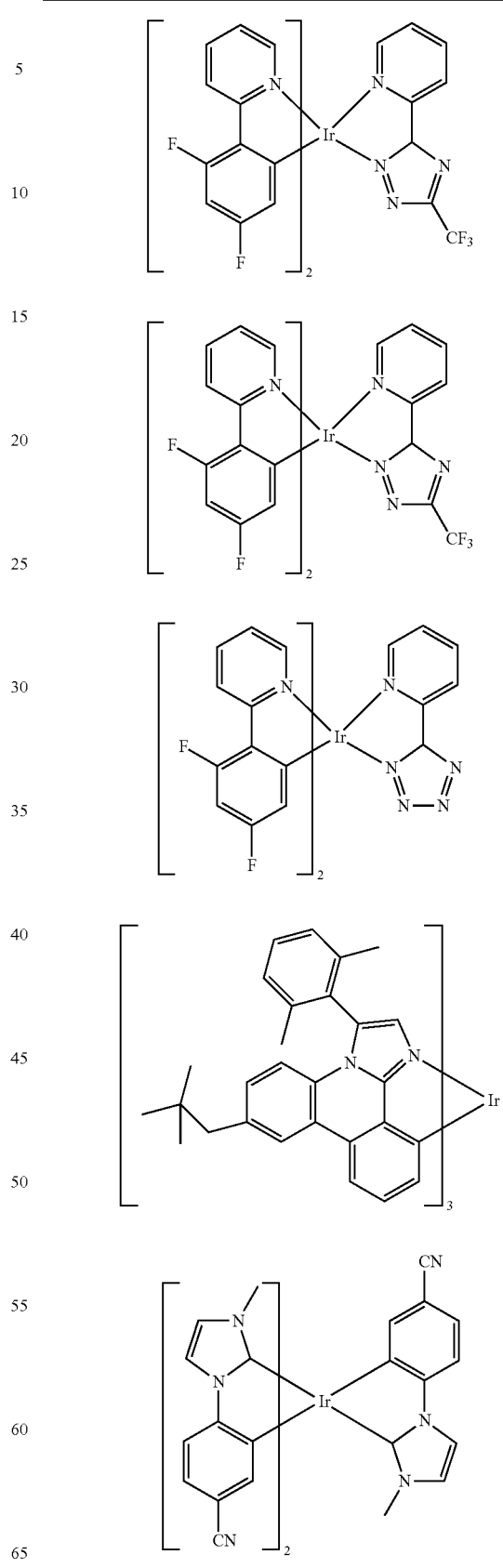

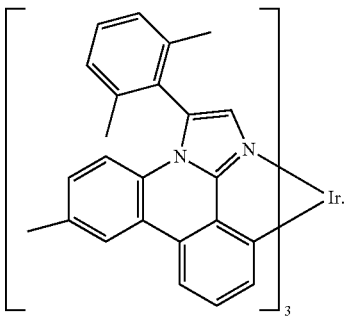

8. Polymers

In some embodiments, the organic functional materials described above, including HIM, HTM, ETM, EIM, Host, fluorescent emitter, and phosphorescent emitters, may be in the form of polymers.

In a preferred embodiment, the polymer suitable for the present disclosure is a conjugated polymer. In general, the conjugated polymer may have the general formula:

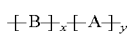  Chemical Formula 6 wherein B, A may be independently selected as the same or different structural elements in multiple occurrences.

B: a π-conjugated structural unit with relatively large energy gap, also referred to as backbone unit, which may be selected from monocyclic or polycyclic aryl or heteroaryl, preferably in the form of benzene, biphenylene, naphthalene, anthracene, phenanthrene, dihydrophenanthrene, 9,10-dihydrophenanthroline, fluorene, difluorene, spirobifluorene, p-phenylenevinylene, trans-indenofluorene, cis-indenofluorene, dibenzol-indenofluorene, indenonaphthalene and derivatives thereof, or a combination thereof.

A: a π-conjugated structural unit with relatively small energy gap, also referred to as a functional unit, which, according to different functional requirements, may be selected from the above-mentioned hole-injection or hole-transport material (HIM/HTM), hole-blocking material (HBM), electron-injection or electron-transport material (EIM/ETM), electron-blocking material (EBM), organic host material (Host), singlet emitter (fluorescent emitter), multiplet emitter (phosphorescent emitter), or a combination thereof.

x, y: >0, and x+y=1.

Non-limiting examples of light-emitting polymers are disclosed in WO2007043495, WO2006118345, WO2006114364, WO2006062226, WO2006052457, WO2005104264, WO2005056633, WO2005033174, WO2004113412, WO2004041901, WO2003099901, WO2003051092, WO2003020790, WO2003020790, US2020040076853, US2020040002576, US2007208567, US2005962631, EP201345477, EP2001344788, and DE102004020298.

In another embodiment, the polymers suitable for the present disclosure may be non-conjugated polymers. The nonconjugated polymer may be the backbone with all functional groups on the side chain. Non-limiting examples of such nonconjugated polymers for use as phosphorescent host or phosphorescent emitter materials may be found in patent applications such as U.S. Pat. No. 7,250,226 B2, JP2007059939A, JP2007211243A2 and JP2007197574A2. Non-limiting examples of such nonconjugated polymers used as fluorescent light-emitting materials may be found in the patent applications JP2005108556, JP2005285661, and JP2003338375. In addition, the non-conjugated polymer may also be a polymer, with the conjugated functional units on the backbone linked by non-conjugated linking units. Non-limiting examples of such polymers are disclosed in DE102009023154.4 and DE102009023156.0.

The present disclosure also provides a formulation which may comprise a conjugated organic polymer as described in one aspect of the present disclosure and at least one organic solvent. Examples of the organic solvents include, but are not limited to, methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxahexane, acetone, methyl ethyl ketone, 1,2-dichloroethane, 3-phenoxytoluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, naphthane, indene and/or their formulations.

In a preferred embodiment, the formulation according to one aspect of the disclosure is a solution.

In another preferred embodiment, the formulation according to one aspect of the disclosure is a suspension.

The formulation in the examples of the present disclosure may comprise an organic mixture from 0.01 to 20 wt %, more preferably from 0.1 to 15 wt %, more preferably from 0.2 to 10 wt %, and most preferably from 0.25 to 5 wt %.

The present disclosure also provides the use of said formulation as a coating or printing ink in the preparation of organic electronic devices, and particularly preferably by means of printing or coating in a preparation process.

Among them, suitable printing or coating techniques may include, but are not limited to, ink-jet printing, typography, screen printing, dip coating, spin coating, blade coating, roll printing, torsion printing, lithography, flexography, rotary printing, spray coating, brush coating or pad printing, slit type extrusion coating, and so on. Preferred are inkjet printing, screen printing and gravure printing. The solution or suspension may additionally comprise one or more components such as surface active compounds, lubricants, wetting agents, dispersing agents, hydrophobic agents, binders, etc., for adjusting viscosity, film forming properties, improving adhesion, and the like. For more information about printing techniques and their requirements for solutions, such as solvent, concentration, viscosity, etc., see Handbook of Print Media: Technologies and Production Methods, edited by Helmut Kipphan, ISBN 3-540-67326-1.

Based on the above polymers, the present disclosure also provides use of the polymers as described above, i.e. application of the polymers to an organic electronic device, which may be selected from, but not limited to, organic light emitting diodes (OLED), organic photovoltaics (OPVs), organic light emitting cells (OLEEC), organic field effect transistor (OFET), organic light emitting field effectors, organic lasers, organic spin electron devices, organic sensors, and organic plasmon emitting diodes, especially OLED. In a particularly preferred embodiment, the polymer according to one aspect of the present disclosure is used in an electrion-transport layer, especially a hole-transport layer, of an organic electronic device.

The present disclosure further provides an organic electronic device which may comprise at least one polymer as described above. Typically, such an organic electronic device may comprise at least a cathode, an anode, and a functional layer between the cathode and the anode, wherein the functional layer may comprise at least one of the polymers as described above.

In a preferred embodiment, the above-described organic electronic device is an electroluminescent device, which may include a substrate, an anode, at least one light-emitting layer, and a cathode. In a particularly preferred embodiment, the organic electronic device described above may be an OLED.

The substrate may be opaque or transparent. Transparent substrates may be used to make transparent light-emitting components. See, for example, Bulovic et al., Nature 1996, 380, p29, and Gu et al., Appl. Phys. Lett. 1996, 68, p2606. The substrate may be rigid or flexible. The substrate may be plastic, metal, semiconductor wafer or glass. Most preferably the substrate has a smooth surface. Substrates free of surface defects are particularly desirable. In a preferred embodiment, the substrate is flexible and may be selected from polymer films or plastic, with a glass transition temperature (Tg) of 150° C. or above, more preferably above 200° C., more preferably above 250° C., and most preferably above 300° C. Non-limiting examples of suitable flexible substrates are poly (ethylene terephthalate) (PET) and polyethylene glycol (2,6-naphthalene) (PEN).

The anode may comprise a conductive metal or a metal oxide, or a conductive polymer. The anode may easily inject holes into the hole-injection layer (HIL) or the hole-transport layer (HTL) or the light-emitting layer. In one embodiment, the absolute value of the difference between the work function of the anode and the HOMO energy level or the valence band energy level of the emitter in the light-emitting layer or of the p-type semiconductor material of the HIL or HTL or the electron-blocking layer (EBL) may be smaller than 0.5 eV, more preferably smaller than 0.3 eV, and most preferably smaller than 0.2 eV. Non-limiting examples of anode materials may include, but are not limited to, Al, Cu, Au, Ag, Mg, Fe, Co, Ni, Mn, Pd, Pt, ITO, aluminum-doped zinc oxide (AZO), and the like. Other suitable anode materials are known and may be readily selected for use by one of ordinary skill in the art. The anode material may be deposited using any suitable technique, such as suitable physical vapor deposition, including RF magnetron sputtering, vacuum thermal evaporation, electron beam (e-beam), and the like. In some embodiments, the anode may be patterned. The patterned ITO conductive substrate is commercially available and may be used to fabricate the device according to the disclosure.

The cathode may comprise a conductive metal or a metal oxide. The cathode may easily inject electrons into the EIL or ETL or directly into the light-emitting layer. In one embodiment, the absolute value of the difference between the work function of the cathode and the LUMO energy level or the valence band energy level of the emitter in the light-emitting layer or of the n-type semiconductor material of the electron-injection layer (EIL) or the electron-transport layer (ETL) or the hole-blocking layer (HBL) may be smaller than 0.5 eV, more preferably smaller than 0.3 eV, and most preferably smaller than 0.2 eV. In principle, all of the material that may be used as the cathode of an OLED may serve as a cathode material for the device of the present disclosure. Examples of the cathode material may include, but are not limited to, any one of Al, Au, Ag, Ca, Ba, Mg, LiF/Al, MgAg alloys, BaF2/Al, Cu, Fe, Co, Ni, Mn, Pd, Pt, ITO, or a combination thereof. The cathode material may be deposited using any suitable technique, such as suitable physical vapor deposition, including RF magnetron sputtering, vacuum thermal evaporation, electron beam (e-beam), and the like.

OLEDs may also comprise other functional layers such as hole-injection layer (HIL), hole-transport layer (HTL), electron-blocking layer (EBL), electron-injection layer (EIL), electron-transport layer (ETL), and hole-blocking layer (HBL), or a combination thereof. Materials suitable for use in these functional layers are described in detail in WO2010135519A1, US20090134784A1, and WO2011110277A1.

In a preferred embodiment, in the light emitting device according to one aspect of the present disclosure, the light-emitting layer thereof may be prepared by printing with the formulation of the present disclosure.

The light emitting device according to one aspect of the present disclosure may have a light emission wavelength between 300 and 1000 nm, more preferably between 350 and 900 nm, and more preferably between 400 and 800 nm.

The disclosure also provides the use of organic electronic devices according to one aspect of the disclosure in a variety of electronic devices including, but not limited to, display devices, lighting devices, light sources, sensors, and the like.

The disclosure also provides an electronic device comprising an organic electronic device as described in an aspect of the disclosure, including, but not limited to, display devices, lighting devices, light sources, sensors, and the like.

The disclosure will now be described with reference to the preferred embodiments, but the disclosure is not to be construed as being limited to the following examples. It is to be understood that the appended claims are intended to cover the scope of the disclosure. Those skilled in the art will understand that modifications can be made to various embodiments of the disclosure with the teaching of the present disclosure, which will be covered by the spirit and scope of the claims of the disclosure.

EXAMPLES

Example 1

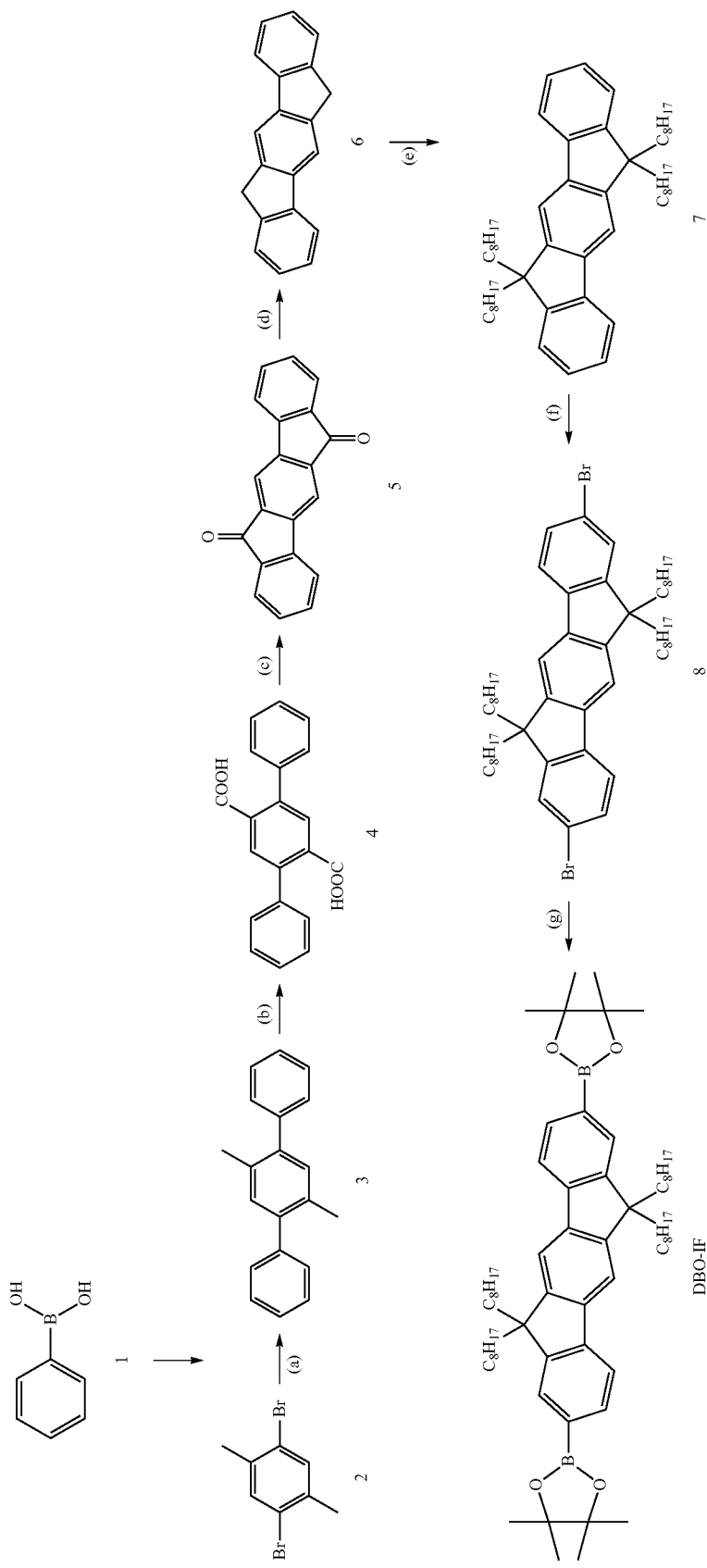

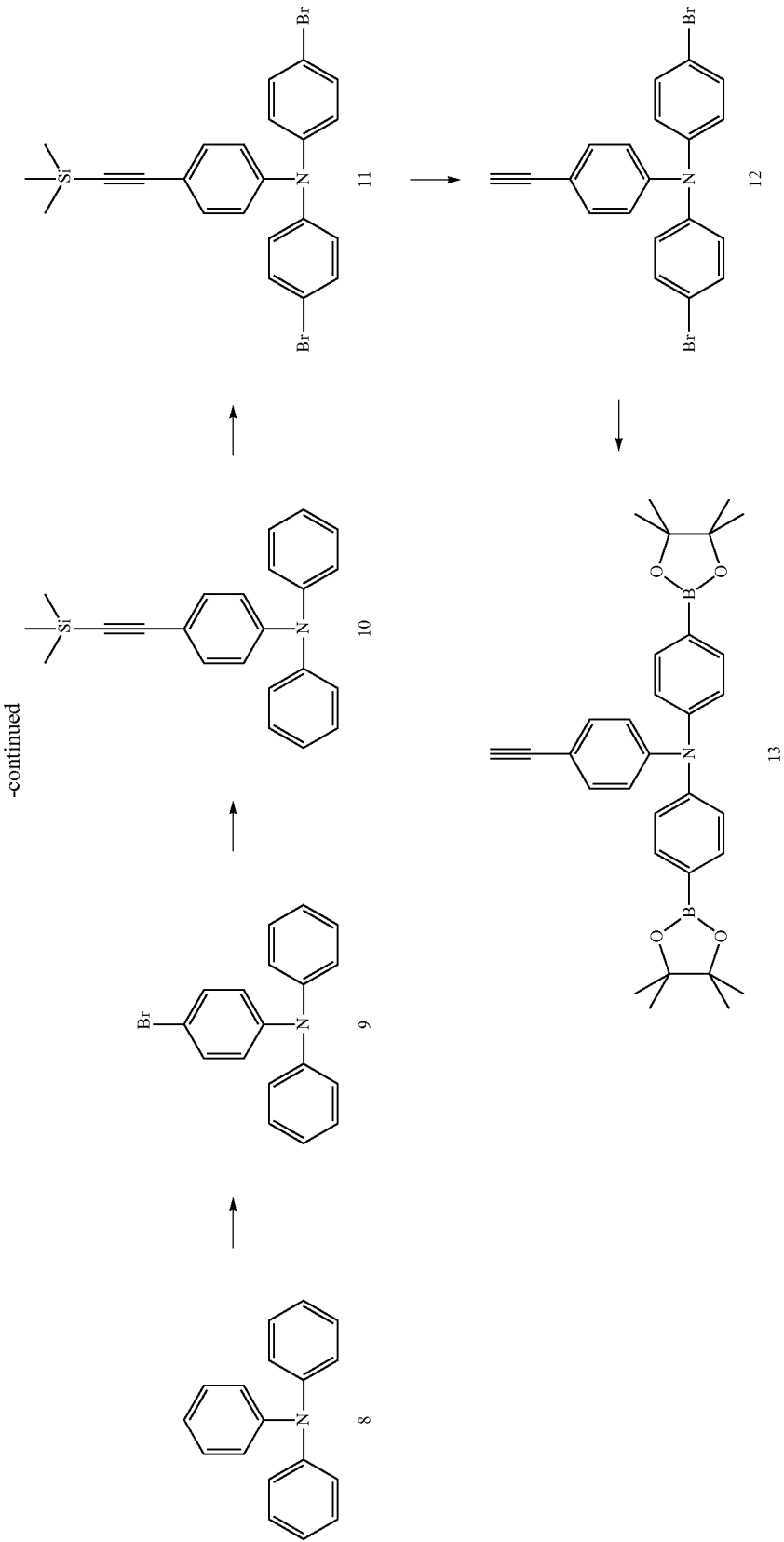

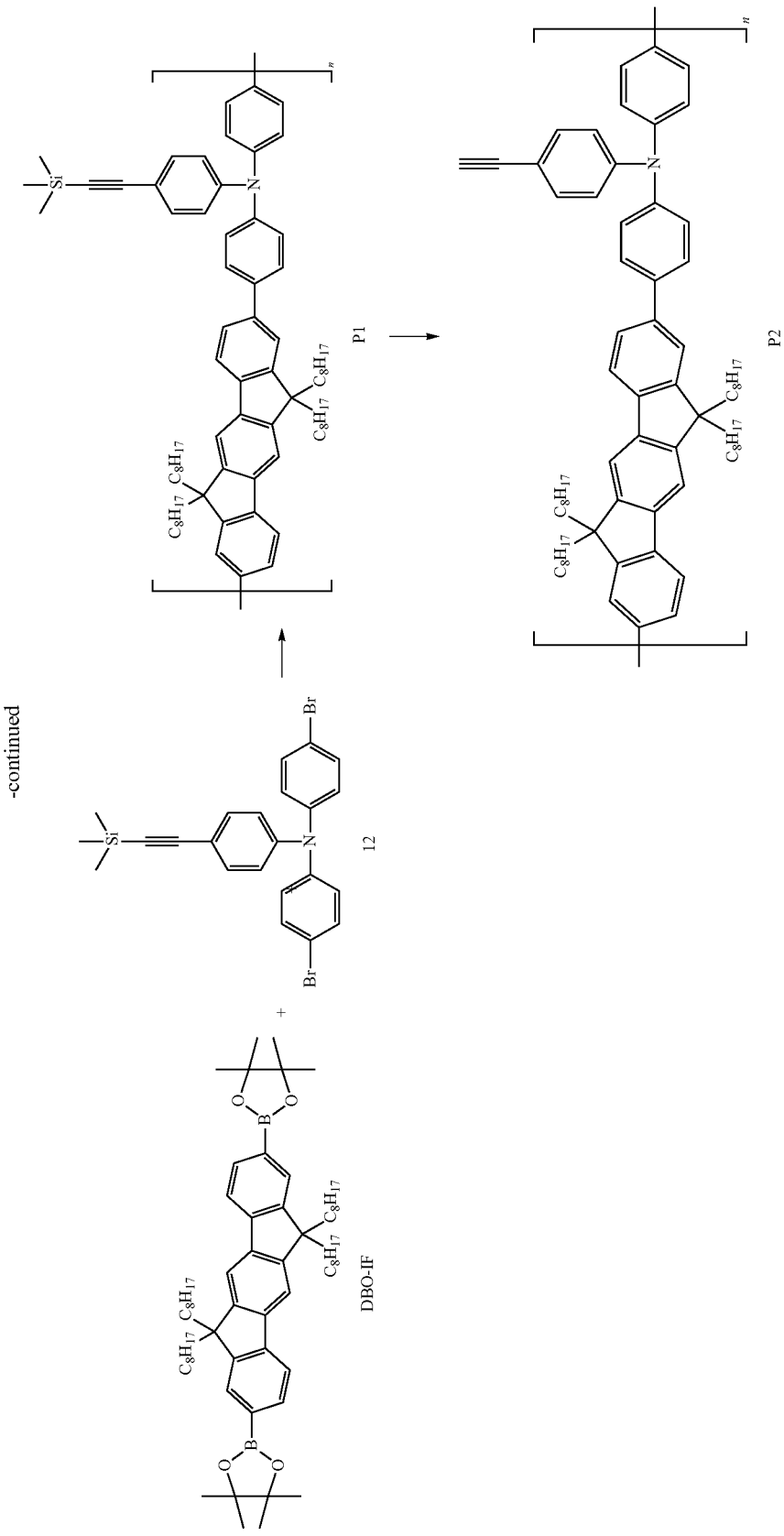

Synthesis of 2,5-diphenyl p-xylene (3)

To a 250 ml three-necked round bottom flask, 26.40 g (0.1 mol) of 2,5-dibromo-p-xylene and 24.39 g (0.2 mmol) of phenylboronic acid was added. 250 ml of toluene was added and stirred to dissolve, followed by 50 ml water and 21.2 g $Na_2CO_3$ (0.2 mol), stirring all solids were dissolved. 0.5 ml of Aliquat 336 and 75 mg of tetra(triphenylphosphine) palladium catalyst (0) ($(PPh_3)_4Pd$) were added and flushed with protective nitrogen gas for 10 min before heated to reflux (92-100° C.). After refluxing for 20 min, the nitrogen gas was turned off and the system kept sealed, refluxing and reacting overnight. The reaction solution was extracted with toluene (50 ml×4) after cooling, and the organic phase was combined and successively washed with saturated solution of NaCl and water. White crystal 22.48 g was obtained by evaporation of the solvent and drying, with the theoretical value of 25.84 g and a yield rate of about 87%. M. P. 180-181° C. (lit. 180° C.), $^1$H NMR ($CDCl_3$, 400 MHz, ppm): δ 7.44-7.30 (m, 10H), 7.14 (s, 2H), 2.26 (s, 6H).

Synthesis of 2,5-diphenyl p-dicarboxylic acid (4)

To a 250 ml three-necked round bottom flask, 12.92 g (0.05 mol) of 2,5-diphenyl-p-xylene and 250 ml of pyridine was added under mechanical stirring to dissolve, followed by 30 ml of water and 39.51 g of $KMnO_4$ (0.25 mol). It was heated to reflux (about 105-110° C.) for 2 h, during which it was cooled after every 30 min of refluxing and added with 60 ml of water and 15.59 g of $KMnO_4$ (0.1 mol), repeated for four times in total. Afterwards, it was cooled after every 6 h of refluxing and added with 60 ml of water, repeated for four times in total. After the reaction, filtration was done when hot. The filter cake was rinsed with boiling water (1000 ml×4), the filtrate was combined, and the solvent was evaporated to about 100 ml, to which 50 ml of concentrated hydrochloric acid was added. After cooling, filtration, and washing with cold water, it was dried in vacuo to give 9.21 g of white solid, with the theoretical value of 15.92 and a yield rate of about 57.9%. M. P. 281-282° C. (lit. 282° C.), $^1$H NMR (DMSO-$d_6$, 400 MHz, ppm): δ 7.67 (s, 2H), 7.46-7.38 (m, 10H).

Synthesis of 6,12-indolifluinedione (5)

To a 500 ml three-necked round bottom flask, 100 ml of concentrated sulfuric acid was added, followed by slow addition of 3.18 g of 2,5-diphenylcarbodiimide (0.01 mol) under stirring. Reaction was allowed under room temperature for 0.5 h and followed by the addition of 5-10 drops of fuming sulfuric acid. After 6 h of reaction, the reaction solution was poured into ice-water mixture and stirred with a glass rod. The mixture was filtered by suction, rinsed with a large amount of water, and dried to give a dark red solid of 1.95 g, with the theoretical value of 2.82 g and a yield rate of about 69%. M. P.>300° C. (lit.>300° C.), $^1$H NMR ($CDCl_3$, 400 MHz, ppm): δ 7.79 (s, 2H), 7.68 (d, J=7.36 Hz, 2H), 7.57-7.51 (m, 4H), 7.37-7.29 (m, 2H).

Synthesis of Indenofluorene (6)

To a 500 ml three-necked round bottom flask, 5.64 g of 6,22-indolifluinedione (0.02 mol) was added, and then slowly 300 ml of diethylene glycol and 4 ml of hydrazine hydrate (85%) successively added with stirring, followed by 28.10 g of KOH (0.5 mol) ground into fine powder. After flushing with protective nitrogen gas for 10 min, it was heated to reflux (195° C.) for reaction of 48 h, before the mixture was cooled and poured into a mixed solution of crushed ice/concentrated hydrochloric acid (v:v=8:1), while stirring with a glass rod. The mixture was filtered by suction, washed with water, and dried to obtain a yellowish gray solid of 2.29 g, with the theoretical value of 5.09 g and a yield rate of 45%. M. P. 300-301° C. (lit. 300-302° C.), $^1$H NMR (DMSO-$d_6$, 400 MHz, ppm): δ 8.09 (s, 2H), 7.93 (d, J=7.4 Hz, 2H), 7.59 (d, J=7.4 Hz, 2H), 7.39 (t, J=7.4 Hz, 2H), 7.31 (t, J=7.4 Hz, 2H), 3.99 (s, 4H).

Synthesis of 6,6,12,12-tetraoctylindenofluorene (7)

To a 250 ml three-necked round bottom flask, a stir bar and 1.27 g of indenofluorene (6) were added, and a high vacuum piston (paraffin seal) was placed in the middle while rubber stoppers were place on both sides. The flask was heated with a blower while being evacuated with an oil pump. 100 ml of dry THF was added to the flask with a syringe. 6 ml of 2.87 M n-butyllithium (17.22 mmol) was added dropwise to the flask using a syringe under stirring at −78° C. and reacted under nitrogen protection for 1 h. The system was allowed to warm up to room temperature for 30 min of reaction and then cooled to −78° C. 3.82 g of 1-bromooctane (n-$C8H1_7Br$, 20 mmol) was added with a syringe, reacted at room temperature for 1 h at −78° C., spontaneously warmed up to room temperature, and reacted overnight. The reaction was quenched by the addition of about 30 ml of water. The reaction solution was extracted with petroleum ether (50 ml×4). The organic phase was combined and dried over anhydrous $Na_2SO_4$. The solvent was evaporated before purification by column chromatography (100-200 mesh silica gel/petroleum ether). Recrystallization from methanol gave 1.45 g of beige crystals, with the theoretical value of 3.52 g and a yield rate of about 47.7%. $^1$H NMR ($CDCl_3$, 400 MHz, ppm): δ 7.72 (d, J=6.8 Hz, 2H), 7.58 (s, 2H), 7.33-7.24 (m, 6H), 1.99 (t, J=8.0 Hz, 8H), 1.12-0.98 (m, 24H), 0.76-0.59 (m, 20H); $^{13}$C NMR ($CDCl_3$, 100 MHz, ppm): δ 151.08, 149.92, 141.48, 140.50, 126.59, 122.81, 119.30, 113.81, 54.66, 40.67, 31.50, 29.69, 23.67, 22.51, 13.96.

Synthesis of 2,7-dibromo-6,6,12,12-tetraoctylindenofluorene (8)

To a 250 ml three-necked round bottom flask, a stir bar, 7.03 g of 6,6,12,12-tetraoctylindenofluorene (10 mmol), and 100 ml of CCl4 were added, dissolved by stirring. 40 g $Al_2O_3$/CuBr (0.25 mol) was added for reaction under refluxing for 18 h. The reaction mixture was filtered and the filtrate was washed with water and dried over anhydrous $Na_2SO_4$. The solvent was evaporated and the resulting solid was recrystallized in methanol to give 3.73 g of white crystals with the theoretical value of 8.61 g and a yield rate of about 43.3%. $^1$H NMR ($CDCl_3$, 400 MHz, ppm): δ 7.57 (d, J=8.4 Hz, 2H), 7.52 (s, 2H), 7.45 (s, 2H), 7.44 (d, J=8.4 Hz, 2H), 1.97 (t, J=8.2 Hz, 8H), 1.11-0.96 (m, 24H), 0.75-0.58 (m, 20H); $^{13}$C NMR ($CDCl_3$, 100 MHz, ppm): δ 153.12, 149.68, 140.12, 139.72, 129.69, 125.97, 120.73, 120.63, 113.84, 55.13, 40.60, 31.58, 29.71, 23.76, 22.62, 14.11.

Synthesis of 2,8-bi (4,4,5,5-tetramethyl-1,3,2-dioxaborolane-diyl)-6,6,12,12-tetraoctylindenofluorene (DBO-IF)

To a 250 ml three-necked round bottom flask, a stir bar was added, and a high vacuum piston was placed in the middle while rubber stoppers were place on both sides. The flask was heated with a blower while being evacuated with an oil pump. A solution of 4.31 g of 2,8-dibromo-6,6,12,12-tetraoctylindenofluorene (5 mmol) in 120 ml of THF was added to the flask using a syringe and stirred at −78° C. for 20 min. Then, 6 ml of 2.87 M n-butyllithium (17.22 mmol) was added dropwise with a syrange, reacted under protective nitrogen gas for 2 h. 5 ml of 2-isopropyl-4,4,5,5-tetramethyl-1,3,2-dioxaborane was added dropwise with a syrange, reacted at −78° C. for 2 h and then allowed to warm up to room temperature for reaction overnight. The reaction was quenched by adding 10 ml of water to the flask. The reaction was extracted with ether (50 mL×4). The organic phase was combined and dried over anhydrous $Na_2SO_4$. The solvent was evaporated before purification by column chromatography (100-200 mesh silica gel/ethyl acetate v:v=9:1) to give 1.18 g of white crystals, with the theoretical value of 4.78 g and the yield rate of about 24.7%. $^1$H NMR ($CDCl_3$, 400 MHz, ppm): δ 7.75 (d, J=7.7 Hz, 2H), 7.71 (d, J=7.3 Hz, 2H), 7.70 (s, 2H), 7.59 (s, 2H) 4.19 (t, J=5.3 Hz, 8H), 2.08 (t, J=5.3 Hz, 4H), 2.01 (q, J=6.4 Hz, 8H), 1.07-0.96 (m, 24H), 0.68 (t, J=7.0 Hz, 12H), 0.58 (t, J=6.7 Hz, 8H); $^{13}$C NMR ($CDCl_3$, 100 MHz, ppm): δ 150.49, 150.15, 143.94, 140.83, 132.35, 127.75, 118.59, 114.17, 61.99, 54.58, 40.64, 31.51, 29.71, 27.42, 23.65, 22.52, 13.96.

Synthesis of 4-bromotriphenylamine

To a 500 ml three-necked round bottom flask, 49 g of triphenylamine (0.2 mol) was added, 300 ml of N,N-dimethylformamide was added slowly with stirring, and 34.10 g (0.2 mol) of N-bromosuccinimide ground into fine power was added in several batches. The reaction was performed under nitrogen protection at room temperature in the dark for 48 h. After cooling, it was poured into crushed ice and extracted three times with dichloromethane. The organic phases were combined and washed three times with water. 200-300 mesh silica gel column was used for separation, while the eluent was for petroleum ether. The product was 58 g with a yield rate of 90%.

Synthesis of 4-trimethylsilyl ethynyltriphenylamine

To a 500 ml three-necked round bottom flask, 4-bromotriphenylamine (12.00 g, 40.00 mmol), CuI (0.052 g, 0.28 mmol), $(Ph_3P)_2PdCl_2$ (0.475 g, 0.68 mmol), 200 mL of degassed toluene, and 60 mL of degassed diisopropylamine were added under stirring to dissolve and mix evenly. A solution of trimethylethynylsilane (4.32 g, 44.0 mmol) in diisopropylamine (30 mL) was added dropwise under argon at room temperature. After the dropwise addition, the temperature of the reaction solution was raised to 70° C. and the reaction was carried out under argon for 6 hours. The reaction progress was monitored by thin layer chromatography. After completion of the reaction, the reaction solution was cooled to room temperature, and the impurities such as solid salt were removed by filtration. The crude product was separated and purified by column chromatography (silica gel column, with eluent as petroleum ether), and further recrystallized from methanol to give a white solid which was filtered and dried in vacuo to give 9.58 g of a yield rate of 70%.

Synthesis of 4,4-dibromo-4'-trimethylsilyl ethynyltriphenylamine

To a 500 ml three-necked round bottom flask, 6 g of 4-trimethylsilylethynyltriphenylamine (0.02 mol) was added, 300 ml of N,N-dimethylformamide was added slowly with stirring, and 6.810 g (0.04 mol) of N-bromosuccinimide ground into fine power was added in several batches. The reaction was performed under nitrogen protection at room temperature in the dark for 48 h. After cooling, it was poured into crushed ice and extracted three times with dichloromethane. The organic phases were combined and washed three times with water. 200-300 mesh silica gel column was used for separation, while the eluent was for petroleum ether. The product was 5.6 g with a yield rate of 90%.

Synthesis of Polymer P1

In a 25 mL two-necked round bottom flask, 195 mg (0.5 mmol) of monomer 4,4-dibromo-4'-trimethylsilyl ethynyltriphenylamine, 418 mg (0.5 mmol) of monomer 2, 8-bis (4,4,5,5-tetramethyl-1,3,2-dioxaborolane-diyl)-6,6,12,12-tetraoctylindenofluorene, 10 mg of $Pd(PPh_3)_4$, 10 mL of degassed toluene, 4 mL of degassed tetrahydrofuran, and 2 mL of a 20 wt % aqueous solution of tetraethylammonium hydroxide were added, homogenized, and flushed with argon for 15 minutes. The reaction was carried out under argon protection at 110° C. for 24 hours, followed by the succeisve addition of 50 μL of bromobenzene to reflux for 2 hours and 20 mg of phenylboronic acid to reflux for 2 hours. After the reaction was completed and cooled to room temperature, the reaction solution was added dropwise to methanol for precipitation. The resulting flocculent precipitate was filtered, dried in vacuo, and the resulting polymer was redissolved in about 30 mL of tetrahydrofuran. The resulting tetrahydrofuran solution was filtered through a polytetrafluoroethylene (PTFE) filter having a pore size of 0.45 m, distilled under reduced pressure, concentrated, and added dropwise to methanol for precipitation. The precipitate was dried in vacuo to give 392 mg of pale yellow solid with a yield rate of 74%. GPC (tetrahydrofuran, polystyrene standard sample) Mn=21 000 g mol$^{-1}$, PDI=1.8.

Synthesis of Polymer P2

To a solution of polymer P1 (392 mg) in tetrahydrofuran (200 mL), 15 mL of 20 wt % potassium hydroxide aqueous solution was added, followed by the addition of 20 mL of methanol to dilute the reaction solution. The reaction was stirred under argon at room temperature for 1 hour. After completion of the reaction, the reaction solution was poured into ice water and extracted with trichloromethane. The oil layers were washed with water, saturated sodium chloride aqueous solution and concentrated to obtain a crude product. The crude product was separated and purified by column chromatography (silica gel column, with eluent as petroleum ether) and further recrystallized in methanol to give a white solid, which was filtered and dried in vacuo to give a yield of 352 mg with a yield rate of 80%. GPC (tetrahydrofuran, polystyrene standard sample) Mn=21 000 g mol$^{-1}$, PDI=1.8.

Example 2

The polymer P2 prepared in Example 1 was used as a hole-transport material in an organic/polymer electroluminescent device 0/PLEDs (ITO anode/hole-transport layer/light-emitting layer/electron-transport layer/aluminum cathode).

The ITO conductive glass and block resistors of about 20 ohm/cm square were pre-cut into 15 mm×15 mm square piece, ultrasonically cleaned successively with acetone, micron-level semiconductor special detergent, deionized water, and isopropyl alcohol, flushed with nitrogen, and placed in the oven for later use. Prior to use, the ITO glass pieces were bombarded by plasma for 10 minutes in an oxygen plasma etch instrument. PEDOT: PSS dispersion in water (about 1%) Clevios™ PEDOT: PSS A14083 was used as a buffer layer in a high-speed spin coating (KW-4A), the thickness depending on the solution concentration and rotation speed, monitored in real time by a surface profiler (Tritek Alpha-Tencor-500 type). After film formation, the residual solvent was removed in a constant-temperature vacuum oven. The thickness of the PEDOT: PSS film on the ITO substrate was 80 nm thick. The polymer P2 synthesized in Example 1 was dissolved in a toluene solution at a concentration of 5 mg/ml. The polymer P2 was spin-coated on a PEDOT: PSS film, and the thickness was 20 nm. The reaction was heated to 200° C. for 30 min on a hot plate, so that the substance P2 underwent a crosslinking reaction. The polymer P2 film was then rinsed with toluene and the thickness was determined to be 18-19 nm, indicating that the crosslinking reaction was effective and the solification of polymer P2 film was relatively complete. The fluorescent conjugated polymer P-PPV (P-PPV is a green-emitting material) or MEH-PPV (MEH-PPV is an orange-red emitting material) was weighed in a clean bottle, transferred to a film-specific glove box under nitrogen protection, dissolved in toluene, and filtered through a 0.45 micron filter. The fluorescent polymer was spin-coated on the hole-transport layer of the polymer P2 film, and the optimal thickness of the polymer light-emitting layer was 80 nm. The film thickness was measured using an Alpha-Tencor-500 surface profiler. Then, about 2-5 nm CsF was applied under vacuum deposition conditions as an electron-injection/transporting layer. Aluminum (100 nm) was vacuum evaporated on the electron-transport layer as a cathode. The light emitting area of the device has a region masked by the ITO interaction cover with an area determined to be 0.04 square centimeters. All preparation procedures were carried out in a glove box in a nitrogen atmosphere. The current-voltage characteristics, light intensity, and external quantum efficiency of the device were measured by the Keithley236 current-voltage measurement system and a calibrated silicon photodiode.

The invention claimed is:

1. A conjugated polymer containing an ethynyl crosslinking group, having the following structure:

Chemical Formula 1

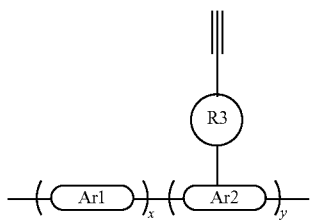

wherein, x and y are mole percentages which are greater than 0 and x+y=1; Ar1 and Ar2 are the same or different in multiple occurrences and Ar2 is selected from an aryl or a heteroaryl group; and, R3 is a linking group,
wherein Ar1 is a polymer backbone structural unit selected from the group consisting of benzene, biphenyl, triphenyl, benzo, indenofluorene, indolocarbazole, dibenzosilole, dithienocyclopentadiene, dithienosilole, thiophene, anthracene, naphthalene, benzodithiophene, benzofuran, benzothiophene, benzoselenophen compounds, and a combination thereof.

2. The conjugated polymer containing an ethynyl crosslinking group according to claim 1, wherein Ar2 is the same or different in multiple occurrences and independently includes one of the following structural groups:
a cyclic aryl group, including any one of benzene, biphenyl, triphenyl, benzo, fluorene and indenofluorene compound, or a combination thereof; and
a heterocyclic aryl group, including any one of triphenylamine, dibenzothiophene, dibenzofuran, dibenzoselenophen, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine and selenophenodipyridine, or a combination thereof.

3. The conjugated polymer containing an ethynyl crosslinking group according to claim 1, wherein the cyclic aryl group and the heterocyclic aryl group are further optionally substituted with any one group selected from the group consisting of hydrogen, deuterium, alkyl, alkoxy, amino, alkenyl, alkynyl, aralkyl, heteroalkyl, aryl and heteroaryl, and a combination thereof.

4. The conjugated polymer containing an ethynyl crosslinking group according to claim 1, wherein Ar2 is a hole-transport unit that is any one selected from the group consisting of aryl amine, triphenylamine, naphthylamine, thiophene, carbazole, dibenzothiophene, dithienocyclopentadiene, dithienosilole, dibenzoselenophen, furan, benzofuran, benzothiophene, benzoselenophene, and indolocarbazole, and a combination thereof.

5. The conjugated polymer containing an ethynyl crosslinking group according to claim 1, wherein Ar2 is selected from the structure represented by Chemical Formula 2:

Chemical Formula 2

wherein $Ar^1$, $Ar^2$, and $Ar^3$ in multiple occurrences are independently the same or different;
$Ar^1$ includes a single-bond or mononuclear or polynuclear aryl or heteroaryl, wherein the aryl or heteroaryl is unsubstituted or optionally substituted with other side chains;
$Ar^2$ includes a mononuclear or polynuclear aryl or heteroaryl, wherein the aryl or heteroaryl is unsubstituted or optionally substituted with other side chains;
$Ar^3$ includes a mononuclear or polynuclear aryl or heteroaryl, wherein the aryl or heteroaryl is unsubstituted or optionally substituted with other side chains, $Ar^3$ is optionally linked to other parts of Chemical Formula 2 by a bridging group; and
n is selected from 1, 2, 3, 4, or 5.

6. The conjugated polymer containing an ethynyl crosslinking group according to claim 1, wherein Ar2 is an electron-transport unit that is any one selected from the group consisting of pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine and selenophenodipyridine, and a combination thereof.

7. The conjugated polymer containing an ethynyl crosslinking group according to claim 1, wherein R3 is selected from the group consisting of: alkyl having 1 to 30 carbon atoms, alkoxy having 1 to 30 carbon atoms, amino, alkenyl, alkynyl, aralkyl, heteroalkyl, aryl and heteroaryl, and a combination thereof.

8. The conjugated polymer containing an ethynyl crosslinking group according to claim 1, wherein R3 with an ethynyl crosslinking group is selected from the group consisting of:

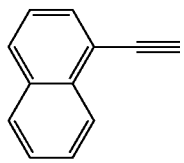

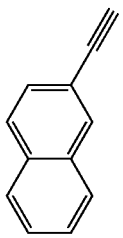

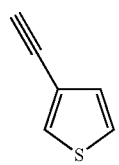

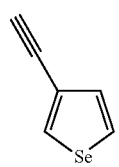

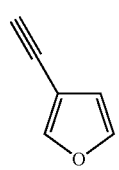

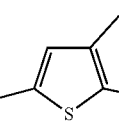

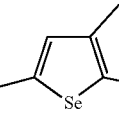

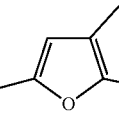

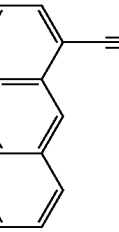

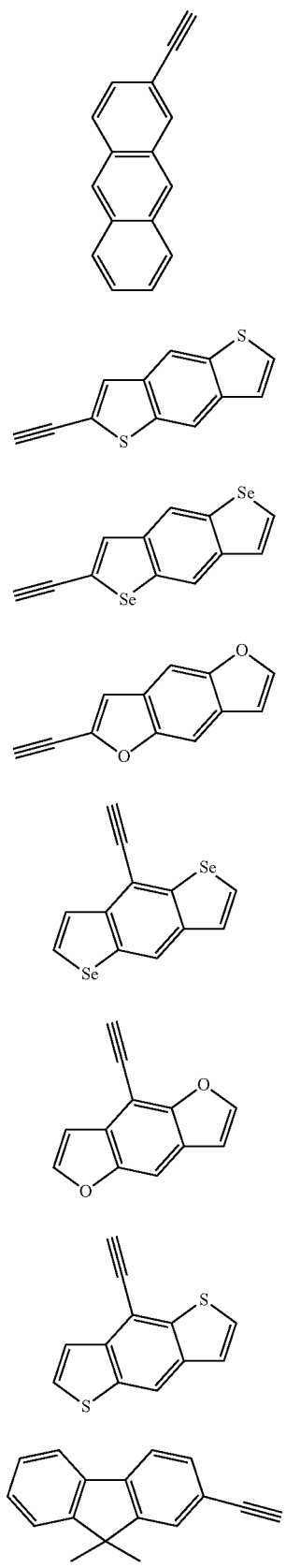
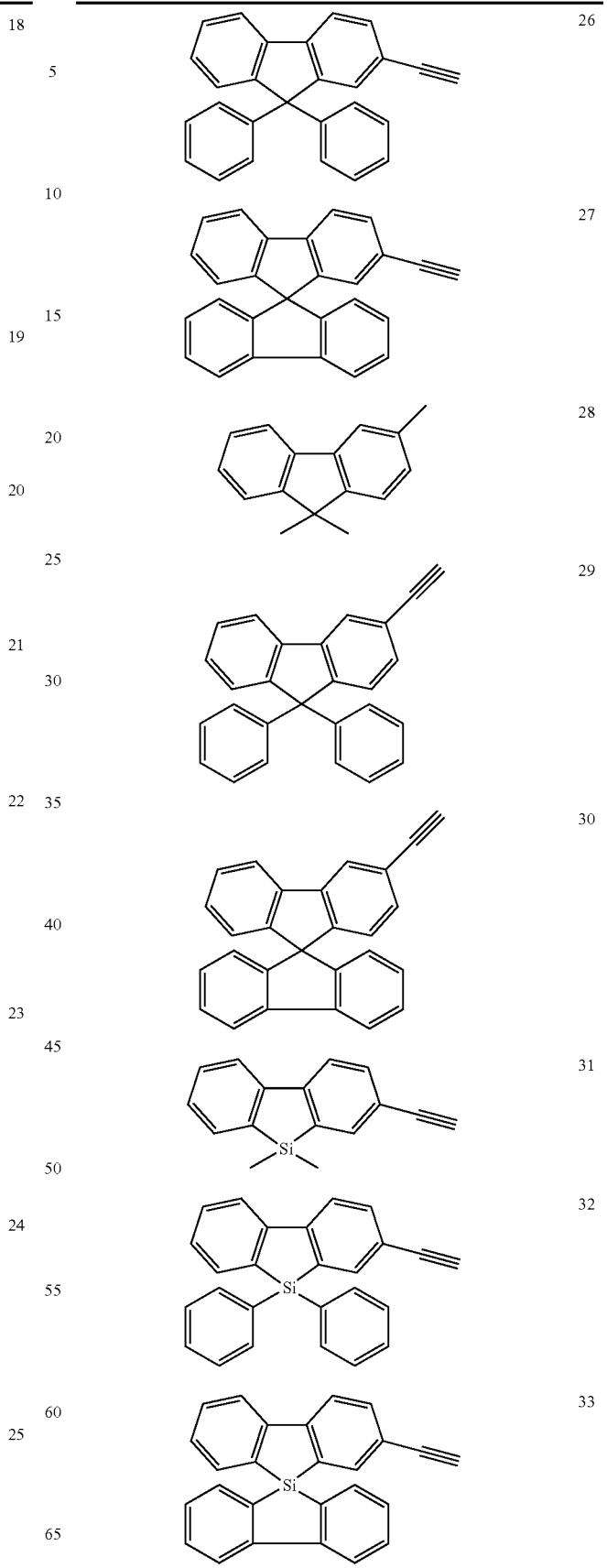

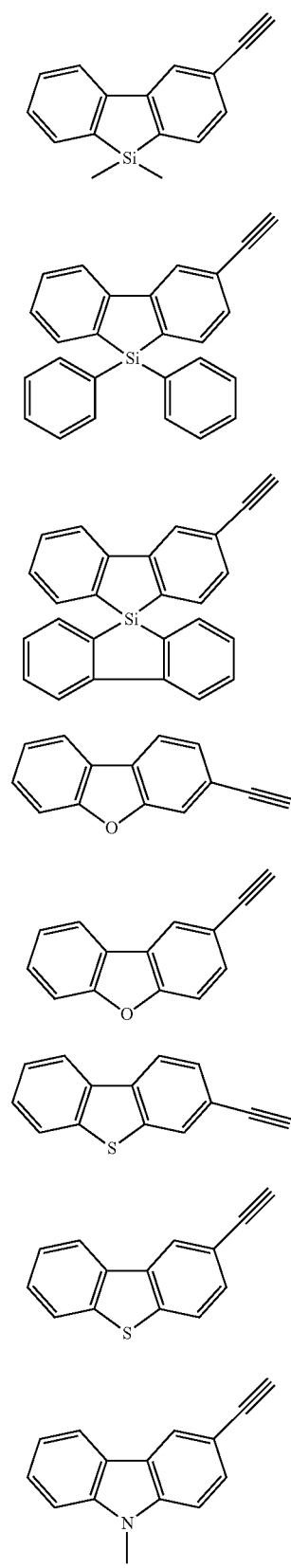
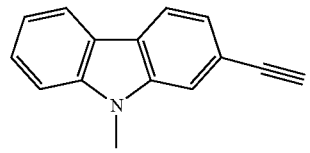 [SMILES: C#Cc1ccc2c3ccccc3n(C)c2c1]
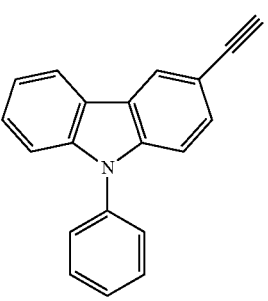 [SMILES: C#Cc1ccc2c(c1)c1ccccc1n2-c1ccccc1]
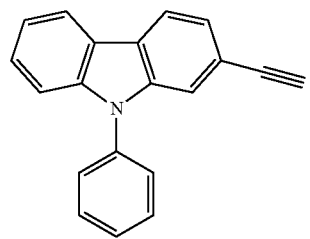 [SMILES: C#Cc1ccc2c3ccccc3n(-c3ccccc3)c2c1]
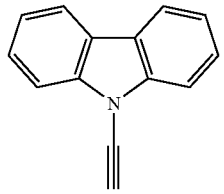
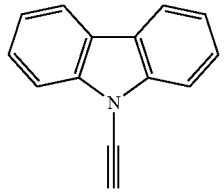
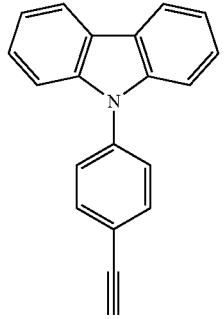 [SMILES: C#Cc1ccc(-n2c3ccccc3c3ccccc32)cc1]

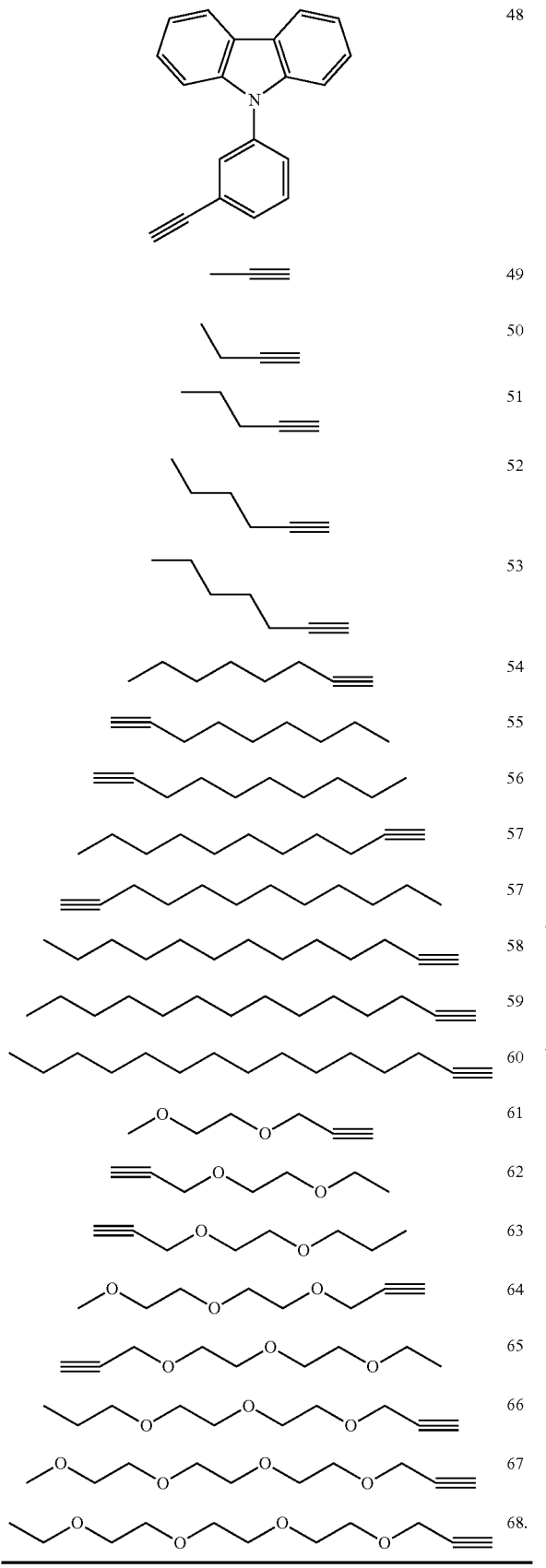

9. The conjugated polymer containing an ethynyl cross-linking group according to claim 1, wherein the polymer has the following general chemical formula:

Chemical Formula 5

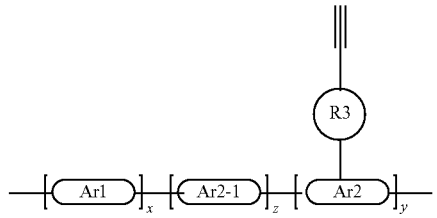

wherein x, y and z are mol % which are greater than 0 and x+y+z=1, and

Ar1, Ar2, and Ar2-1 are the same or different in multiple occurrences, and independently include an aryl or a heteroaryl group.

10. The conjugated polymer containing an ethynyl cross-linking group according to claim 9, wherein at least one of Ar1, Ar2 and Ar2-1 is selected from the group consisting of a hole-transport unit, and at least one of Ar1, Ar2 and Ar2-1 is selected from the group consisting of an electron-transport unit.

11. The conjugated polymer containing an ethynyl cross-linking group according to claim 9, wherein Ar2 and/or Ar2-1 includes units comprising at least one of the following groups:

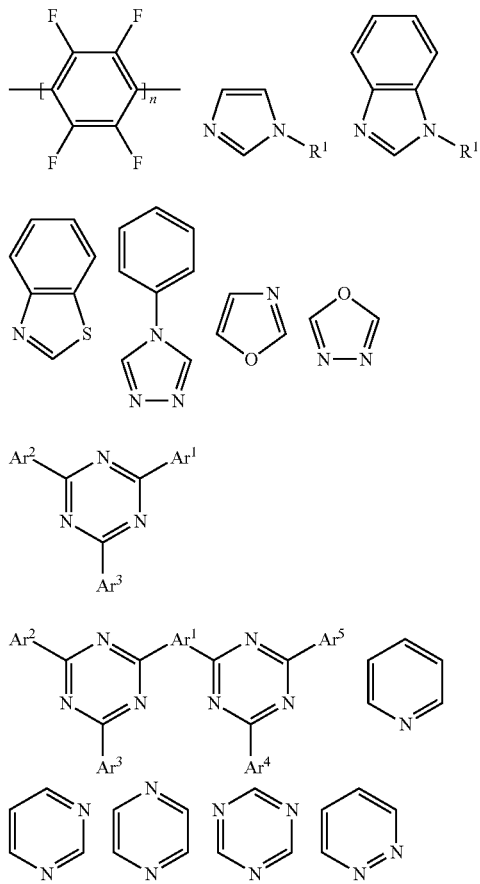

-continued

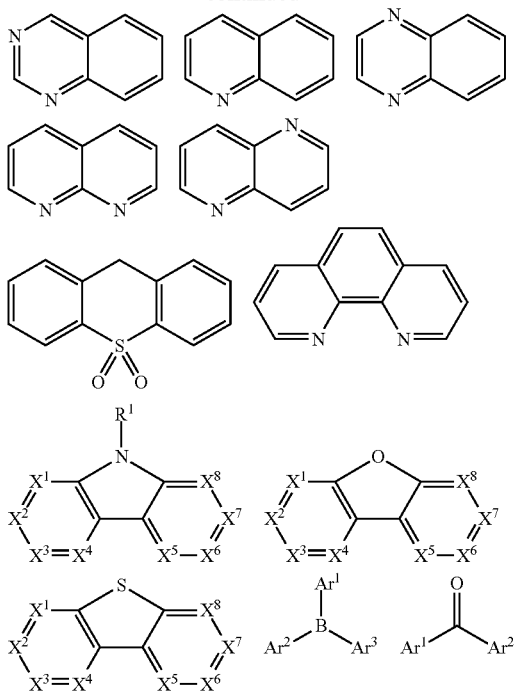

-continued

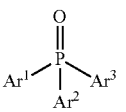

wherein $R^1$ is selected from the group consisting of: hydrogen, alkyl, alkoxy, amino, alkene, alkyne, aralkyl, heteroalkyl, aryl, and heteroaryl;

$Ar^1$-$Ar^5$ are each selected from the group consisting of cyclic aryl groups and heterocyclic aryl groups;

n is an integer from 0 to 20; and $X^1$-$X^8$ are each selected from the group consisting of $CR^1$ or N.

12. A mixture, comprising:
a conjugated polymer containing an ethynyl crosslinking group according to claim 1, and
at least one organic functional material selected from the group consisting of hole-injection material, hole-transport material, electron-transport material, electron-injection material, electron-blocking material, hole-blocking material, light-emitting material and host material, and a combination thereof.

13. A formulation comprising a conjugated polymer containing an ethynyl crosslinking group according to claim 1 or a mixture thereof, and at least one organic solvent.

* * * * *